(12) United States Patent
Sakai et al.

(10) Patent No.: US 7,016,217 B2
(45) Date of Patent: Mar. 21, 2006

(54) MEMORY

(75) Inventors: Naofumi Sakai, Gifu (JP); Yoh Takano, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/792,926

(22) Filed: Mar. 5, 2004

(65) Prior Publication Data

US 2004/0174729 A1    Sep. 9, 2004

(30) Foreign Application Priority Data

| | | |
|---|---|---|
| Mar. 7, 2003 | (JP) | ............................... 2003-061448 |
| Jul. 2, 2003 | (JP) | ............................... 2003-190447 |

(51) Int. Cl.
*G11C 11/22* (2006.01)

(52) U.S. Cl. ............. 365/145; 365/189.09; 365/189.01

(58) Field of Classification Search ..................... None
See application file for complete search history.

(56) References Cited

U.S. PATENT DOCUMENTS

| | | | |
|---|---|---|---|
| 6,473,329 B1 | 10/2002 | Nakamura | |
| 6,522,572 B1 | 2/2003 | Nakamura | |
| 6,654,273 B1 * | 11/2003 | Miwa et al. | ................. 365/145 |

FOREIGN PATENT DOCUMENTS

| | | |
|---|---|---|
| JP | 10-064255 | 3/1998 |
| KR | 2001-0031598 | 4/2001 |
| WO | 99/26252 | 5/1999 |

OTHER PUBLICATIONS

Office Action for Korean Patent Application No. 10-2003-0017086, mailed Sep. 12, 2005.

* cited by examiner

*Primary Examiner*—David Lam
(74) *Attorney, Agent, or Firm*—Arent Fox PLLC

(57) ABSTRACT

A memory capable of suppressing disturbance is provided. This memory comprises a bit line, a word line arranged to intersect with the bit line and first storage means connected between the bit line and the word line, and applies prescribed reverse voltages to at least non-selected first storage means connected to a non-selected word line substantially identical times respectively or substantially applies no voltage through a read operation and a rewrite operation.

35 Claims, 42 Drawing Sheets

MEMORY

BACKGROUND OF THE INVENTION

1. Field of the Invention

The present invention relates to a memory, and more particularly, it relates to a memory having capacitance means and resistance means.

2. Description of the Background Art

A method of reducing disturbance caused in a non-selected cell of a one-transistor ferroelectric memory is proposed in general. For example, Japanese Patent Laying-Open No. 10-64255 (1998) proposes such a method of reducing disturbance. In a data writing step disclosed in Japanese Patent Laying-Open No. 10-64255, voltages +V, ⅓ V, 0 V and ⅔ V are applied to a word line of a selected cell, the remaining word cells, a bit line of the selected cell and the remaining bit lines respectively as a first procedure. Then, voltages 0 V, ⅓ V, ⅓ V and 0 V are applied to the word line of the selected cell, the remaining word lines, the bit line of the selected cell and the remaining bit lines respectively as a second procedure. When voltages −V, −⅓ V, 0 V and −⅔ V are alternatively applied to the word line of the selected cell, the remaining word lines, the bit line of the selected cell and the remaining bit lines respectively in the aforementioned first procedure, voltages 0 V, −⅓ V, −⅓ V and 0 V are applied to the word line of the selected cell, the remaining word lines, the bit line of the selected cell and the remaining bit lines respectively in the second procedure carried out subsequently to the first procedure. Thus, the voltages ⅓ V and −⅓ V different in polarity to each other are applied to most non-selected cells single times respectively through the first and second procedures, whereby disturbance can be remarkably suppressed in data writing.

In the aforementioned technique disclosed in Japanese Patent Laying-Open No. 10-64255, however, no voltage is applied to those of the non-selected cells sharing the word and bit lines with the selected cell in the second procedure, and hence disturbance of these cells cannot be avoided. Further, Japanese Patent Laying-Open No. 10-64255 describes absolutely no method of suppressing disturbance in reading.

SUMMARY OF THE INVENTION

The present invention has been proposed in order to solve the aforementioned problems, and an object thereof is to provide a memory capable of suppressing disturbance.

In order to attain the aforementioned object, a memory according to a first aspect of the present invention comprises a bit line, a word line arranged to intersect with the bit line and first storage means connected between the bit line and the word line for holding first data or second data, and applies a voltage pulse supplying an electric field in a first direction and another voltage pulse supplying another electric field in a direction opposite to the first direction to at least non-selected first storage means other than selected first storage means connected to a selected word line substantially identical times respectively or substantially applies no voltage pulse through a read operation and a rewrite operation consisting of a plurality of operations performed on the selected first storage means.

The memory according to the first aspect, applying the voltage pulse supplying the electric field in the first direction and the other voltage pulse supplying the other electric field in the direction opposite to the first direction to at least all first storage means connected to a word line other than the selected word line substantially identical times respectively or substantially applying no voltage pulse through the read operation and the rewrite operation as hereinabove described, can suppress polarization deterioration in at least all non-selected first storage means connected to the word line other than the selected word line in the read operation. Thus, the memory can inhibit the first storage means from disturbance in the read operation.

In the aforementioned memory according to the first aspect, the read operation and the rewrite operation consisting of the plurality of operations performed on the selected first storage means preferably include the read operation, an operation of writing the first data in the selected first storage means from which the second data has been read in the read operation and an operation of thereafter writing the second data in the selected first storage means from which the second data has been read in the read operation, and the memory preferably applies the voltage pulse supplying the electric field in the first direction and the other voltage pulse supplying the other electric field in the direction opposite to the first direction to the selected first storage means from which the first data has been read in the read operation substantially identical times respectively or substantially applying no voltage pulse through the operation of writing the first data and the operation of writing the second data. According to this structure, the memory, applying the voltage pulse supplying the electric field in the first direction and the other voltage pulse supplying the other electric field in the direction opposite to the first direction to the selected first storage means from which the first data has been read among the selected storage means connected to the selected word line substantially identical times respectively or substantially applying no voltage pulse, can suppress polarization deterioration also as to the first storage means from which the first data has been read among memory cells connected to the selected word line. Thus, the memory can suppress disturbance in the read operation as to not only the non-selected first storage means but also the first storage means from which the first data has been read among the first storage means connected to the selected word line.

The aforementioned memory according to the first aspect preferably applies the voltage pulse supplying the electric field in the first direction and the other voltage pulse supplying the other electric field in the direction opposite to the first direction to at least substantially all non-selected first storage means single times respectively through the read operation and the rewrite operation. According to this structure, the memory can easily suppress polarization deterioration in the read operation in at least substantially all non-selected first storage means.

In this case, the memory preferably applies the voltage pulse supplying the electric field in the first direction and the other voltage pulse supplying the other electric field in the direction opposite to the first direction also to the selected first storage means storing the first data single times respectively in addition to the non-selected first storage means through the read operation and the rewrite operation. According to this structure, the memory can easily suppress polarization deterioration in the read operation also in the selected first storage means storing the first data.

The aforementioned memory according to the first aspect preferably applies the voltage pulse supplying the electric field in the first direction for a first period and applies the other voltage pulse supplying the other electric field in the direction opposite to the first direction for a second period, and the first period and the second period are preferably substantially equal to each other. According to this structure, the memory can substantially equalize a variation of a polarization quantity caused by the voltage pulse supplying the electric field in the first direction and that caused by the voltage pulse supplying the electric field in the direction opposite to the first direction with each other with respect to at least substantially all non-selected first storage means.

The aforementioned memory according to the first aspect may apply a prescribed voltage to the selected first storage means while applying a voltage of m/n (m, n: positive integers) of the prescribed voltage to the non-selected first storage means in the read operation and the rewrite operation.

In this case, the memory may apply a voltage of either substantially ⅓ or substantially ½ of the prescribed voltage to the non-selected first storage means.

The aforementioned memory according to the first aspect may start the read operation after setting the word line and the bit line to substantially identical potentials.

The aforementioned memory according to the first aspect preferably brings the bit line into a floating state in the read operation and thereafter sets the bit line to a fixed potential. According to this structure, the memory applies no voltage to all non-selected first storage means connected to the word line other than the selected word line in the read operation by equalizing the fixed potential of the bit line with the potential of the word line other than the selected word line. Therefore, the memory can inhibit all non-selected first storage means connected to the word line other than the selected word line from disturbance in the read operation.

In this case, the memory preferably sets a period for bringing the bit line into a floating state in the read operation to a short period for sufficiently reducing a variation of the polarization quantity of the non-selected first storage means in the period as compared with a variation of the polarization quantity of the non-selected first storage means in the rewrite operation. According to this structure, the memory can easily reduce the variation of the polarization quantity caused in the non-selected first storage means in the period for bringing the bit line into the floating state in the read operation to a level substantially negligible with respect to the variation of the polarization quantity caused in the non-selected storage means in the rewrite operation.

The aforementioned memory according to the first aspect preferably further comprises a read data determination circuit amplifying a voltage caused on the bit line in the read operation and thereafter comparing the amplified voltage with a reference voltage thereby determining whether data read from the selected first storage means is the first data or the second data. According to this structure, the memory can set the reference voltage to an intermediate level between a voltage obtained by amplifying a first data read voltage caused on the bit line and a voltage obtained by amplifying a second data read voltage in the read operation, whereby the range of the voltage to be set as the reference voltage is increased as compared with a case of comparing the voltage caused on the bit line in the read operation with the reference voltage in an unamplified state. Thus, the memory can easily generate the reference voltage.

The aforementioned memory according to the first aspect may further comprise second storage means provided separately from the first storage means for storing data of reversed polarity to data stored in corresponding first storage means and compare a voltage caused on the bit line in the read operation with a reference voltage generated by reading data from the second storage means thereby determining whether data read from the selected first storage means is the first data or the second data.

In the aforementioned memory according to the first aspect, the first storage means preferably includes a ferroelectric film. According to this structure, the memory can inhibit the first storage means including the ferroelectric film from disturbance in the read operation.

In the aforementioned memory according to the first aspect, the first storage means preferably includes a resistive element. According to this structure, the memory can inhibit the first storage means including the resistive element from disturbance in the read operation.

A memory according to a second aspect of the present invention comprises a bit line, a word line arranged to intersect with the bit line and first storage means connected between the bit line and the word line for holding first data or second data, and performs no rewrite operation when data read in a read operation performed on selected first storage means connected to a selected word line is identical to data held in the selected first storage means after the read operation.

The memory according to the second aspect, so constituted as to perform no rewrite operation when the read data is identical to the data held in the selected first storage means after the read operation as hereinabove described, can reduce the number of operations necessary for reading while causing no polarization deterioration in all non-selected first storage means connected to a word line other than the selected word line. Thus, the memory can reduce the number of operations in reading in the first storage means while suppressing disturbance.

The aforementioned memory according to the second aspect may start the read operation after setting the word line and the bit line to substantially identical potentials.

The aforementioned memory according to the second aspect preferably brings the bit line into a floating state in the read operation and thereafter sets the bit line to a fixed potential. According to this structure, the memory applies no voltage to all non-selected first storage means connected to the word line other than the selected word line in the read operation by equalizing the fixed potential of the bit line with the potential of the word line other than the selected word line. Thus, the memory can inhibit all non-selected first storage means connected to the word line other than the selected word line from disturbance in reading.

In this case, the memory preferably sets a period for bringing the bit line into a floating state in the read operation to a short period for sufficiently reducing a variation of the polarization quantity of the non-selected first storage means in the period as compared with a variation of the polarization quantity of the non-selected first storage means in the rewrite operation. According to this structure, the memory can easily reduce the variation of the polarization quantity caused in the non-selected first storage means in the period for bringing the bit line into the floating state in the read operation to a level substantially negligible with respect to the variation of the polarization quantity caused in the non-selected storage means in the rewrite operation.

The aforementioned memory according to the second aspect preferably further comprises a data determination circuit outputting a prescribed signal when substantially all data read in the read operation performed on the selected first storage means are identical to data held in the selected first storage means after the read operation, and performs no rewrite operation when the data determination circuit outputs the prescribed signal. According to this structure, the memory can easily perform no rewrite operation when substantially all data read in the read operation performed on the selected first storage means are identical to the data held in the selected first storage means after the read operation.

In the aforementioned memory according to the second aspect, the first storage means preferably includes a ferroelectric film. According to this structure, the memory can inhibit the first storage means including the ferroelectric film from disturbance in the read operation.

In the aforementioned memory according to the second aspect, the first storage means preferably includes a resistive element. According to this structure, the memory can inhibit the first storage means including the resistive element from disturbance in the read operation.

A memory according to a third aspect of the present invention comprises a bit line, a word line arranged to intersect with the bit line and first storage means connected between the bit line and the word line for holding first data or second data, and applies a voltage pulse supplying an electric field in a first direction and another voltage pulse supplying another electric field in a direction opposite to the first direction to at least non-selected first storage means other than selected first storage means connected to a selected word line substantially identical times respectively or substantially applies no voltage pulse through a write operation consisting of at least one operation performed on the selected first storage means.

The memory according to the third aspect having the aforementioned structure, applying the voltage pulse supplying the electric field in the first direction and the other voltage pulse supplying the other electric field in the direction opposite to the first direction to at least all first storage means connected to a word line other than the selected word line substantially identical times respectively or substantially applying no voltage pulse in the write operation, can suppress polarization deterioration at least in all non-selected first storage means connected to the word line other than the selected word line. Thus, the memory can suppress disturbance at least in all non-selected first storage means connected to the word line other than the selected word line.

In the aforementioned memory according to the third aspect, the write operation consisting of at least one operation performed on the selected first storage means preferably includes an operation of writing the first data in all selected first storage means, an operation of writing the first data in the selected first storage means to be written with the second data and an operation of thereafter writing the second data in the selected first storage means to be written with the second data, and the memory preferably applies the voltage pulse supplying the electric field in the first direction and the other voltage pulse supplying the other electric field in the direction opposite to the first direction to the selected first storage means to be written with the first data substantially identical times respectively or substantially applies no voltage pulse through the operations of writing the first data and the operation of writing the second data. According to this structure, the memory, applying the voltage pulse supplying the electric field in the first direction and the other voltage pulse supplying the other electric field in the direction opposite to the first direction to the first storage means to be written with the first data among the first storage means connected to the selected word line substantially identical times respectively or substantially applying no voltage pulse also in the write operation, can suppress polarization deterioration also as to the first storage means from which the first data has been read among the first storage means connected to the selected word line. Thus, the memory can suppress disturbance in writing as to not only the non-selected first storage means but also the first storage means from which the first data has been read among the first storage means connected to the selected word line.

The aforementioned memory according to the third aspect preferably applies the voltage pulse supplying the electric field in the first direction and the other voltage pulse supplying the other electric field in the direction opposite to the first direction to at least substantially all non-selected first storage means single times respectively through the write operation. According to this structure, the memory can easily suppress polarization deterioration in the write operation at least in substantially all non-selected first storage means.

In this case, the memory preferably applies the voltage pulse supplying the electric field in the first direction and the other voltage pulse supplying the other electric field in the direction opposite to the first direction also to the selected first storage means storing the first data single times respectively in addition to the non-selected first storage means through the write operation. According to this structure, the memory can easily suppress polarization deterioration in the write operation also in the selected first storage means storing the first data.

The aforementioned memory according to the third aspect may apply a prescribed voltage to the selected first storage means while applying a voltage of m/n (m, n: positive integers) of the prescribed voltage to the non-selected first storage means in the write operation.

In this case, the memory may apply a voltage of either substantially ⅓ or substantially ½ of the prescribed voltage to the non-selected first storage means.

In the aforementioned memory according to the third aspect, the first storage means preferably includes a ferroelectric film. According to this structure, the memory can inhibit the first storage means including the ferroelectric film from disturbance in the write operation.

In the aforementioned memory according to the third aspect, the first storage means preferably includes a resistive element. According to this structure, the memory can inhibit the first storage means including the resistive element from disturbance in the write operation.

A memory according to a fourth aspect of the present invention comprises a bit line, a word line arranged to intersect with the bit line and first storage means connected between the bit line and the word line for holding first data or second data, and completes a write operation with one operation when data to be written in selected first storage means connected to a selected word line is substantially only the first data or the second data while completing the write operation with a plurality of operations when the data to be written is substantially not only the first data or the second data.

The memory according to the fourth aspect, completing the write operation with one operation when the data to be written in the selected first storage means is substantially only the first data or the second data as hereinabove described, can reduce the number of operations necessary for writing while causing no polarization deterioration in the write operation in all non-selected first storage means connected to a word line other than the selected word line. Thus, the memory can reduce the number of operations in writing in the first storage means while suppressing disturbance.

The aforementioned memory according to the fourth aspect may apply a prescribed voltage to the selected first storage means while applying a voltage of m/n (m, n: positive integers) of the prescribed voltage to non-selected first storage means other than the selected first storage means in the write operation.

In this case, the memory may apply a voltage of either substantially ⅓ or substantially ½ of the prescribed voltage to the non-selected first storage means.

The aforementioned memory according to the fourth aspect preferably further comprises a data determination circuit outputting a prescribed signal when substantially all data to be written in the selected first storage means are substantially only the first data or the second data in the write operation. According to this structure, the memory can easily complete the write operation with one operation when the data to be written in the first storage means is substantially only the first data or the second data by completing the write operation with one operation only when the data determination circuit outputs the prescribed signal.

In the aforementioned memory according to the fourth aspect, the first storage means preferably includes a ferroelectric film. According to this structure, the memory can inhibit the first storage means including the ferroelectric film from disturbance in the write operation.

In the aforementioned memory according to the fourth aspect, the first storage means preferably includes a resistive element. According to this structure, the memory can inhibit the first storage means including the resistive element from disturbance in the write operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
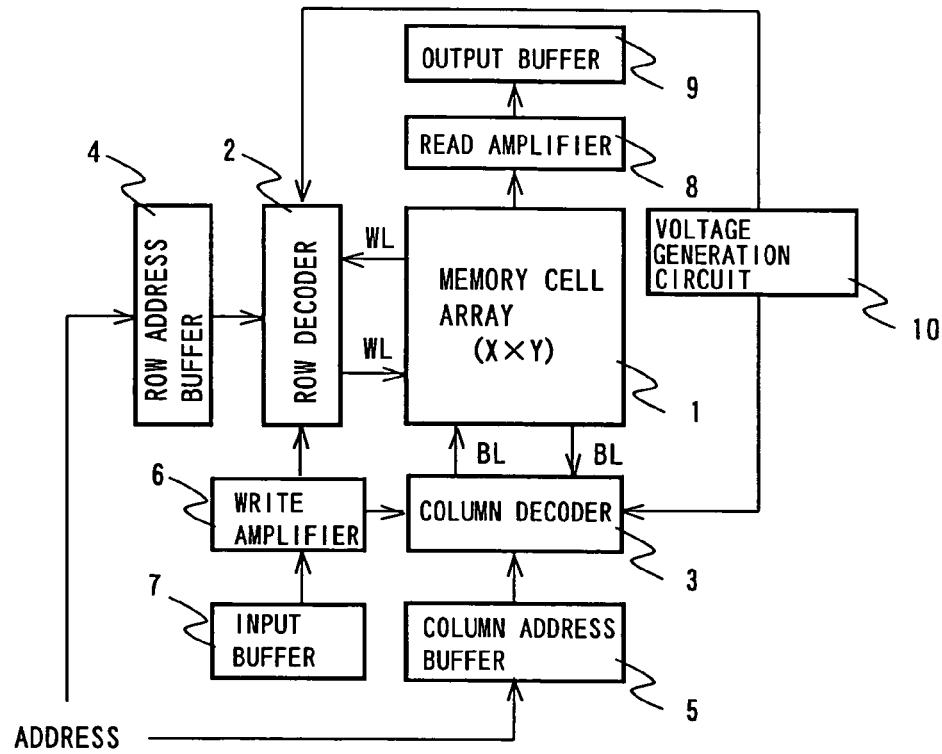
FIG. 1 is a block diagram showing the overall structure of a simple matrix ferroelectric memory according to a first embodiment of the present invention.

Embodiments of the present invention are now described with reference to the drawings.

First Embodiment

A simple matrix ferroelectric memory according to a first embodiment of the present invention is described with reference to read-rewrite and write operations collectively performed on all memory cells connected to an arbitrary word line WL.

The overall structure of the simple matrix ferroelectric memory according to the first embodiment is described with reference to FIG. 1. The ferroelectric memory according to the first embodiment comprises a memory cell array 1, a row decoder 2, a column decoder 3, a row address buffer 4, a column address buffer 5, a write amplifier 6, an input buffer 7, a read amplifier 8 consisting of a voltage sense amplifier, an output buffer 9 and a voltage generation circuit 10.

The memory cell array includes a plurality of simple matrix memory cells consisting of only ferroelectric capacitors (not shown). The ferroelectric capacitors are examples of the "first storage means" in the present invention. The row and column decoders 2 and 3 of the memory cell array are connected with word lines WL and bit lines BL of the memory cell array respectively. The voltage generation circuit 10 is connected to the row and column decoders 2 and 3. This voltage generation circuit 10 is constituted to be capable of applying voltages ⅓ Vcc and ⅔ Vcc to a non-selected word line WL and a specific bit line BL, i.e., a bit line BL connected with memory cells holding data "0" among those connected to a selected word line WL. The row and column decoders 2 and 3 are constituted to be capable of applying voltages Vcc and 0 V to the selected word line WL and another specific bit line BL, i.e., a bit line BL connected with memory cells holding data "1" among those connected to the selected word line WL. The voltage Vcc is a power supply voltage or a voltage generated on the basis of the power supply voltage.

Figure 2:
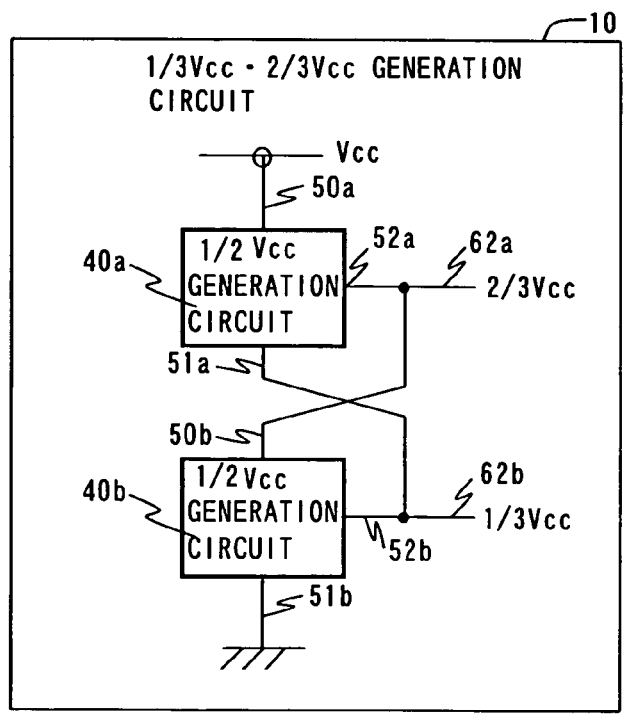
FIG. 2 illustrates an exemplary structure of a voltage generation circuit (⅓ Vcc-⅔ Vcc generation circuit) according to the first embodiment of the present invention.

As shown in FIG. 2, the voltage generation circuit 10 consisting of a ⅓ Vcc and ⅔ Vcc generation circuit (hereinafter referred to as ⅓ Vcc·⅔ Vcc generation circuit) is combinedly constituted of two ½ Vcc generation circuits 40a and 40b. Each of the ½ Vcc generation circuits 40a and 40b has two voltage input terminals 50a and 51a or 50b and 51b and a voltage output terminal 52a or 52b. A conventional ½ Vcc generation circuit is constituted to receive voltages Vcc and 0 V to first and second voltage input terminals thereof respectively thereby generating an intermediate voltage ½ Vcc therebetween on a voltage output terminal thereof. In the 1/Vcc·⅔ Vcc generation circuit according to the first embodiment, on the other hand, the voltage Vcc is applied to the voltage input terminal 50a of the first ½ Vcc generation circuit 40a, as shown in FIG. 2. The voltage input terminal 51a of the first ½ Vcc generation circuit 40a is connected with the voltage output terminal 52b of the second ½ Vcc generation circuit 40b. Further, the voltage output terminal 52a of the first ½ Vcc generation circuit 40a is connected with the voltage input terminal 50b of the second ½ Vcc generation circuit 40b. In addition, the voltage 0 V is applied to the voltage input terminal 51b of the second ½ Vcc generation circuit 40b. According to this structure, an intermediate voltage ⅔ Vcc between the voltages Vcc and ⅓ Vcc is obtained from a first voltage output terminal 62a of the 1/Vcc·⅔ Vcc generation circuit, i.e., the voltage output terminal 52a of the first ½ Vcc generation circuit 40a. Further, an intermediate voltage ⅓ Vcc between the voltages ⅔ Vcc and 0 V is obtained from a second voltage output terminal 62b of the 1/Vcc·⅔ Vcc generation circuit, i.e., the voltage output terminal 52b of the second ½ Vcc generation circuit 40b.

Figure 3:
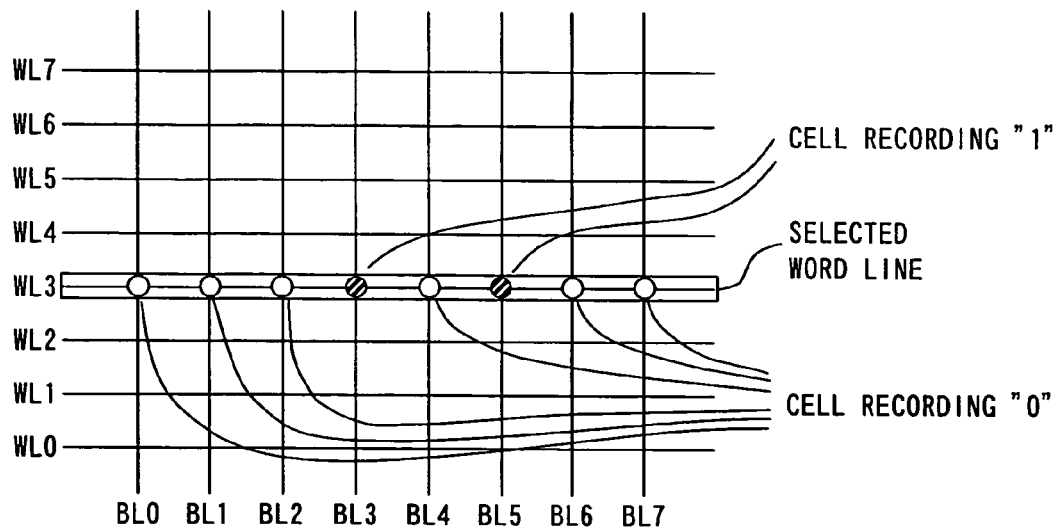
FIG. 3 illustrates a selected word line of a memory cell array according to the first embodiment of the present invention and data stored in memory cells connected to the selected word line.
Figure 4:
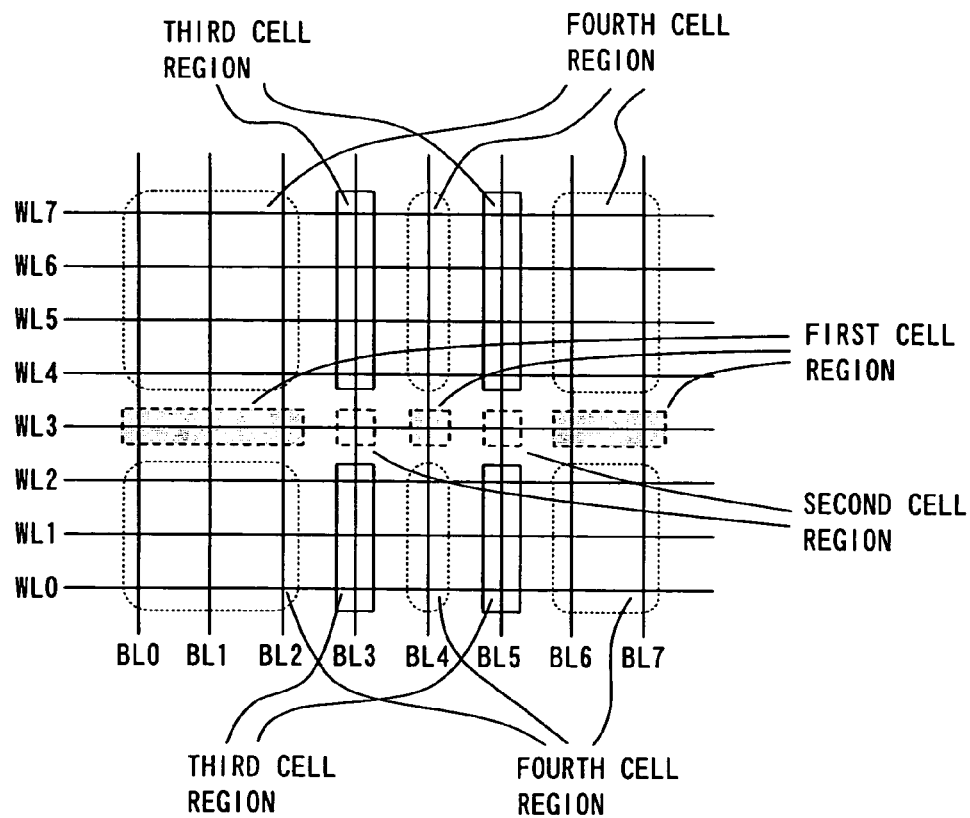
FIG. 4 illustrates definition of cell regions of the memory cell array according to the first embodiment of the present invention.

The read-rewrite operations of the simple matrix ferroelectric memory according to the first embodiment are described with reference to FIGS. 3 to 18. It is assumed that a word line WL3 is selected in the first embodiment. It is also assumed that memory cells connected to bit lines BL3 and BL5 store data "1" among those connected to the selected word line WL3 while memory cells connected to the remaining bit lines BL0 to BL2, BL4, BL6 and BL7 store data "0", as shown in FIG. 3. Among the memory cells connected to the selected word line WL3, the groups of those storing the data "0" and "1" form first and second cell regions respectively, as shown in FIG. 4. Among the memory cells connected to non-selected word lines WL0 to WL2 and WL4 to WL7, the groups of those connected to the bit lines BL3 and BL5 and those connected to the bit lines BL0 to BL2, BL4, BL6 and BL7 other than the bit lines BL3 and BL5 form third and fourth cell regions respectively. In other words, the memory cells forming the first and second cell regions are selected cells, while those forming the third and fourth cell regions are non-selected cells. The memory cells included in the first and second cell regions are examples of the "selected first storage means" in the present invention, and those included in the third and fourth cell regions are examples of the "non-selected first storage means" in the present invention.

(1) Read-Rewrite Operation

Figure 5:
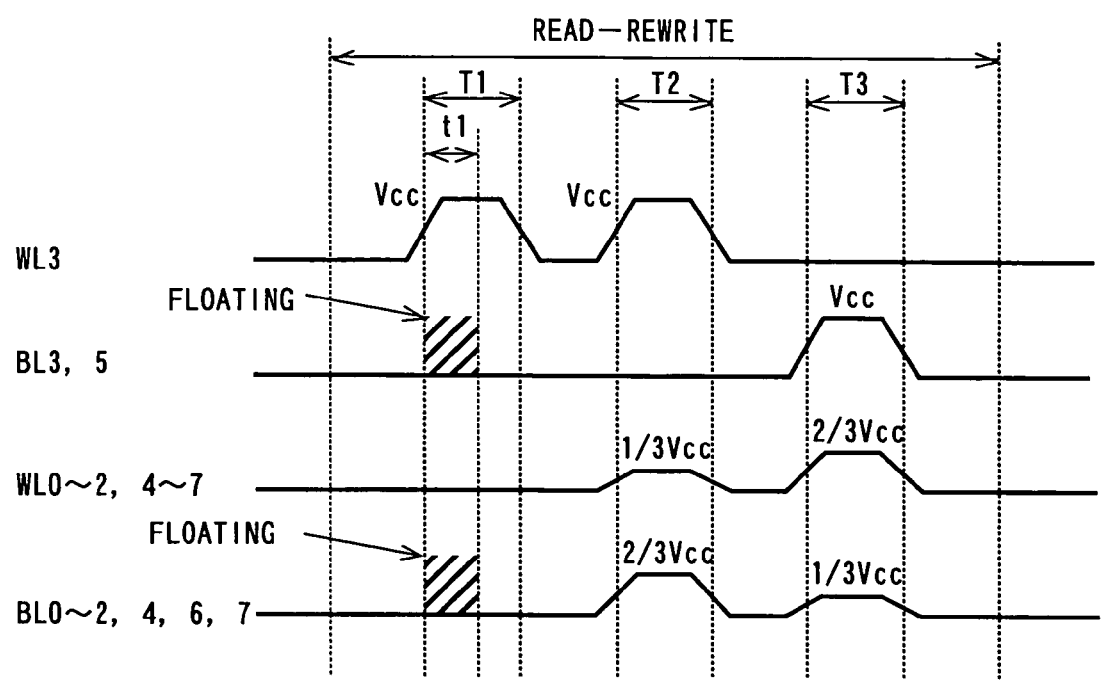
FIG. 5 is a voltage waveform diagram for illustrating read and rewrite operations of the simple matrix ferroelectric memory according to the first embodiment of the present invention.

As shown in FIG. 5, the ferroelectric memory performs the read-rewrite operations in periods T1, T2 and T3. The periods T2 and T3 are so decided as to equalize variations of polarization quantities caused in the memory cells supplied with electric fields of opposite directions in the periods T2 and T3 respectively with each other. In general, the periods T2 and T3 are identically for T seconds. The ferroelectric memory may perform the operations in the periods T1 to T3 continuously or independently of each other. The ferroelectric memory brings all bit lines BL0 to BL7 into floating states in a period t1. The ferroelectric memory may start the period t1 simultaneously with application of the voltage Vcc to the selected word line WL3 or in advance thereof by about several to several 10 nsec.

The operations in the periods T1 to T3 are now described. In a standby state, the ferroelectric memory sets the word lines WL0 to WL7 and the bit lines BL0 to BL7 to 0 V. This state is an example of the state "setting said word line and said bit line to substantially identical potentials" in the present invention.

(Read Operation)

The ferroelectric memory reads data in the period T1 shown in FIG. 5. From the standby state, the ferroelectric memory brings all bit lines BL0 to BL7 into floating states. Further, the ferroelectric memory sets the selected word line WL3 to the voltage Vcc at the same time or in a delay by several to several 10 nsec. In this state, the ferroelectric memory detects the voltages of all bit lines BL0 to BL7 thereby determining data "0" or "1". The ferroelectric memory determines the data "0" or "1" by comparing the potential of the selected bit line BL with a separately generated reference potential and amplifying the potential difference therebetween by the read amplifier 8 (see FIG. 1) formed by a voltage sense amplifier. In this period t1, potential differences are caused in the memory cells of the first to fourth cell regions (see FIG. 4) as shown in the upper half of FIG. 6.

Figure 6:
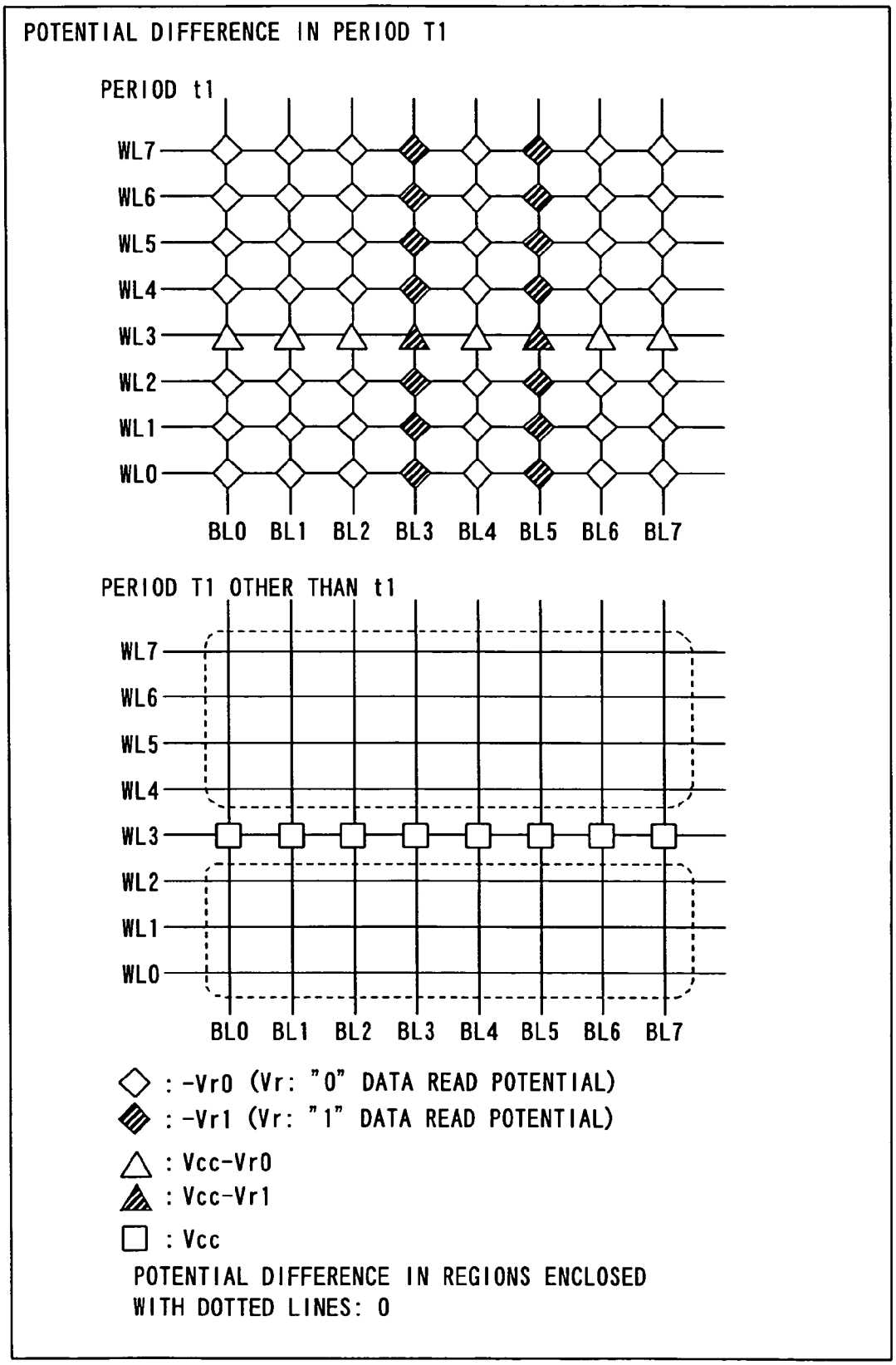
FIG. 6 illustrates potential differences caused in the memory cell array in the read and rewrite operations of the simple matrix ferroelectric memory according to the first embodiment of the present invention.

Referring to FIGS. 4 and 6, the ferroelectric memory applies the potential difference (Vcc−Vr0) between the voltage Vcc and a "0" data read potential Vr0 to the memory cells of the first cell regions for the period t1. The ferroelectric memory also applies the potential difference (Vcc−Vr1) between the voltage Vcc and a "1" data read potential Vr1 to the memory cells of the second cell regions for the period t1. The ferroelectric memory further applies a potential difference −Vr1 to the memory cells of the third cell regions for the period t1. The ferroelectric memory further applies a potential difference −Vr0 to the memory cells of the fourth cell regions for the period t1.

At this time, the ferroelectric memory can reduce the "1" and "0" data read potentials Vr1 and Vr0 beyond a coercive voltage by increasing the number of cells along the direction of the bit lines BL0 to BL7 and increasing the load capacitances of the overall bit lines BL0 to BL7. The term "coercive voltage" denotes the minimum voltage necessary for polarization-inverting the inner part of a ferroelectric film. Therefore, a polarization state is not inverted when a voltage smaller than the coercive voltage is applied to the ferroelectric film over a long time. Thus, the ferroelectric memory can reliably inhibit the memory cells of the third and fourth cell regions from deterioration of polarization states by setting the "1" and "0" data read potentials Vr1 and Vr0 smaller than the coercive voltage.

As hereinabove described, the ferroelectric memory compares the voltages generated on all bit lines BL0 to BL7 with the reference potential by the read amplifier 8 and amplifies the results of the comparison thereby determining data in the period t1. When the ferroelectric memory more quickly transmits the voltages generated on all bit lines BL0 to BL7 to the read amplifier 8, therefore, the period t1 can be sufficiently shortened. More specifically, the ferroelectric memory can more quickly transmit the voltages generated on all bit lines BL0 to BL7 to the read amplifier 8 by reducing the wiring distances between all bit lines BL0 to BL7 and the read amplifier 8 thereby reducing wiring load capacitances. Thus, the ferroelectric memory can sufficiently reduce deterioration and improvement of the polarization states caused by applying the potential difference –Vr1 or Vr0 to all memory cells (those of the third and fourth cell regions) connected to the non-selected word lines WL0 to WL2 and WL4 to WL7 in the period t1 to be substantially negligible as compared with deterioration and improvement of the polarization states caused by operations performed in the subsequent periods T2 and T3 by sufficiently shortening the period t1. The term "deterioration of the polarization states" denotes reduction of quantities of charges stored in ferroelectric capacitors, and the term "improvement of the polarization states" denotes increase of the reduced quantities of charges.

After a lapse of the period t1, the ferroelectric memory sets all bit lines BL0 to BL7 to 0 V. This potential 0 V of the bit lines BL0 to BL7 is an example of the "fixed potential" in the present invention. Further, this period corresponds to the period T1 other than the period t1, and potential differences in the memory cells are distributed as shown in the lower half of FIG. 6. Referring to FIGS. 4 and 6, the ferroelectric memory applies the potential difference Vcc to the memory cells (selected cells) of the first and second cell regions in a period (T1–t1) while causing no potential differences in the memory cells (non-selected cells) of the third and fourth cell regions.

Figure 7:
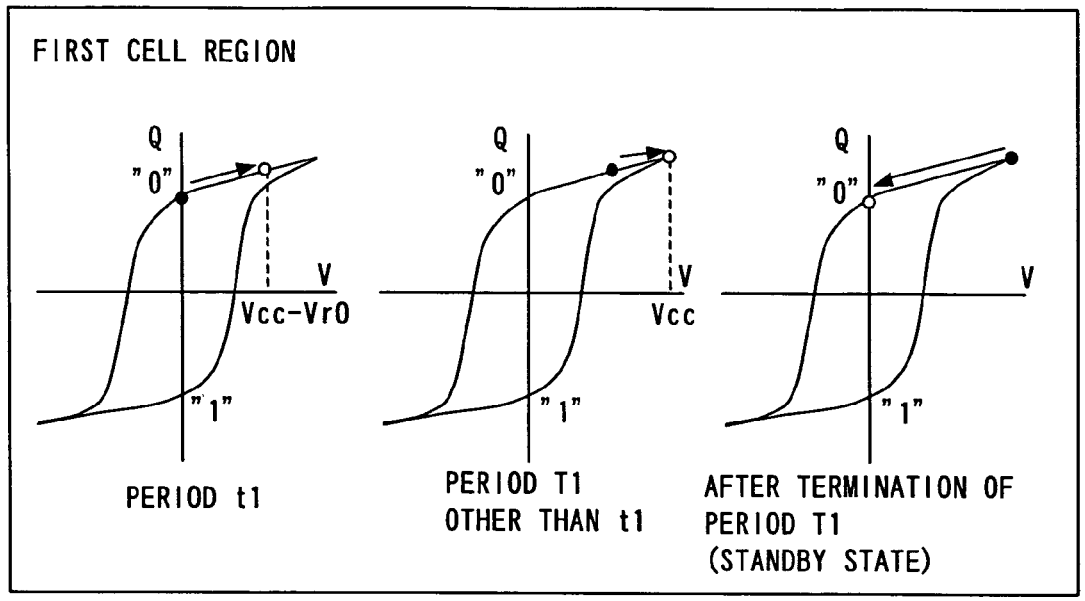
FIG. 7 illustrates polarization changes in each memory cell of each first cell region in the read and rewrite operations of the simple matrix ferroelectric memory according to the first embodiment of the present invention.
Figure 8:
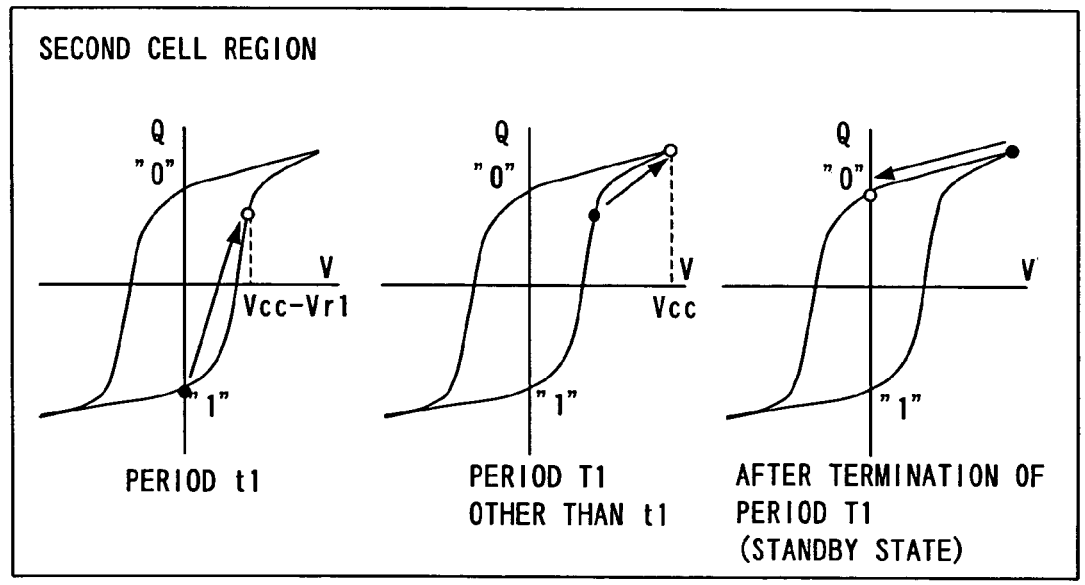
FIG. 8 illustrates polarization changes in each memory cell of each second cell region in the read and rewrite operations of the simple matrix ferroelectric memory according to the first embodiment of the present invention.
Figure 9:
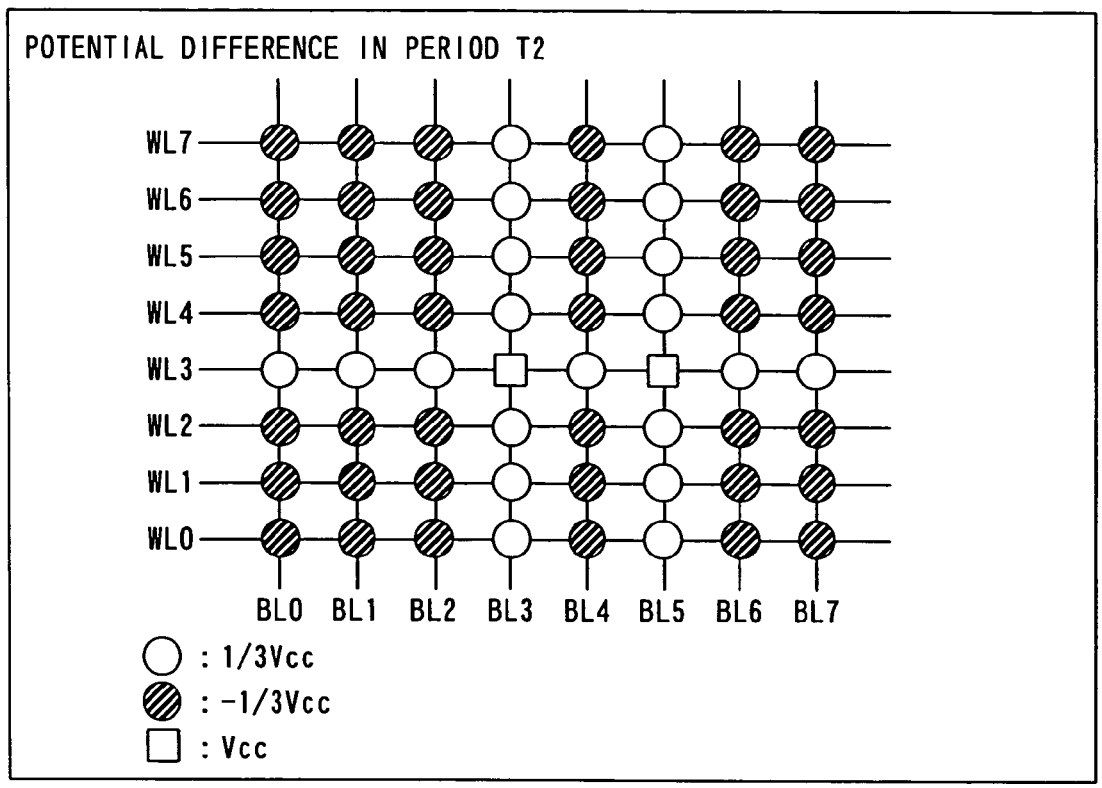
FIG. 9 illustrates potential differences caused in the memory cell array in the read and rewrite operations of the simple matrix ferroelectric memory according to the first embodiment of the present invention.

After a lapse of this period T1, the ferroelectric memory sets the selected word line WL3 to the voltage 0 V and returns to the standby state, thereby completing the read operation. FIGS. 7 and 8 show polarization changes of the memory cells (selected cells) of the first and second cell regions in the period T1 respectively. The data "0" stored in the memory cells of the first cell regions are not destroyed due to the read operation, as shown in FIG. 7. On the other hand, the data "1" stored in the memory cells of the second cell regions are destroyed and replaced with the data "0", as shown in FIG. 8. Therefore, the ferroelectric memory must rewrite the data "1" in the memory cells of the second cell regions. According to the first embodiment, the ferroelectric memory performs this rewrite operation in the periods T2 and T3.

(Rewrite Operation)

From the standby state, the ferroelectric memory sets the selected word line WL3, the non-selected word lines WL0 to WL2 and WL4 to WL7, the bit lines BL3 and BL5 connected with the memory cells from which the data "1" have been read in the read operation and the remaining bit lines BL0 to BL2, BL4, BL6 and BL7 to the voltages Vcc, ⅓ Vcc, 0 V and ⅔ Vcc respectively in the period T2 shown in FIG. 5. In this case, the ferroelectric memory applies potential differences shown in FIG. 9 to the memory cells of the first to fourth cell regions for T seconds forming the period T2. In other words, the ferroelectric memory applies the potential differences ⅓ Vcc and Vcc to the memory cells of the first and third cell regions and to those of the second cell regions respectively. The ferroelectric memory also applies the potential difference –⅓ Vcc to the memory cells of the fourth cell regions.

Figure 10:
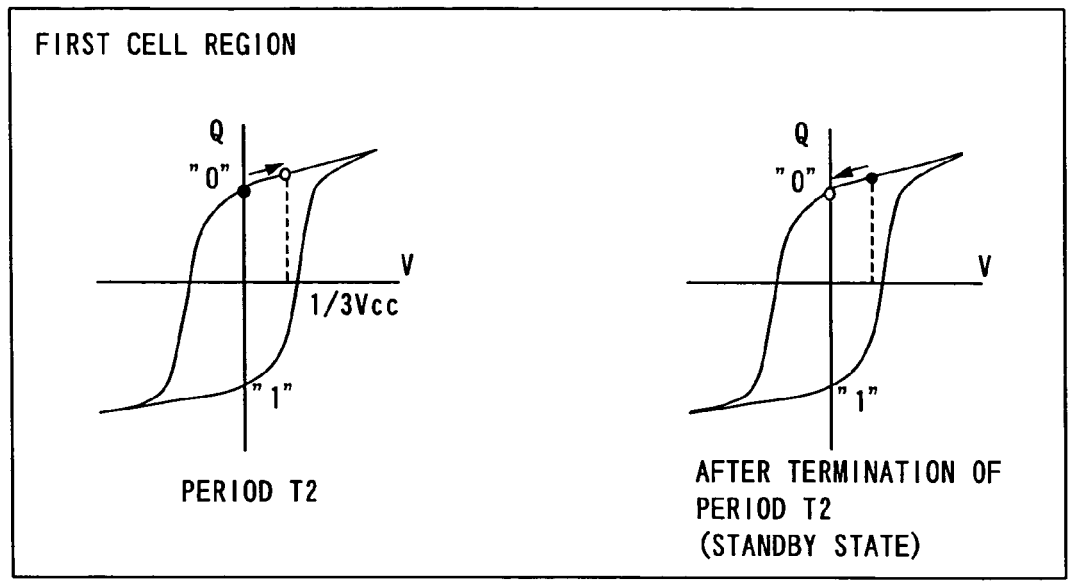
FIG. 10 illustrates polarization changes in each memory cell of each first cell region in the read and rewrite operations of the simple matrix ferroelectric memory according to the first embodiment of the present invention.
Figure 11:
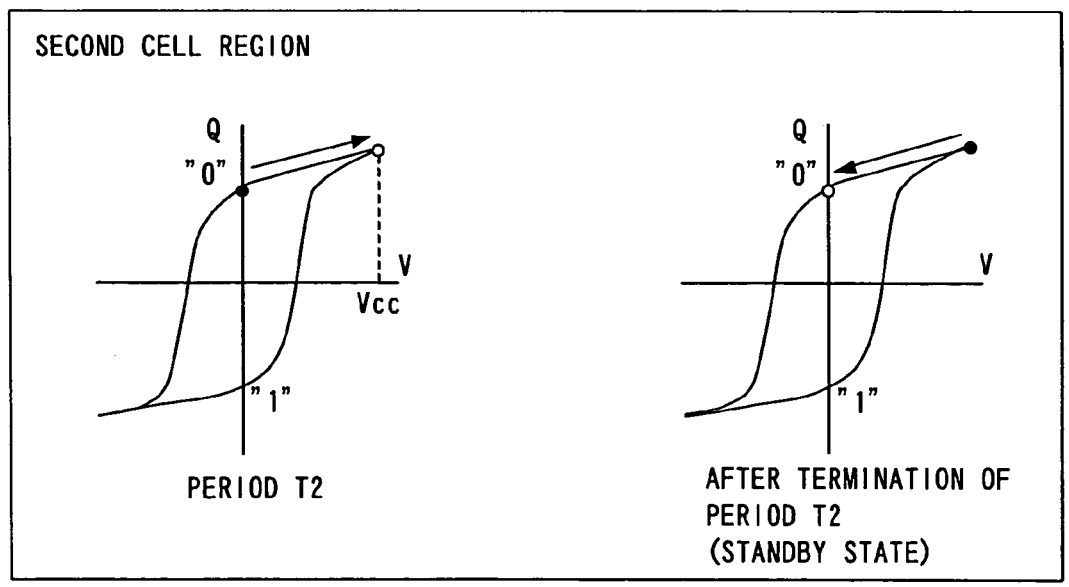
FIG. 11 illustrates polarization changes in each memory cell of each second cell region in the read and rewrite operations of the simple matrix ferroelectric memory according to the first embodiment of the present invention.
Figure 12:
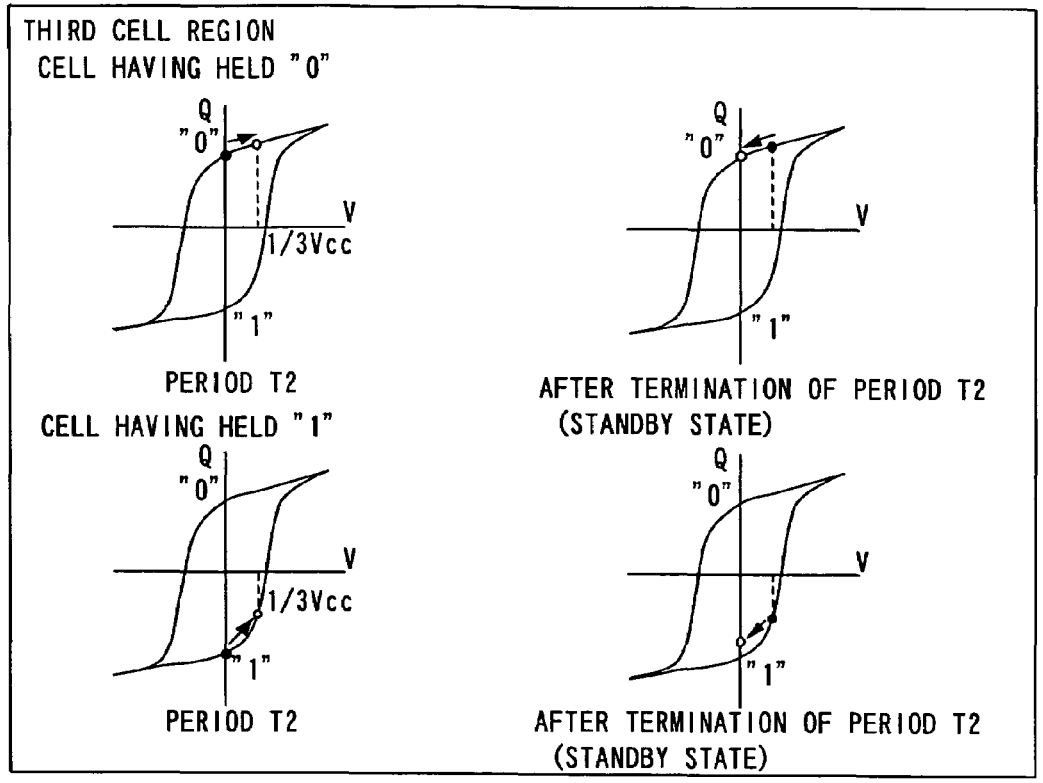
FIG. 12 illustrates polarization changes in each memory cell of each third cell region in the read and rewrite operations of the simple matrix ferroelectric memory according to the first embodiment of the present invention.
Figure 13:
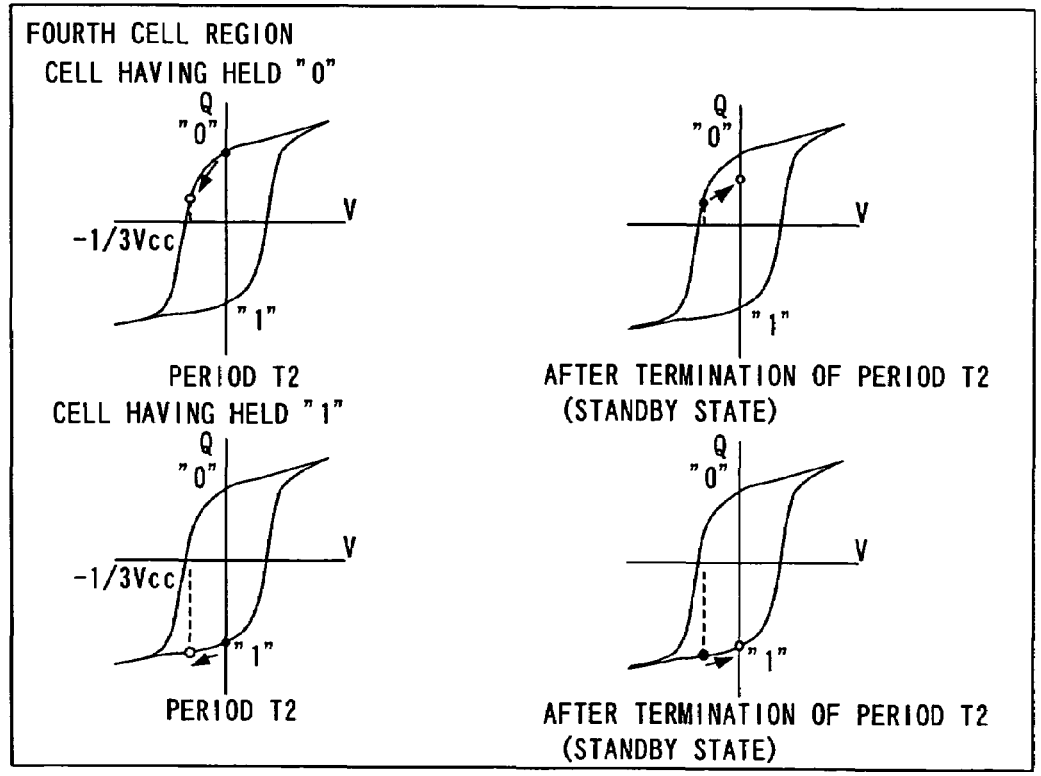
FIG. 13 illustrates polarization changes in each memory cell of each fourth cell region in the read and rewrite operations of the simple matrix ferroelectric memory according to the first embodiment of the present invention.
Figure 14:
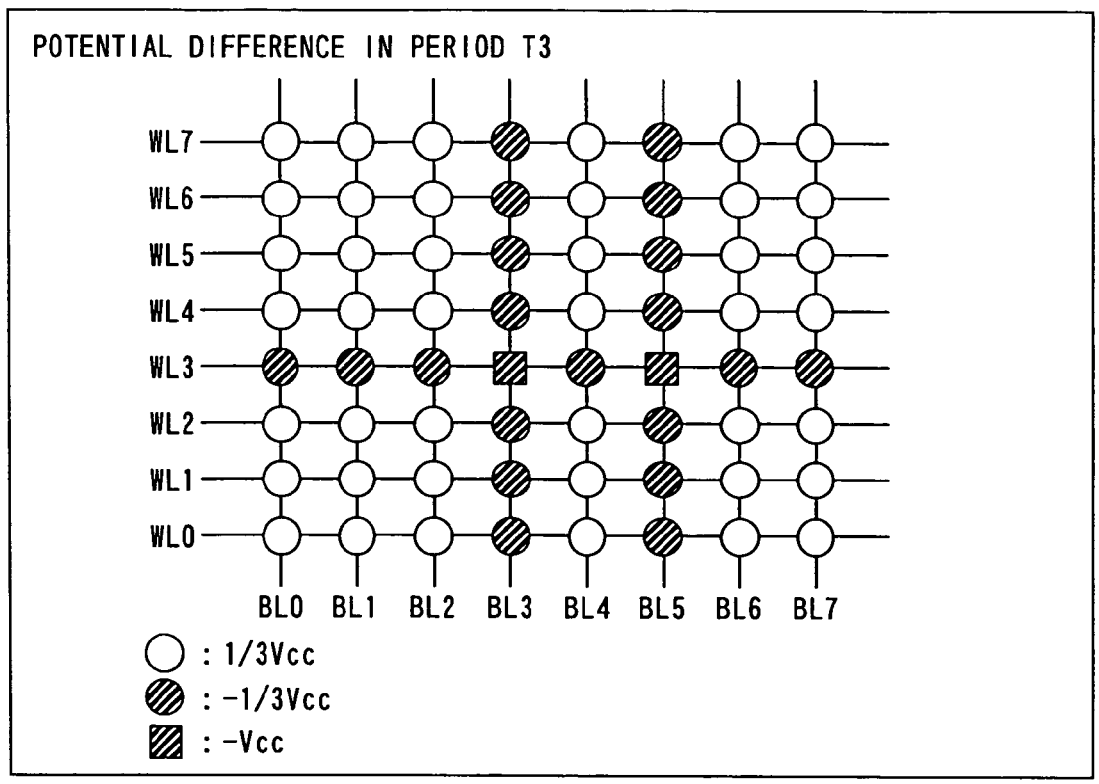
FIG. 14 illustrates potential differences caused in the memory cell array in the read and rewrite operations of the simple matrix ferroelectric memory according to the first embodiment of the present invention.

After a lapse of this period T2, the ferroelectric memory returns to the standby state again, as shown in FIG. 5. FIGS. 10 to 13 show polarization changes of the memory cells of the first to fourth cell regions in the period T2 respectively. As shown in FIG. 10, the ferroelectric memory applies the potential difference ⅓ Vcc to the memory cells of the first cell regions for the period T2, thereby improving the polarization states thereof. As shown in FIG. 11, the ferroelectric memory applies the potential difference Vcc to the memory cells of the second cell regions written with the data "0" in the period T1 for the period T2, thereby rewriting the data "0" therein. The polarization states of the memory cells (non-selected cells) of the third and fourth cell regions are improved or deteriorated depending on the contents of the data stored therein. More specifically, the polarization states are improved when the memory cells of the third cell regions hold the data "0" while the same are deteriorated when the memory cells hold the data "1", as shown in FIG. 12. The polarization states are improved when the memory cells of the fourth cell regions hold the data "0" while the same are deteriorated when the memory cells hold the data "1", as shown in FIG. 13.

From the standby state, the ferroelectric memory sets the selected word line WL3, the non-selected word lines WL0 to WL2 and WL4 to WL7, the bit lines BL3 and BL5 connected with the memory cells from which the data "1" have been read in the read operation and the remaining bit lines BL0 to BL2, BL4, BL6 and BL7 to the voltages 0 V, ⅔ Vcc, Vcc and ⅓ Vcc respectively in the period T3 shown in FIG. 5. In this case, the ferroelectric memory applies potential differences shown in FIG. 14 to the memory cells of the first to fourth cell regions for T seconds forming the period T3. In other words, the ferroelectric memory applies the potential differences –⅓ Vcc and –Vcc to the memory cells of the first and third cell regions and to those of the second cell regions respectively. The ferroelectric memory also applies the potential difference ⅓ Vcc to the memory cells of the fourth cell regions.

Figure 19:
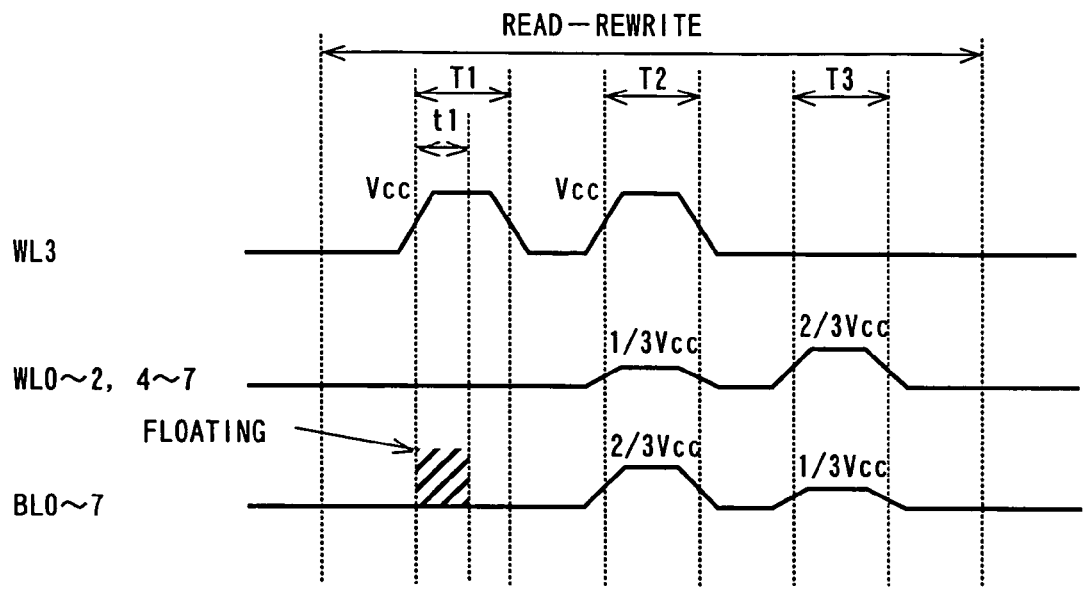
FIGS. 19 to 21 are other voltage waveform diagrams for illustrating the read and rewrite operations of the simple matrix ferroelectric memory according to the first embodiment of the present invention.
Figure 20:
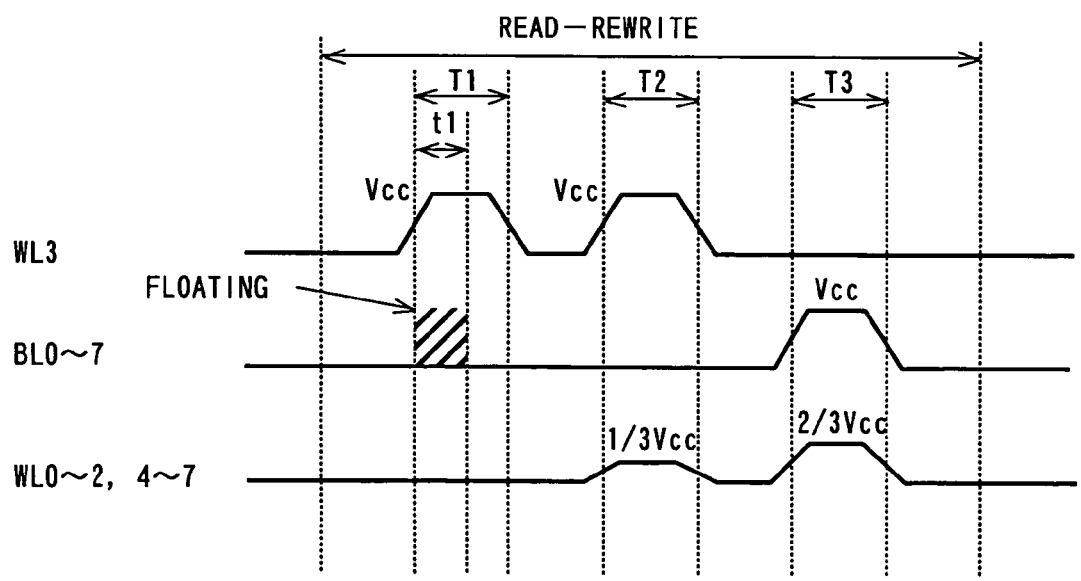

When reading the data "0" from all memory cells (memory cells of the first and second cell regions) connected to the selected word line WL3 in the read operation as a specific case in the aforementioned periods T2 and T3, the ferroelectric memory applies voltages shown in FIG. 19 to the word lines WL0 to WL7 and the bit lines BL0 to BL7 respectively. In other words, the ferroelectric memory sets the selected word line WL3, the non-selected word lines WL0 to WL2 and WL4 to WL7 and all bit lines BL0 to BL7 to the voltages Vcc, ⅓ Vcc and ⅔ Vcc respectively in the period T2. Further, the ferroelectric memory sets the selected word line WL3, the non-selected word lines WL0 to WL2 and WL4 to WL7 and all bit lines BL0 to BL7 to the voltages 0 V, ⅔ Vcc and ⅓ Vcc respectively in the period T3. When reading the data "1" from all memory cells (memory cells of the first and second cell regions) connected to the selected word line WL3 in the read operation as another specific case in the periods T2 and T3, the ferroelectric memory applies voltages shown in FIG. 20 to the word lines WL0 to WL7 and the bit lines BL0 to BL7 respectively. In other words, the ferroelectric memory sets the selected word line WL3, the non-selected word lines WL0 to WL2 and WL4 to WL7 and all bit lines BL0 to BL7 to the voltages Vcc, ⅓ Vcc and 0 V respectively in the period T2. Further, the ferroelectric memory sets the selected word line WL3, the non-selected word lines WL0 to WL2 and WL4 to WL7 and all bit lines BL0 to BL7 to the voltages 0 V, ⅔ Vcc and Vcc respectively in the period T3.

Figure 15:
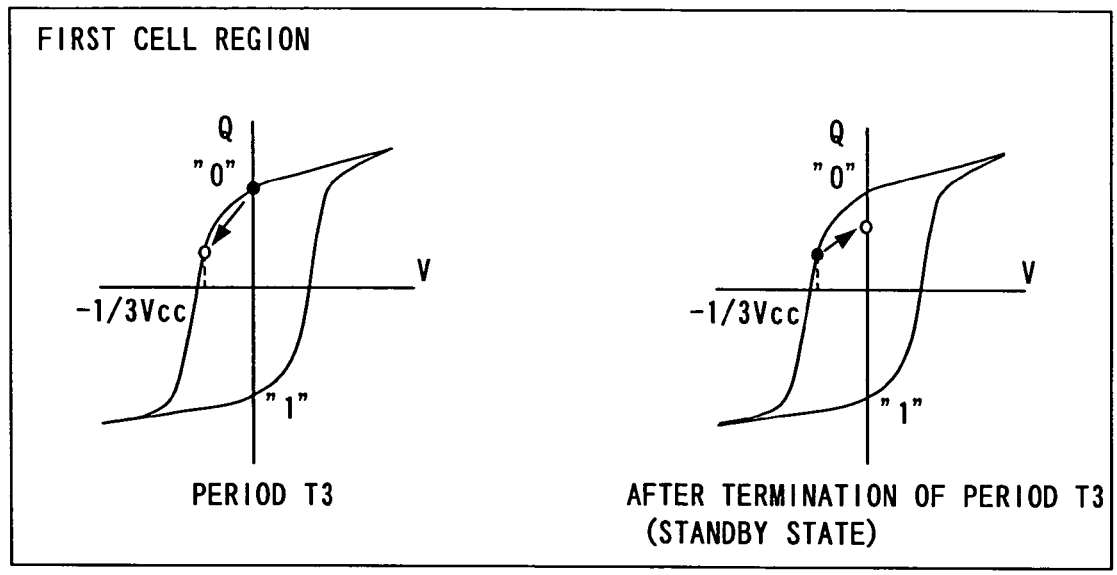
FIG. 15 illustrates polarization changes in each memory cell of each first cell region in the read and rewrite operations of the simple matrix ferroelectric memory according to the first embodiment of the present invention.
Figure 16:
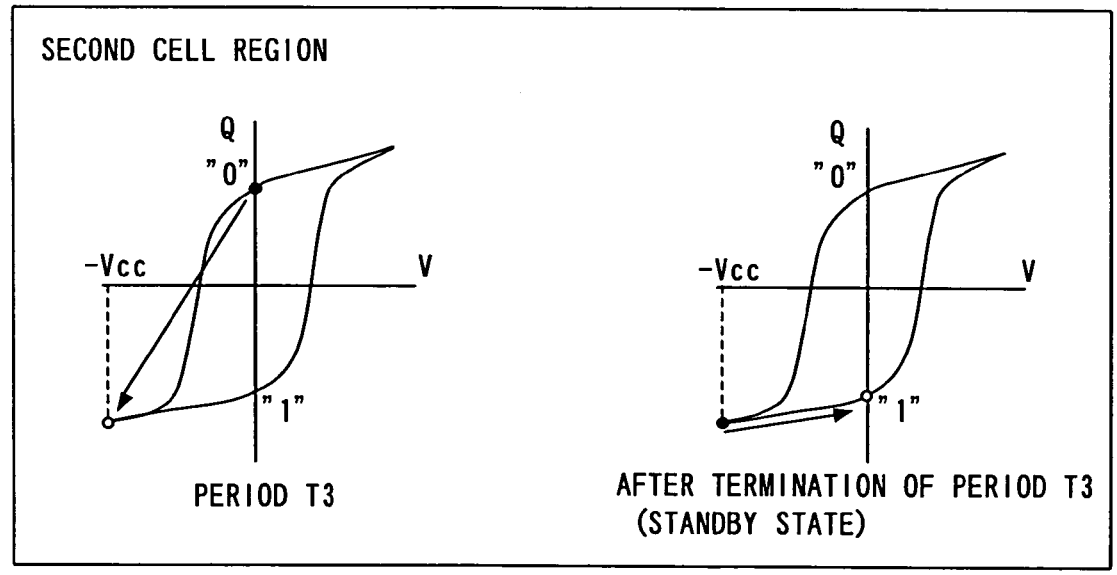
FIG. 16 illustrates polarization changes in each memory cell of each second cell region in the read and rewrite operations of the simple matrix ferroelectric memory according to the first embodiment of the present invention.
Figure 17:
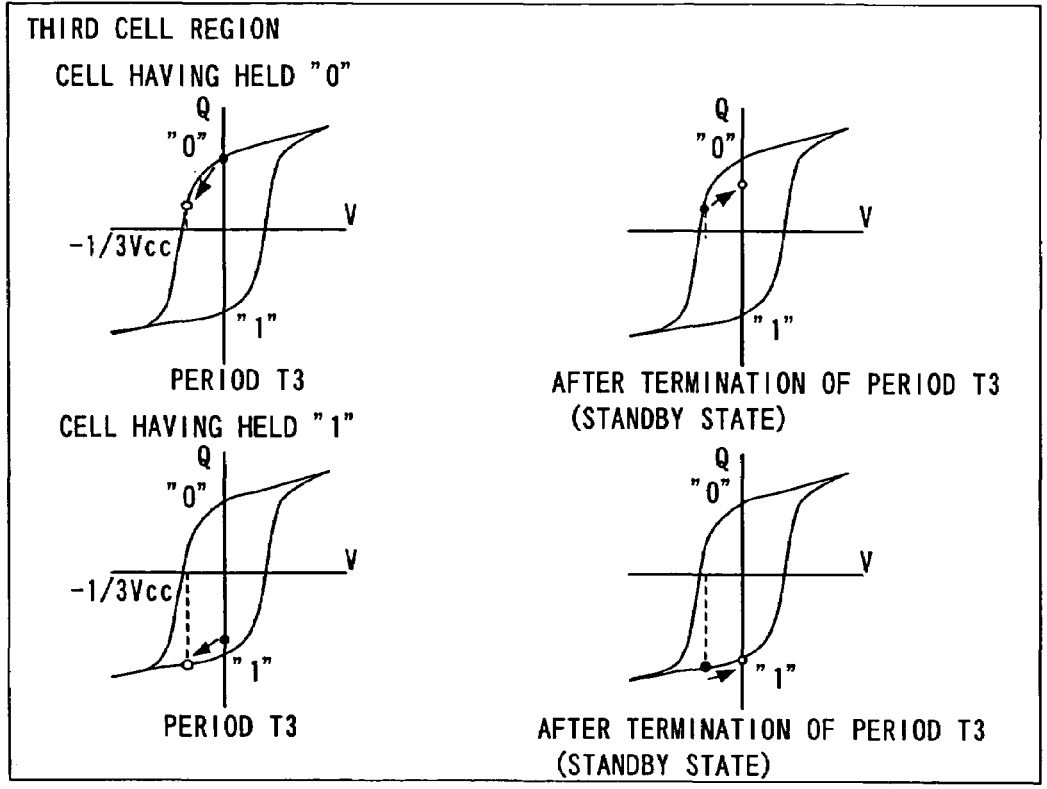
FIG. 17 illustrates polarization changes in each memory cell of each third cell region in the read and rewrite operations of the simple matrix ferroelectric memory according to the first embodiment of the present invention.
Figure 18:
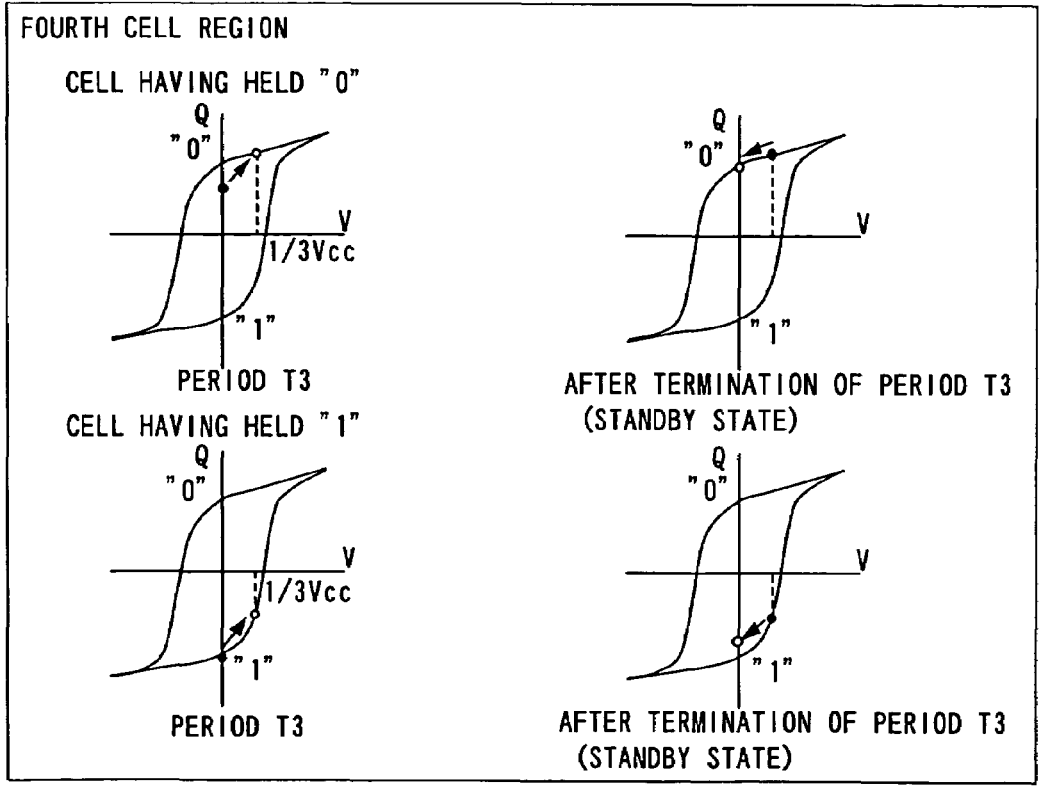
FIG. 18 illustrates polarization changes in each memory cell of each fourth cell region in the read and rewrite operations of the simple matrix ferroelectric memory according to the first embodiment of the present invention.

After a lapse of the period T3, the ferroelectric memory returns to the standby state again for completing the series of read-rewrite operations, as shown in FIG. 5. FIGS. 15 to 18 show polarization changes of the memory cells of the first to fourth cell regions in the period T3 respectively. As shown in FIG. 15, the ferroelectric memory applies the potential difference −⅓ Vcc to the memory cells of the first cell regions for the period T3, thereby deteriorating the polarization states thereof. As shown in FIG. 16, the ferroelectric memory applies the potential difference −Vcc to the memory cells of the second cell regions for the period T3, thereby writing the data "1" therein. Thus, the ferroelectric memory completely rewrites the data "1" destroyed by the read operation. The polarization states of the memory cells (non-selected cells) of the third and fourth cell regions are improved or deteriorated depending on the contents of the data stored therein, similarly to the period T2. More specifically, the polarization states are improved when the memory cells of the third cell regions hold the data "0" while the same are deteriorated when the memory cells hold the data "1", as shown in FIG. 17. The polarization states are improved when the memory cells of the fourth cell regions hold the data "0" while the same are deteriorated when the memory cells hold the data "1", as shown in FIG. 18.

In other words, the polarization states are necessarily improved and deteriorated single times respectively in all memory cells (memory cells of the first, third and fourth cell regions) other than the memory cells having held the data "1" among those connected to the selected word line WL3 through the read-rewrite operations in the simple matrix ferroelectric memory according to the first embodiment. Thus, the ferroelectric memory includes no memory cell whose polarization state is continuously deteriorated due to repetition of the read-rewrite operations.

The ferroelectric memory according to the first embodiment, applying the reverse voltages ±⅓ Vcc to all memory cells of the first, third and fourth regions other than the memory cells having held the data "1" among those connected to the selected word line WL3 single times respectively through the read and rewrite operations as hereinabove described, can suppress polarization deterioration in the read operation. Thus, the ferroelectric memory can inhibit all non-selected cells, i.e., the memory cells of the third and fourth cell regions, and the memory cells of the first cell regions having held the data "0" among the selected cells from disturbance.

When the ferroelectric memory reads the data "0" from all memory cells (memory cells of the first and second cell regions) connected to the selected word line WL3 in the read operation as the specific case, the first and second cell regions include no memory cells whose data are destroyed due to this read operation. In other words, all data read in the read operation are identical to all data held in all memory cells (memory cells of the first and second cell regions) connected to the selected word line WL3 after the reading. Further, no non-selected cells (memory cells of the third and fourth cell regions) substantially cause deterioration of the polarization states thereof in this read operation. In this specific case, therefore, the ferroelectric memory may not perform the aforementioned operations in the periods T2 and T3 as shown in voltage waveforms of FIG. 21, in place of those shown in FIG. 19.

Figure 21:
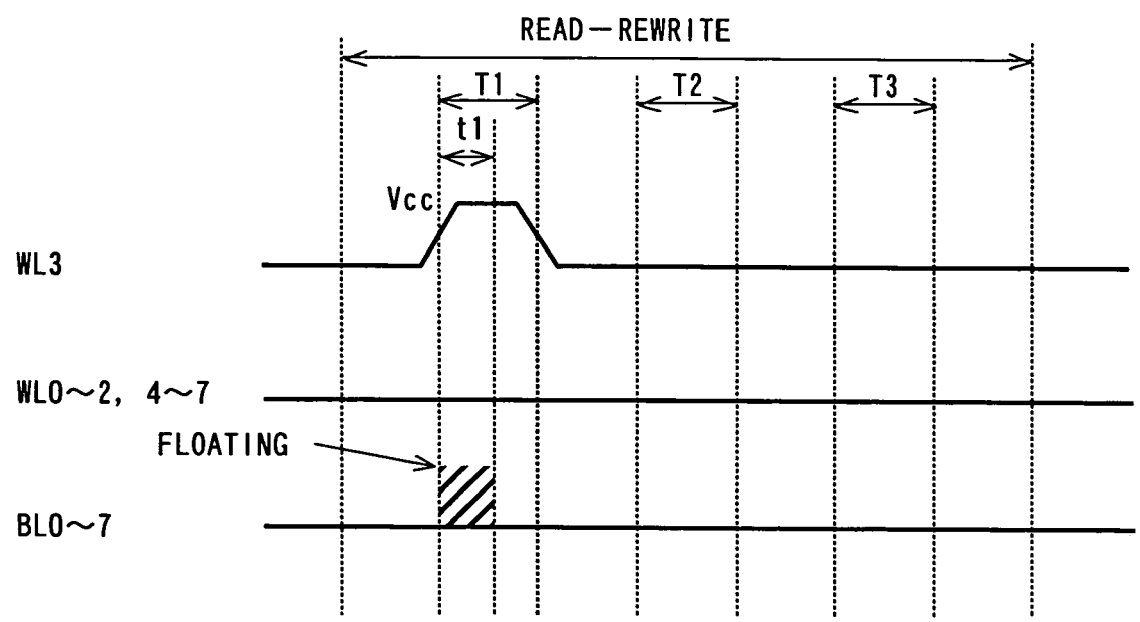
Figure 22:
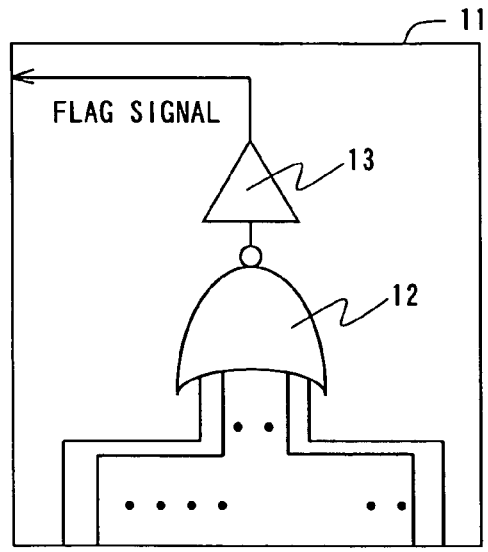
FIG. 22 illustrates an exemplary data determination circuit.
Figure 23:
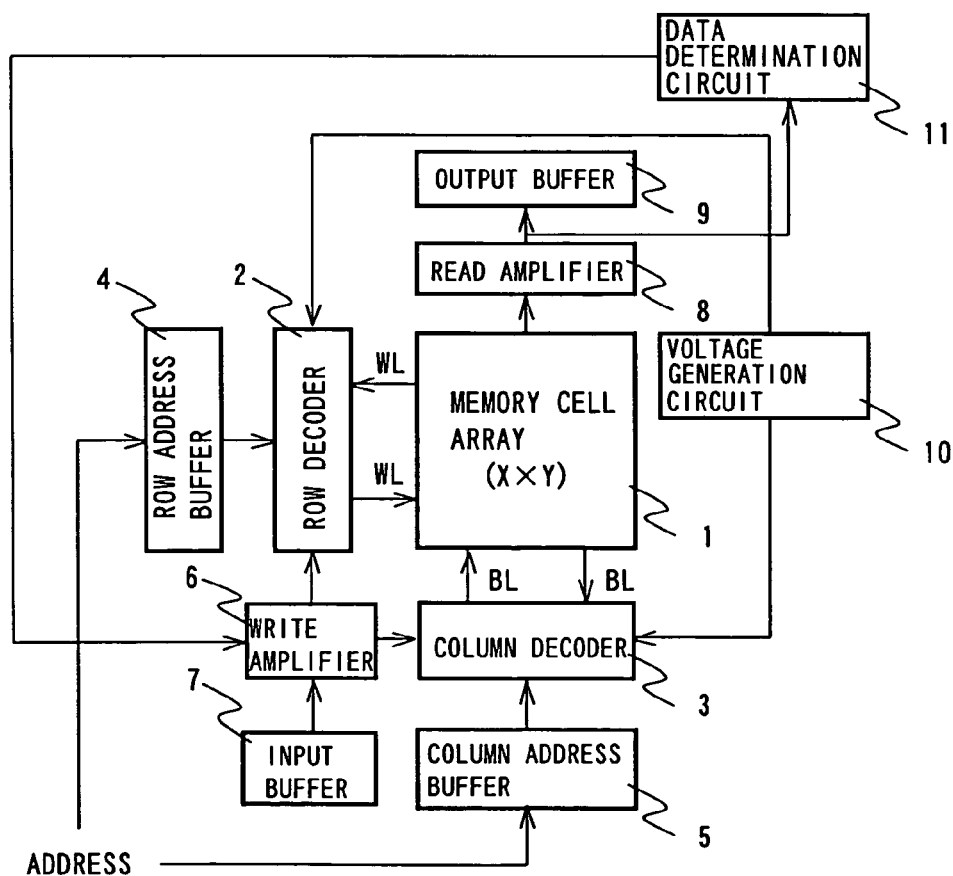
FIG. 23 is a block diagram showing the overall structure of a simple matrix ferroelectric memory according to a first modification of the first embodiment of the present invention.

In order to perform no rewrite operation (operations in the periods T2 and T3) as shown in FIG. 21, the ferroelectric memory must detect that the data "0" have been read from all memory cells (selected cells) of the first and second cell regions connected to the selected word line WL3 due to the read operation performed in the period T1. FIG. 22 shows an exemplary data determination circuit 11 for detecting that all data read from the selected cells are "0" and outputting a flag signal. Referring to FIG. 22, the data determination circuit 11 is constituted of a NOR circuit 12 receiving a plurality of input signals corresponding to the bit lines BL0 to BL7 respectively and a buffer circuit 13 receiving an output signal from the NOR circuit 12 and outputting the flag signal. In other words, this data determination circuit 11 outputs "1" as the flag signal only when all of the plurality of input signals corresponding to the bit lines BL0 to BL7 respectively are the data "0", otherwise outputting "0" as the flag signal. FIG. 23 shows a simple matrix ferroelectric memory according to a first modification of the first embodiment formed by adding the data determination circuit 11 to the simple matrix ferroelectric memory according to the first embodiment shown in FIG. 1. Referring to FIG. 23, the simple matrix ferroelectric memory according to the first modification of the first embodiment is constituted for inputting an output of the read amplifier 8 into the data determination circuit 11 and inputting the flag signal output from the data determination circuit 11 into the write amplifier 6. The write amplifier 6 receives the flag signal "1" only when all of a plurality of output signals from the read amplifier 8 are the data "0", and hence the ferroelectric memory controls the row and column decoders 3 so that the write amplifier 6 performs no rewrite operation only when the flag signal is "1". Thus, this ferroelectric memory, capable of performing no rewrite operation when reading the data "0" from all memory cells (selected cells) of the first and second cell regions connected to the selected word line WL3, can reduce the number of operations in reading.

(2) Write Operation

The write operation in the first embodiment is described on the assumption that the ferroelectric memory selects the word line WL3 as shown in FIG. 3 for writing the data "1" in the memory cells connected to the bit lines BL3 and BL5 among those connected to the selected word line WL3 while writing the data "0" in the memory cells connected to the remaining bit lines BL0 to BL2, BL4, BL6 and BL7. Respective cell regions are defined similarly to those shown in FIG. 4.

Figure 24:
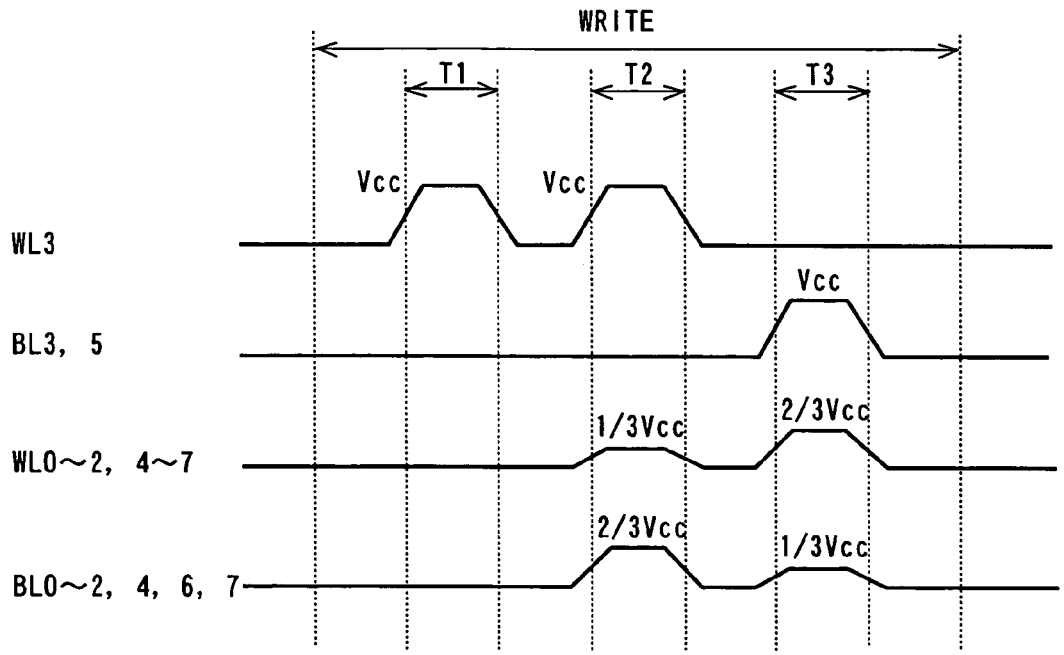
FIG. 24 is a voltage waveform diagram for illustrating a write operation of the simple matrix ferroelectric memory according to the first embodiment of the present invention.

The ferroelectric memory performs the write operation through a batch "0" write operation, a compensatory operation and a "1" write operation performed in periods T1, T2 and T3 shown in FIG. 24 respectively. It is assumed that the periods T2 and T3 are identically for T seconds. The ferroelectric memory may perform the operations in the periods T1 to T3 continuously or independently of each other. The operations are now described.

(Batch "0" Write Operation)

Figure 25:
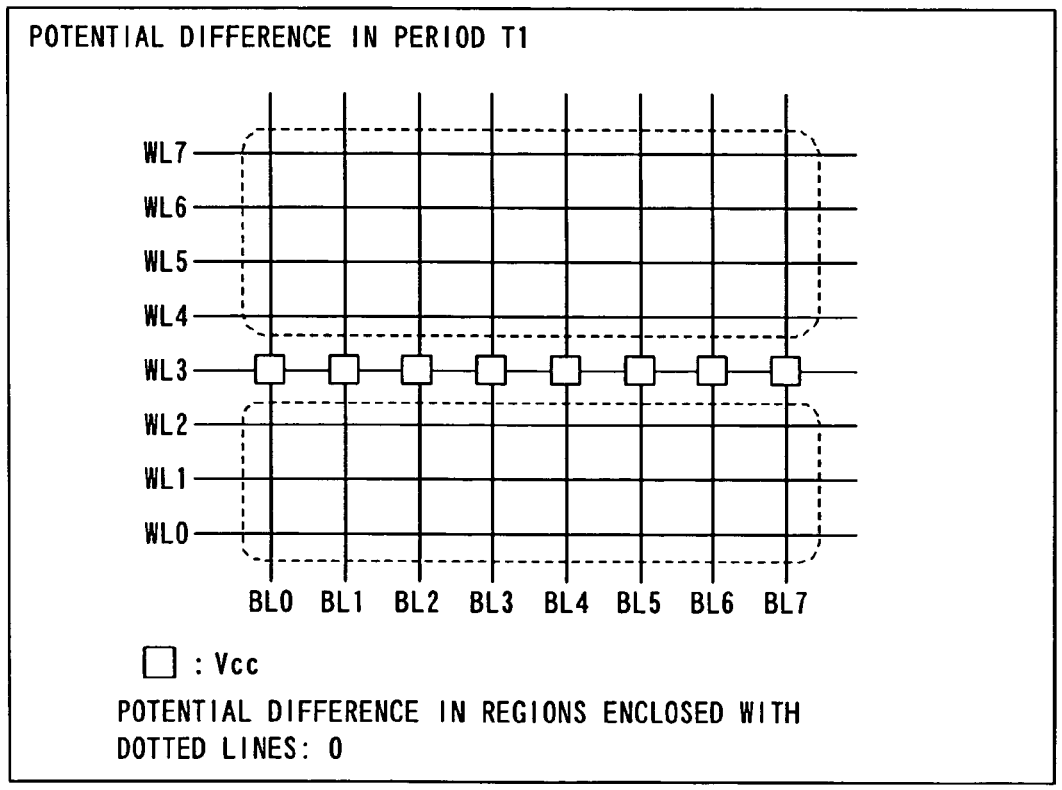
FIG. 25 illustrates potential differences caused in the memory cell array in the write operation of the simple matrix ferroelectric memory according to the first embodiment of the present invention.

In the period T1 shown in FIG. 24, the ferroelectric memory writes data "0" in all memory cells connected to the selected word line WL3. From a standby state, the ferroelectric memory first sets only the selected word line WL3 to the voltage Vcc. FIG. 25 shows potential difference distribution in the memory cells. In other words, the ferroelectric memory applies the potential difference Vcc to the memory cells (selected cells) of the first and second cell regions for the period T1 while causing no potential difference in the memory cells (non-selected cells) of the third and fourth cell regions.

Figure 26:
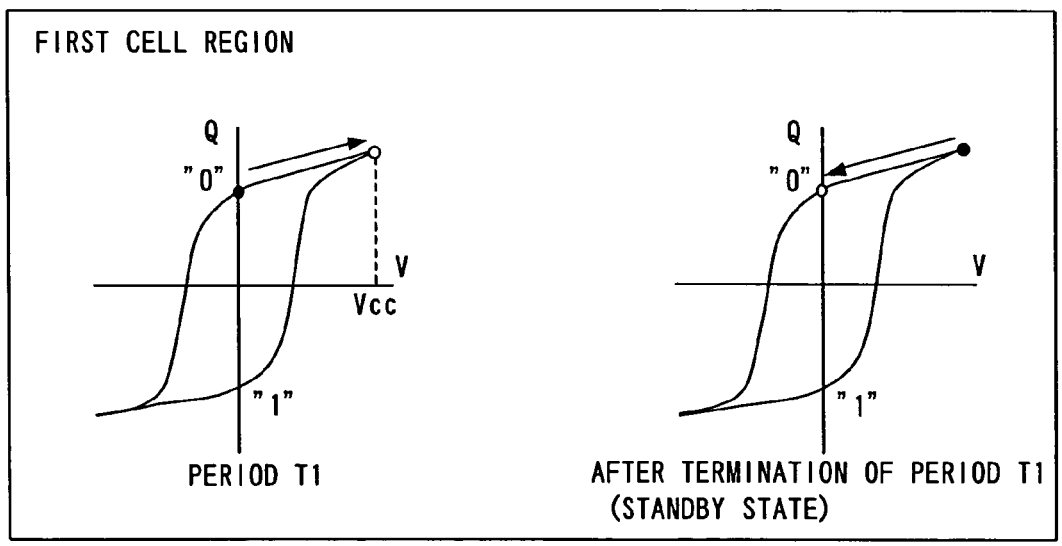
FIG. 26 illustrates polarization changes in each memory cell of each first cell region in the write operation of the simple matrix ferroelectric memory according to the first embodiment of the present invention.
Figure 27:
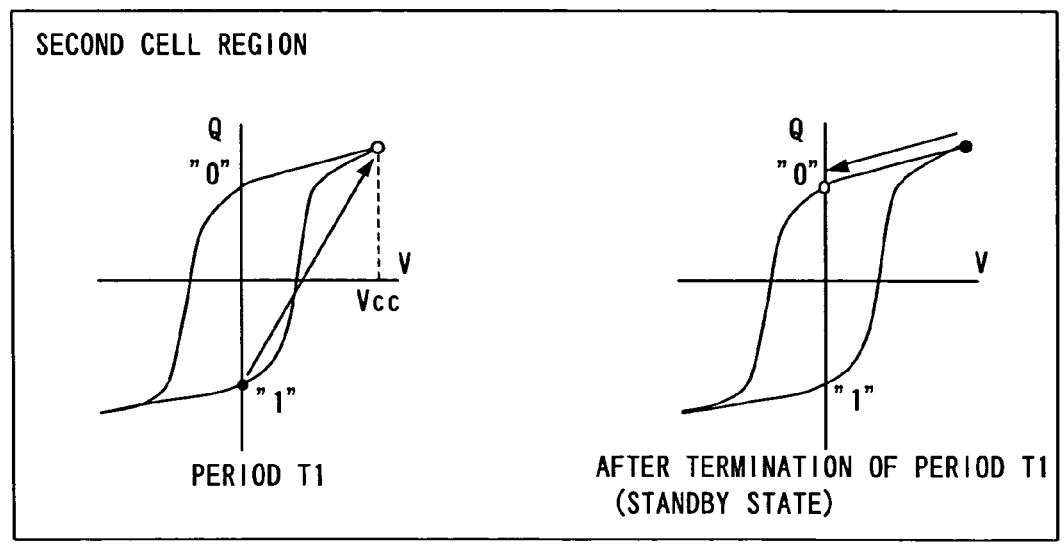
FIG. 27 illustrates polarization changes in each memory cell of each second cell region in the write operation of the simple matrix ferroelectric memory according to the first embodiment of the present invention.

After a lapse of the period T1, the ferroelectric memory sets the voltage of the selected word line WL3 to 0 V and returns to the standby state, thereby completing the batch "0" write operation. FIGS. 26 and 27 show changes of the polarization states of the memory cells of the first and second cell regions in the period T1. In other words, the ferroelectric memory writes the data "0" in both of the memory cells of the first and second cell regions having held the data "0" and "1" respectively. The polarization states of the memory cells (non-selected cells) of the third and fourth cell regions causing no potential difference remain unchanged.

(Compensatory Operation)

In the period T2 shown in FIG. 24, the ferroelectric memory performs an operation (compensatory operation) for previously improving the polarization states on memory cells causing deterioration of the polarization states due to the "1" write operation performed in the period T3 described later.

From the standby state, the ferroelectric memory sets the selected word line WL3, the non-selected word lines WL0 to WL2 and WL4 to WL7, the bit lines BL3 and BL5 connected with memory cells to be written with the data "1" and the remaining bit lines BL0 to BL2, BL4, BL6 and BL7 to the voltages Vcc, $\frac{1}{3}$ Vcc, 0 V and $\frac{2}{3}$ Vcc respectively in the period T2 shown in FIG. 24. In this case, the ferroelectric memory applies potential differences similar to those in the read-rewrite operations shown in FIG. 9 to the memory cells of the first to fourth regions respectively. In other words, the ferroelectric memory applies the potential differences $\frac{1}{3}$ Vcc and Vcc to the memory cells of the first and third cell regions and to those of the second cell regions respectively. The ferroelectric memory also applies the potential difference $-\frac{1}{3}$ Vcc to the memory cells of the fourth cell regions.

After a lapse of the period T2, the ferroelectric memory returns to the standby state again. In the period T2, the ferroelectric memory changes the polarization states of the memory cells of the first to fourth cell regions similarly to those in the read-rewrite operations as shown in FIGS. 10 to 13. In other words, the ferroelectric memory improves the polarization states of the memory cells of the first cell regions (see FIG. 10), and rewrites the data "0" in the memory cells of the second cell regions (see FIG. 11). The polarization states are improved when the memory cells of the third cell regions hold the data "0", while the same are deteriorated when the memory cells hold the data "1" (see FIG. 12). The polarization states are improved when the memory cells of the fourth cell regions hold the data "0", while the same are deteriorated when the memory cells hold the data "1" (see FIG. 13).

("1" Write Operation)

From the standby state, the ferroelectric memory sets the selected word line WL3, the non-selected word lines WL0 to WL2 and WL4 to WL7, the bit lines BL3 and BL5 connected with the memory cells to be written with the data "1" and the remaining bit lines BL0 to BL2, BL4, BL6 and BL7 to the voltages 0 V, $\frac{2}{3}$ Vcc, Vcc and $\frac{1}{3}$ Vcc respectively in the period T3 shown in FIG. 24. In this case, the ferroelectric memory applies potential differences similar to those in the read-rewrite operations shown in FIG. 13 to the memory cells of the first to fourth cell regions for T seconds forming the period T3. In other words, the ferroelectric memory applies the potential differences $-\frac{1}{3}$ Vcc and $-$Vcc to the memory cells of the first and third cell regions and to those of the second cell regions respectively. The ferroelectric memory also applies the potential difference $\frac{1}{3}$ Vcc to the memory cells of the fourth regions.

Figure 28:
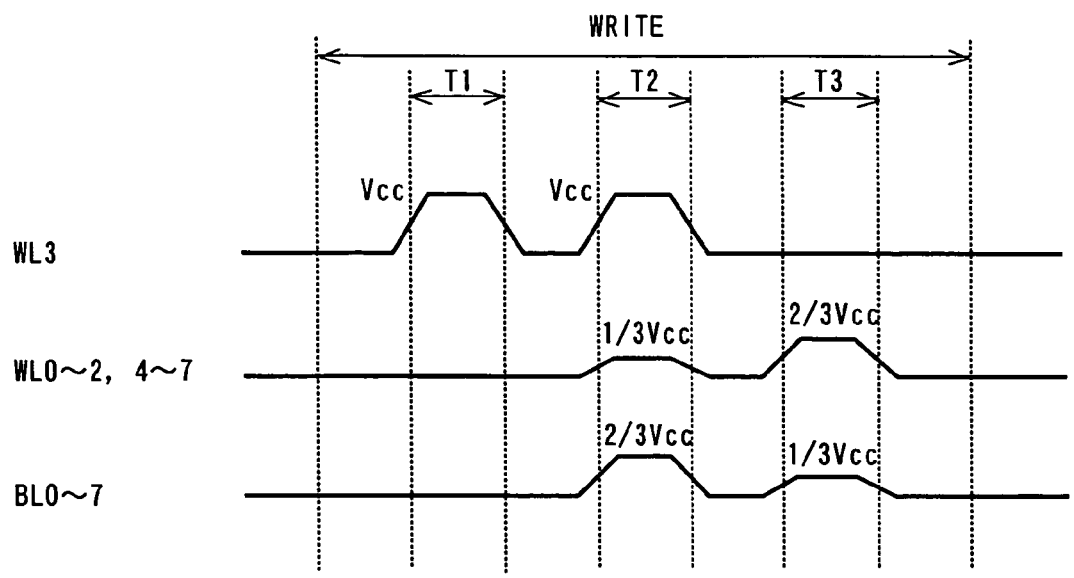
FIGS. 28 to 30 are other voltage waveform diagrams for illustrating the write operation of the simple matrix ferroelectric memory according to the first embodiment of the present invention.
Figure 29:
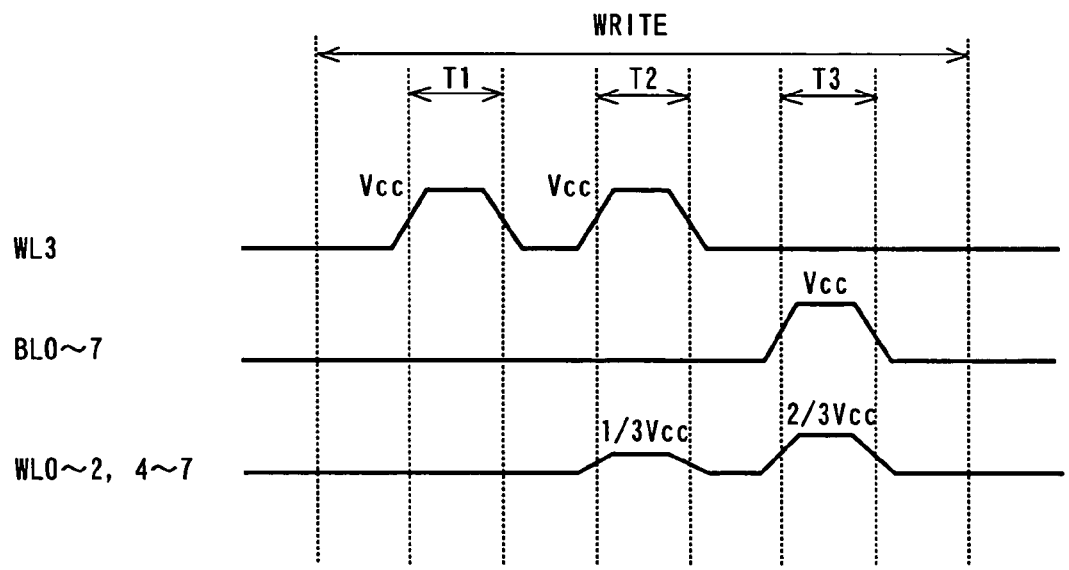

When writing the data "0" in all memory cells (memory cells of the first and second cell regions) connected to the selected word line WL3 as a specific case in the aforementioned periods T2 and T3, the ferroelectric memory sets the selected word line WL3, the non-selected word lines WL0 to WL2 and WL4 to WL7 and all bit lines BL0 to BL7 to the voltages Vcc, $\frac{1}{3}$ Vcc and $\frac{2}{3}$ Vcc respectively in the period T2 while setting the selected word WL3, the non-selected word lines WL0 to WL2 and WL4 to WL7 and all bit lines BL0 to BL7 to the voltages 0 V, $\frac{2}{3}$ Vcc and $\frac{1}{3}$ Vcc respectively in the period T3, as shown in FIG. 28. When writing the data "1" in all memory cells (memory cells of the first and second cell regions) connected to the selected word line WL3 as another specific case in the periods T2 and T3, the ferroelectric memory sets the selected word line WL3, the non-selected word lines WL0 to WL2 and WL4 to WL7 and all bit lines BL0 to BL7 to the voltages Vcc, $\frac{1}{3}$ Vcc and 0 V respectively in the period T2 while setting the selected word WL3, the non-selected word lines WL0 to WL2 and WL4 to WL7 and all bit lines BL0 to BL7 to the voltages 0 V, $\frac{2}{3}$ Vcc and Vcc respectively in the period T3, as shown in FIG. 29.

After a lapse of the period T3, the ferroelectric memory returns to the standby state again. In the period T3, the ferroelectric memory changes the polarization states of the memory cells of the first to fourth cell regions similarly to those in the read-rewrite operations as shown in FIGS. 15 to 18. In other words, the ferroelectric memory deteriorates the polarization states of the memory cells of the first cell regions (see FIG. 15), and writes the desired data "1" in the memory cells of the second cell regions (see FIG. 16). The polarization states are improved when the memory cells of the third cell regions hold the data "0" while the same are deteriorated when the memory cells hold the data "1" (see FIG. 17). The polarization states are improved when the memory cells of the fourth cell regions hold the data "0" while the same are deteriorated when the memory cells hold the data "1" (see FIG. 18).

Table 1 shows situations of deterioration and improvement of the polarization states of the memory cells of the first to fourth cell regions in the compensatory and "1" write operations respectively.

TABLE 1

|  |  | Period T1 | Period T2 | Period T3 |
|---|---|---|---|---|
| Memory Cell of First Cell Region |  | Writing"0" | ○ | X |
| Memory Cell of Second Cell Region |  | Writing"0" | Writing"0" | Writing"1" |
| Memory Cell of Third Cell Region | Holding"0" | — | ○ | X |
|  | Holding"1" | — | X | ○ |
| Memory Cell of Fourth Cell Region | Holding"0" | — | X | ○ |
|  | Holding"1" | — | ○ | X |

—: polarization state unchanged
○: polarization state improved
X: polarization state deteriorated As understood from Table 1, all of the memory cells deteriorated in polarization state after completion of the period T3, i.e., the memory cells of the first cell regions, those having held the data "0" in the third regions and those having held the data "1" in the fourth cell regions have been improved in polarization state in the compensatory operation. On the contrary, all of the memory cells improved in polarization state after completion of the period T3 have been deteriorated in polarization state in the compensatory operation.

Thus, the polarization states are necessarily improved and deteriorated single times respectively in the memory cells of the third and fourth cell regions connected to the word lines WL0 to WL2 and WL4 to WL7 other than the selected word line WL3 and the memory cells of the first cell regions to be written with the data "0" among those connected to the selected word line WL3 in the simple matrix ferroelectric memory according to the first embodiment. Thus, the ferroelectric memory includes no memory cell whose polarization state is continuously deteriorated due to repetition of the read operation but can inhibit all non-selected cells, i.e., the memory cells of the third and fourth cell regions connected to the non-selected word lines WL0 to WL2 and WL4 to WL7 other than the selected word line WL3 and the memory cells of the first cell regions to be written with the data "0" among those connected to the selected word line WL3 from disturbance.

In order to write the data "0" in all memory cells (memory cells of the first and second cell regions) connected to the selected word line WL3 as the specific case, the ferroelectric memory writes the data "0" in the memory cells of the first and second cell regions by the aforementioned batch "0" write operation in the period T1. The third and fourth cell regions include no non-selected cells whose polarization states are deteriorated in this batch "0" write operation. In this specific case, therefore, the ferroelectric memory may not perform the aforementioned operations in the periods T2 and T3 as shown in voltage waveforms of FIG. 30, in place of those shown in FIG. 28.

Figure 30:
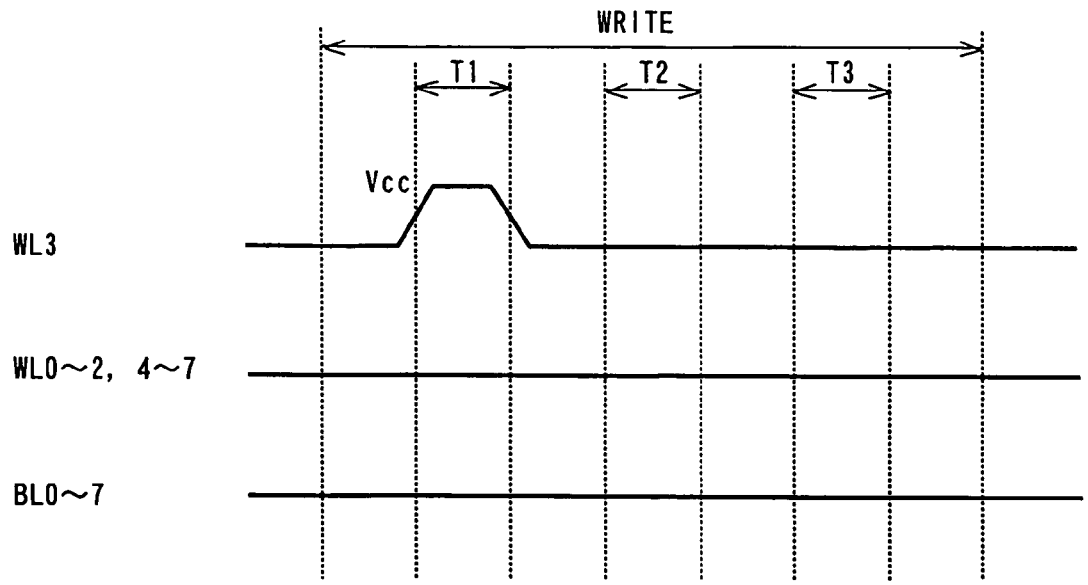
Figure 31:
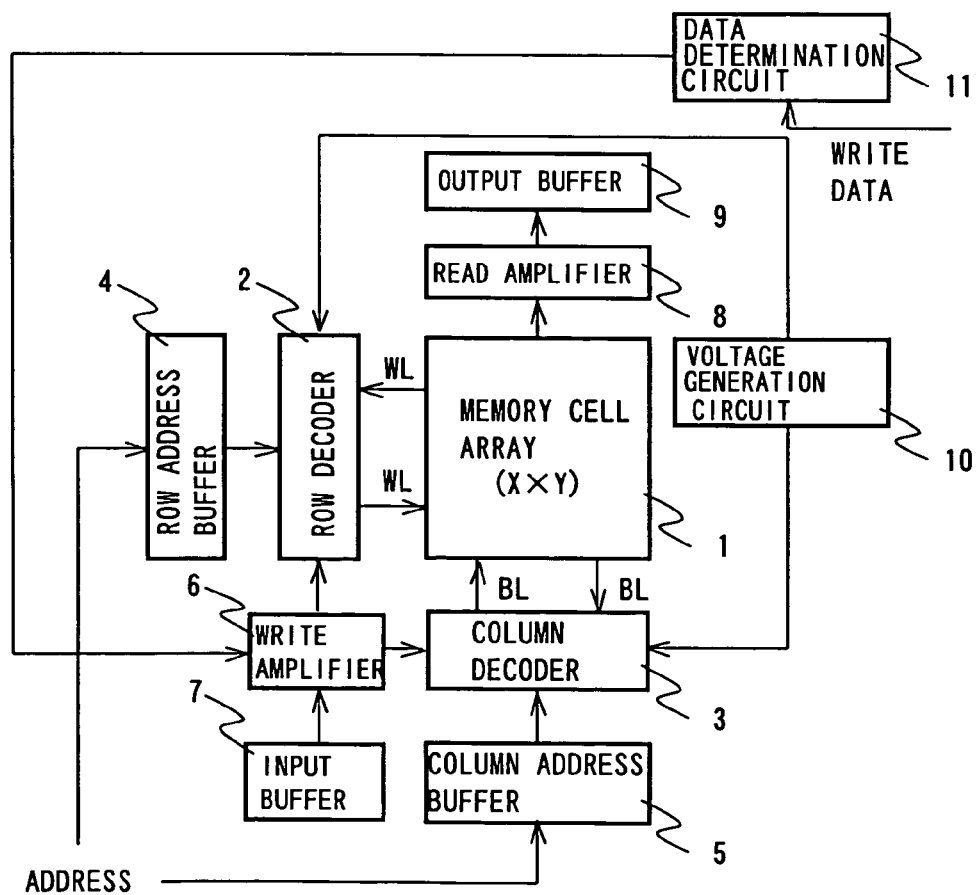
FIG. 31 is a block diagram showing the overall structure of a simple matrix ferroelectric memory according to a second modification of the first embodiment of the present invention.

In order to perform neither compensatory operation (operation in the period T2) nor "1" write operation (operation in the period T3) as shown in FIG. 30, the ferroelectric memory must detect that the data "0" must be written in all memory cells (selected cells) of the first and second cell regions connected to the selected word line WL3 at least before starting the compensatory operation in the period T2. A circuit equivalent to the data determination circuit 11 shown in FIG. 22 can be employed for this detection. FIG. 31 shows a ferroelectric memory according to a second modification of the first embodiment including such a data determination circuit 11. Referring to FIG. 31, the ferroelectric memory according to the second modification of the first embodiment is constituted for inputting write data output from a memory control circuit (not shown) into the data determination circuit 11 and inputting a flag signal output from the data determination circuit 11 into a write amplifier 6. The ferroelectric memory inputs a flag output signal "1" in the write amplifier 6 only when all write data output from the memory control circuit (not shown) are "0". The write amplifier 6 controls row and column decoders 2 and 3 not to perform compensatory and "1" write operations in periods T2 and T3 only when the data determination circuit 11 outputs the flag output signal "1". Thus, the ferroelectric memory can perform no compensatory and "1" write operations in the periods T2 and T3 when writing data "0" in all memory cells (selected cells) of first and second cell regions connected to a selected word line WL3, thereby reducing the number of operations in writing.

Figure 32:
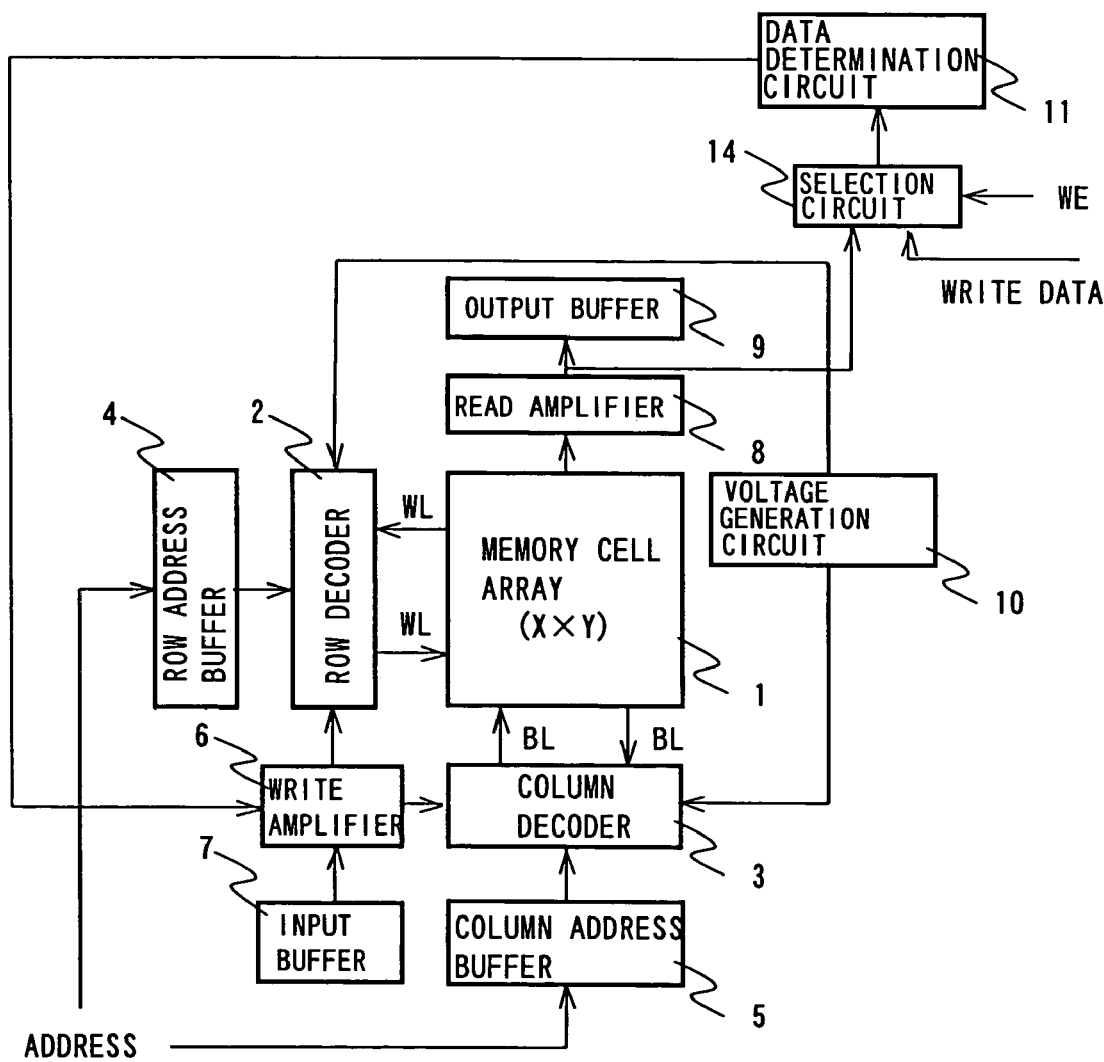
FIG. 32 is a block diagram showing the overall structure of a simple matrix ferroelectric memory according to a third modification of the first embodiment of the present invention.

The ferroelectric memory may alternatively select either the output from the read amplifier 8 or the write data output from the memory control circuit (not shown) for inputting the same in the data determination circuit 11, as in a ferroelectric memory according to a third modification of the first embodiment shown in FIG. 32. The ferroelectric memory according to the third modification comprises a selection circuit 14 for selecting either an output from a read amplifier 8 or write data output from a memory control circuit (not shown) and inputting the same in a data determination circuit 11. The selection circuit 14 receives the output signal from the read amplifier 8, the write data output from the memory control circuit (not shown) and a write enable signal WE. The memory control circuit (not shown) generates the write enable signal WE of "1" in a write operation (up to completion of operations in periods T1 to T3) while otherwise generating the write enable signal WE of "0". In this case, the selection circuit 14 outputs the write data received from the memory control circuit (not shown) when the write enable signal WE is "1" while outputting the output signal from the read amplifier 8 when the write enable signal WE is "0". In other words, the ferroelectric memory inputs the write data output from the memory control circuit (not shown) in the data determination circuit 11 in the write operation (up to completion of the operations in the periods T1 to T3). Otherwise the ferroelectric memory inputs the output signal from the read amplifier 8 in the data determination circuit 11.

Therefore, a write amplifier 6 can control row and column decoders 2 and 3 not to perform operations in the periods T2 and T3 when all data read from selected cells are "0" as well as when all data written in the selected cells are "0" by confirming a flag signal output from the data determination circuit 11. Thus, the ferroelectric memory can perform no operations in the periods T2 and T3 when reading "0" from all selected cells as well as when writing data "0" in all selected cells. The remaining circuit structure of the ferroelectric memory according to the third modification is absolutely equivalent to those of the ferroelectric memories according to the first and second modifications shown in FIGS. 23 and 31 respectively except the selection circuit 14.

The ferroelectric memory includes no memory cell whose polarization state is continuously deteriorated regardless of the order of the read-rewrite operations and the write operation.

Figure 33:
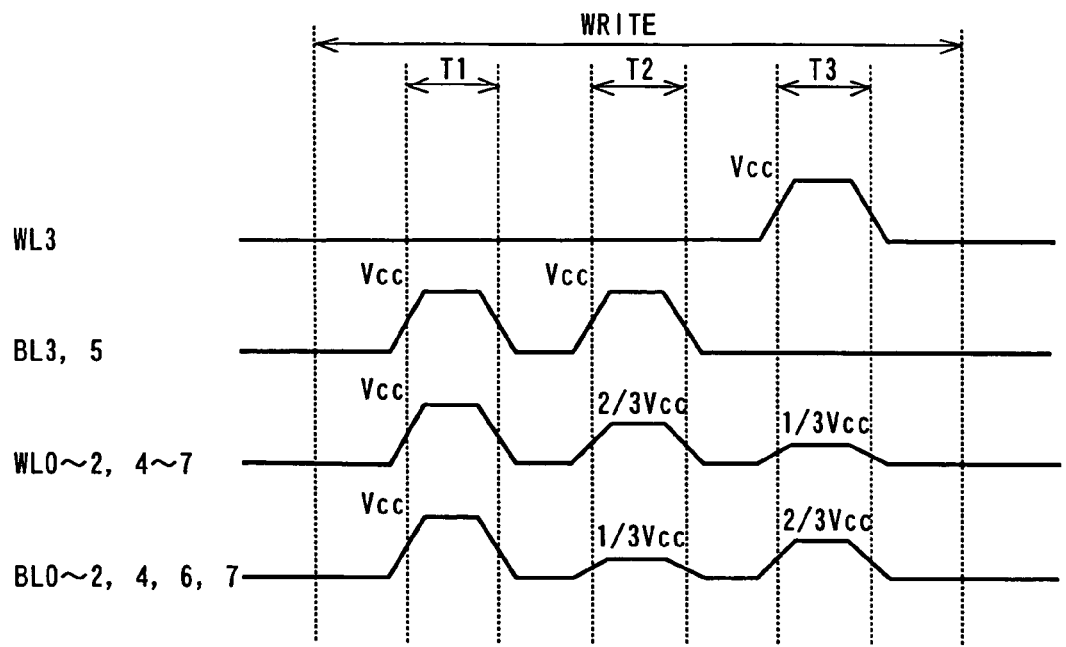
FIGS. 33 and 34 are other voltage waveform diagrams for illustrating the write operation of the simple matrix ferroelectric memory according to the first embodiment of the present invention.

While the above description has been made on the assumption that the ferroelectric memory performs the write operation in order of batch "0" write operation→compensatory operation→"1" write operation, the ferroelectric memory can attain similar effects also when performing the write operation in order of batch "1" write operation→compensatory operation→"0" write operation. FIG. 33 shows waveforms of voltages applied in this case. Referring to FIG. 33, the ferroelectric memory selects the word line WL3. The ferroelectric memory writes data "0" in the memory cells connected to the bit lines BL3 an BL5 among those connected to the selected word line WL3 while writing data "1" in the memory cells connected to the remaining bit lines BL0 to BL2, BL4, BL6 and BL7.

When the ferroelectric memory writes data "1" in all selected cells as a specific example in the case of performing the write operation in order of batch "1" write operation→compensatory operation→"0" write operation, no non-selected cells (memory cells of the third and fourth cell regions) are deteriorated in polarization state due to the batch "1" write operation in the period T1. In this specific case, therefore, the ferroelectric memory may not perform the operations in the periods T2 and T3 as in voltage waveforms shown in FIG. 34, in place of those shown in FIG. 33.

Figure 34:
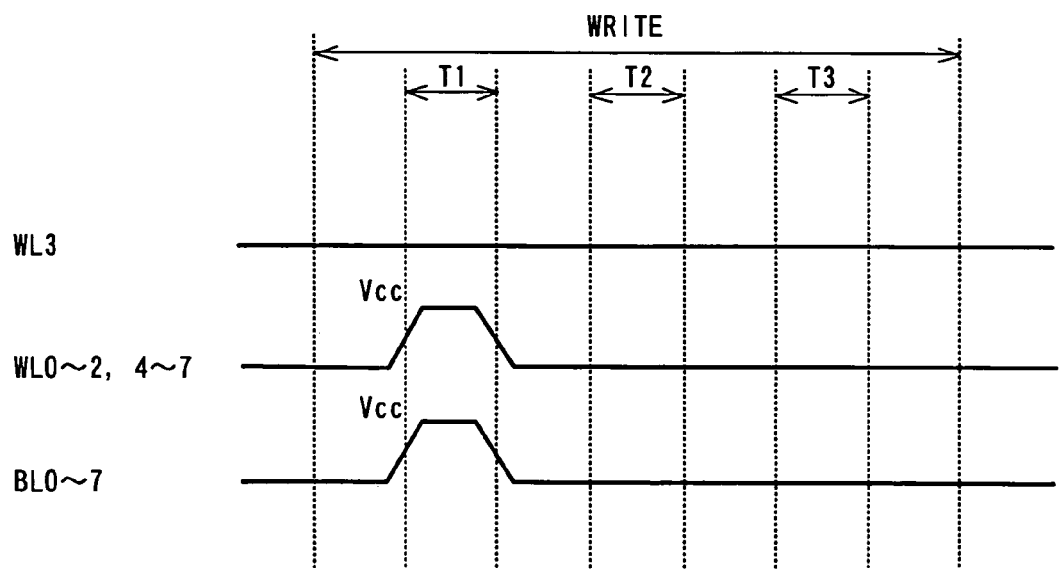
Figure 35:
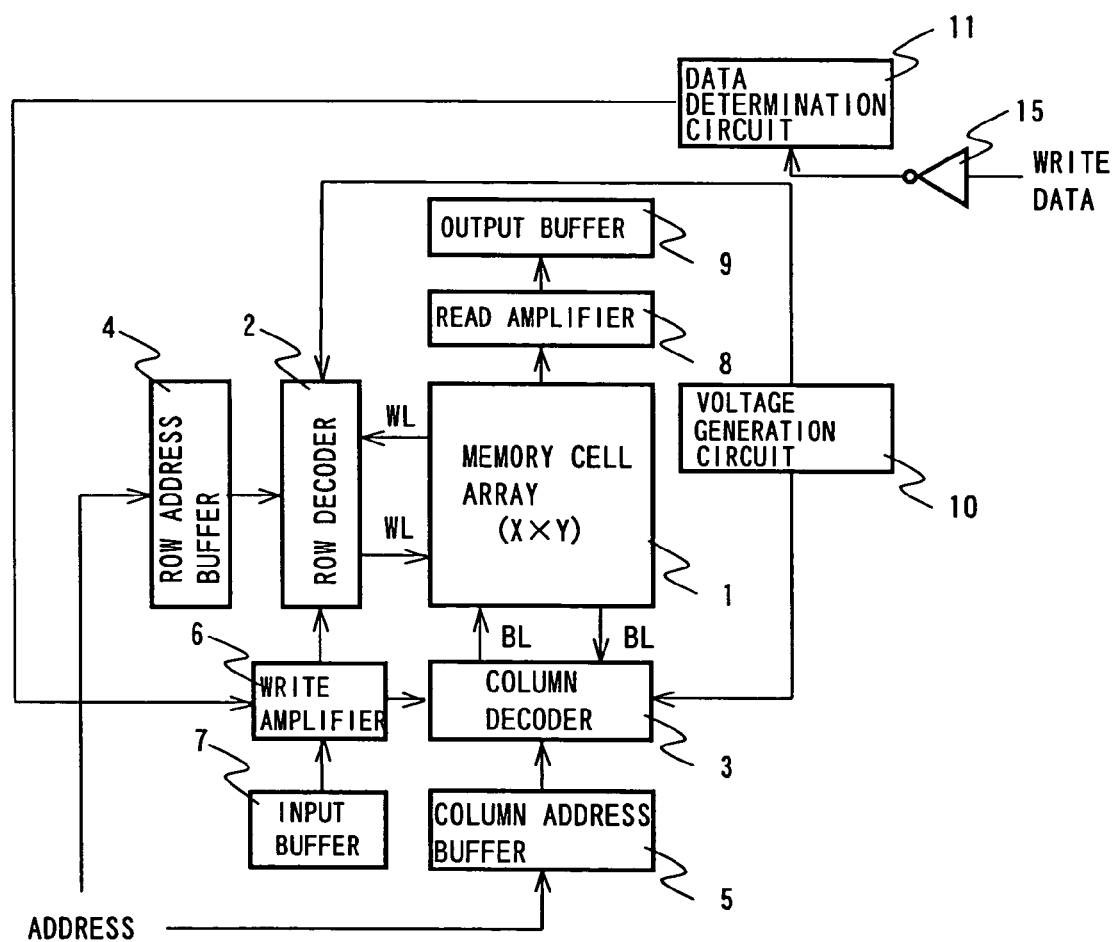
FIG. 35 is a block diagram showing the overall structure of a simple matrix ferroelectric memory according to a fourth modification of the first embodiment of the present invention.

In order to perform no compensatory and "0" write operations in the periods T2 and T3 when performing the write operation in order of batch "1" write operation→compensatory operation→"0" write operation as shown in FIG. 34, an inverter circuit 15 for inverting write data input in a data determination circuit 11 must be added as in a ferroelectric memory according to a fourth modification of the first embodiment shown in FIG. 35.

Figure 36:
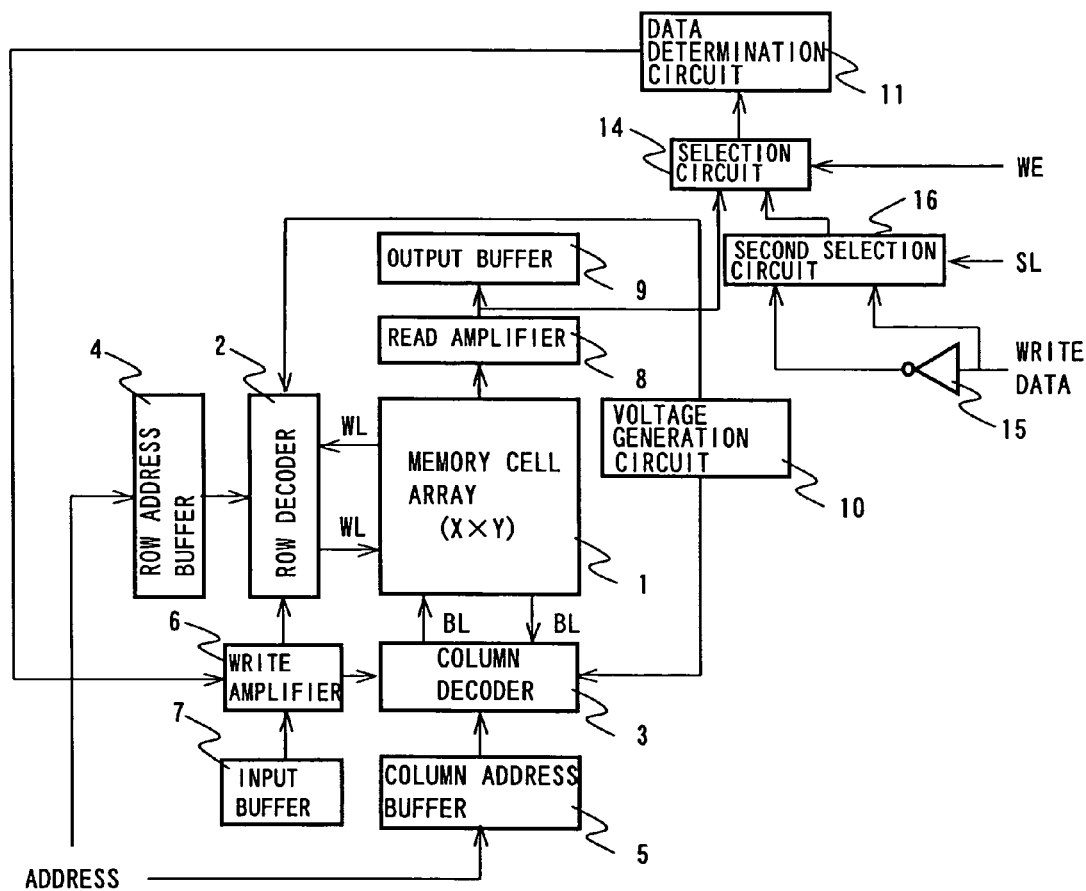
FIG. 36 is a block diagram showing the overall structure of a simple matrix ferroelectric memory according to a fifth modification of the first embodiment of the present invention.

FIG. 36 shows a simple matrix ferroelectric memory according to a fifth modification of the first embodiment performing no operations in periods T2 and T3 when performing a write operation in order of batch "0" write operation→compensatory operation→"1" write operation for writing data "1" in all selected cells, when performing the write operation in order of batch "1" write operation→compensatory operation→"0" write operation for writing data "1" in all selected cells and when performing a read operation by reading data "0" from all selected cells. Referring to FIG. 36, the ferroelectric memory according to the fifth modification of the first embodiment comprises an inverter circuit 15 inverting write data output from a memory control circuit (not shown) and a second selection circuit 16 selecting and outputting an output of the inverter circuit 15 or the write data in response to a selection signal SL generated by the memory control circuit (not shown) in addition to a circuit structure equivalent to that of the ferroelectric memory according to the third modification shown in FIG. 32. The memory control circuit (not shown) generates the selection signal SL of "0" when the ferroelectric memory performs the write operation in order of batch "0" write operation→compensatory operation→"1" write operation, while generating the selection signal SL of "1" when the ferroelectric memory performs the write operation in order of batch "1" write operation→compensatory operation→"1" write operation. The second selection circuit 16 outputs the write data as such when the selection signal SL is "0", while outputting data obtained by inverting the write data when the selection signal SL is "1". Assuming that a write enable signal WE is "1", therefore, a data determination circuit 11 outputs a flag signal "1" when the ferroelectric memory performs the write operation in order of batch "0" write operation→compensatory operation→"1" write operation for writing data "0" in all selected cells while also outputting the flag signal "1" when the ferroelectric memory performs the write operation in order of batch "1" write operation→compensatory operation→"o" write operation for writing data "1" in all selected cells. Thus, the ferroelectric memory according to the fifth modification of the first embodiment can control row and column decoders 2 and 3 to perform no operations of periods T2 and T3 when the flag signal is "1".

Second Embodiment

A simple matrix ferroelectric memory according to a second embodiment of the present invention is described with reference to a read amplifier 8a enabled to determine data while keeping a bit line BL substantially at 0 V in the overall structure of a cross-point ferroelectric memory similar to that according to the aforementioned first embodiment.

Figure 37:
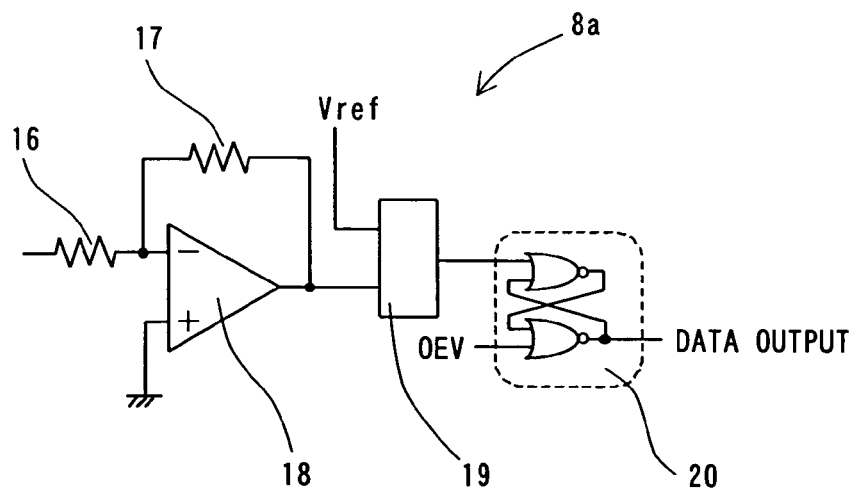
FIG. 37 illustrates an exemplary structure of a read amplifier in a simple matrix ferroelectric memory according to a second embodiment of the present invention.

FIG. 37 illustrates the circuit structure of the read amplifier 8a according to the second embodiment. Referring to FIG. 37, a first resistor 16 has first and second ends connected to the bit line BL and an inverted input of an operational amplifier 18 respectively. The read amplifier 8a is an example of the "read data determination circuit" in the present invention. A non-inverted input of the operational amplifier 18 is grounded to 0 V. Therefore, the inverted input reaches 0 V in an initial state due to imaginary short of the operational amplifier 18. An output of the operational amplifier 18 is fed back to the inverted input through a second resistor 17. Thus, the operational amplifier 18 controls the bit line BL to reach substantially 0 V. The ferroelectric memory according to the second embodiment constitutes an inverting amplifier having the bit line BL as an input. A comparator 19 compares the output of the operational amplifier 18 with a reference voltage Vref, and inputs the result of comparison in a latch circuit 20. A terminal OEV controlling whether a data output is valid or invalid is input in the latch circuit 20. When the terminal OEV is "1", the data output reaches "0" regardless of an output of the comparator 19, and is invalidated. When the terminal OEV is "0" to the contrary, the data output is validated. More specifically, the data output is held at "0" when the comparator 19 outputs "0", while the data output is converted to "1" when the output from the comparator 19 is changed to "1". Thereafter the data output remains at "1" regardless of the output of the comparator 19 until the terminal OEV reaches "1". In other words, the data output is converted from "0" to "1" following a temporary change of the output of the comparator 19 and held at "1" when the terminal OEV is "0".

A conventional read amplifier directly compares a potential caused on a bit line BL with a reference potential and determines whether read data is "0" or "1". More specifically, the conventional read amplifier generates an intermediate voltage between the voltage Vr0 caused on each bit line BL from which the data "0" is read and the voltage Vr1 caused on each bit line BL from which the data "1" is read described in the aforementioned first embodiment. The read amplifier assumes that the data "0" has been read when the voltage caused on the bit line BL is larger than the reference voltage, while assuming that the data "1" has been read when the former is smaller than the latter. In general, the voltages Vr0 and Vr1 are extremely close to each other. In order to correctly determine data, therefore, the read amplifier must correctly generate the reference voltage.

On the other hand, the read amplifier 8a according to the second embodiment compares the voltage obtained by amplifying the voltage caused on the bit line BL by the operational amplifier 18 with the reference voltage Vref for determining whether the read data is "0" or "1". Therefore, the read amplifier 8a may set the reference voltage Vref to an intermediate level between a voltage obtained by amplifying that caused on each bit line BL from which data "0" is read by the operational amplifier 18 and that caused on each bit line BL from which data "1" is read by the operational amplifier 18. In this case, the range of voltages to be set as the reference voltage Vref is so increased as compared with the prior art that the read amplifier 8a can more easily generate the reference voltage Vref as compared with the prior art.

The ferroelectric memory according to the second embodiment, requiring no operation of bringing all bit lines BL into floating states dissimilarly to the read-write operations in the aforementioned first embodiment, can operate at a high speed.

Figure 38:
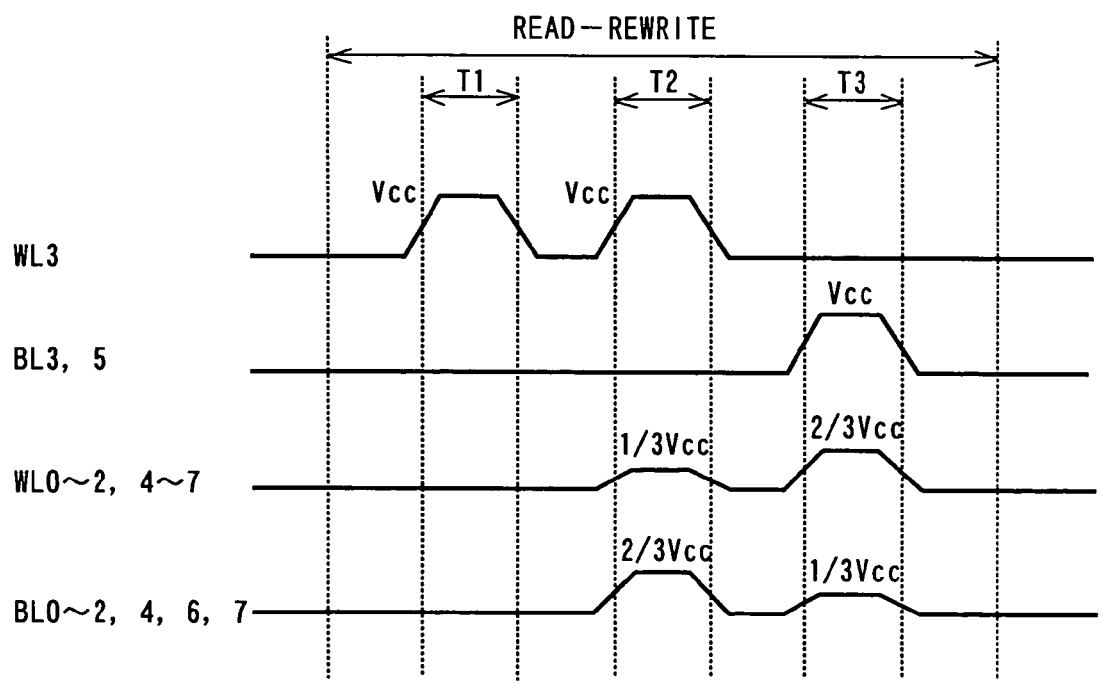
FIG. 38 is a voltage waveform diagram for illustrating read and rewrite operations of the simple matrix ferroelectric memory according to the second embodiment of the present invention.

Referring to FIG. 38, the ferroelectric memory according to the second embodiment performs read-rewrite operations in periods T1 to T3, with no requirement for a period t1 dissimilarly to the first embodiment. This is because the read amplifier 8a according to the second embodiment can determine data of each bit line BL without brining all bit lines BL into floating states as hereinabove described.

(Read Operation)

From a standby state, the ferroelectric memory sets a selected word line WL3 to a voltage Vcc in the period T1, as shown in FIG. 38. At this time, a memory cell array exhibits potential difference distribution similar to that of the first embodiment in the period T1 of the write operation shown in FIG. 25. In other words, the ferroelectric memory causes a potential difference Vcc in all memory cells of first and second cell regions connected to the selected word line WL3 while causing no potential difference in memory cells (non-selected cells) of third and fourth cell regions in the period T1. In this state, the read amplifier 8a shown in FIG. 37 detects voltage changes of all bit lines BL thereby determining data "0" or "1". In this case, all bit lines BL, controlled to 0 V by the operational amplifier 18, exhibit small voltage changes. The operational amplifier 18 amplifies the small voltage changes, and the read amplifier 8a thereafter compares the amplified voltage changes with the reference voltage Vref thereby determining the data. Thus, the ferroelectric memory can read the data while holding the bit lines BL substantially at 0 V.

Thereafter the ferroelectric memory sets the selected word line WL3 to 0 V for completing the read operation. According to this read operation, the ferroelectric memory writes data "0" in the memory cells of the first and second cell regions similarly to the first embodiment, thereby destroying the data "1" having been held in the memory cells of the second cell regions. The ferroelectric memory rewrites the data "1" in the memory cells of the second cell regions in the periods T2 and T3.

(Rewrite Operation)

Voltages applied to word lines WL and the bit lines BL and changes of the polarization states in the memory cells in the periods T2 and T3 are absolutely similar to those in the first embodiment.

As hereinabove described, the simple matrix ferroelectric memory according to the second embodiment requires no period t1, whereby the structure of a control circuit (a column decoder similar to the column decoder 3 shown in FIG. 1, for example) for controlling the bit lines BL is simplified. Further, the ferroelectric memory causes no potential differences such as those shown in the upper half of FIG. 6 in the memory cell array, whereby the number of memory cells deteriorated in polarization state can be further reduced.

The ferroelectric memory according to the second embodiment performs the write operation absolutely similarly to the first embodiment.

Third Embodiment

A simple matrix ferroelectric memory according to a third embodiment of the present invention is constituted to generate a reference voltage required for reading by reading data from dummy cells provided separately from memory cells for data storage.

Figure 39:
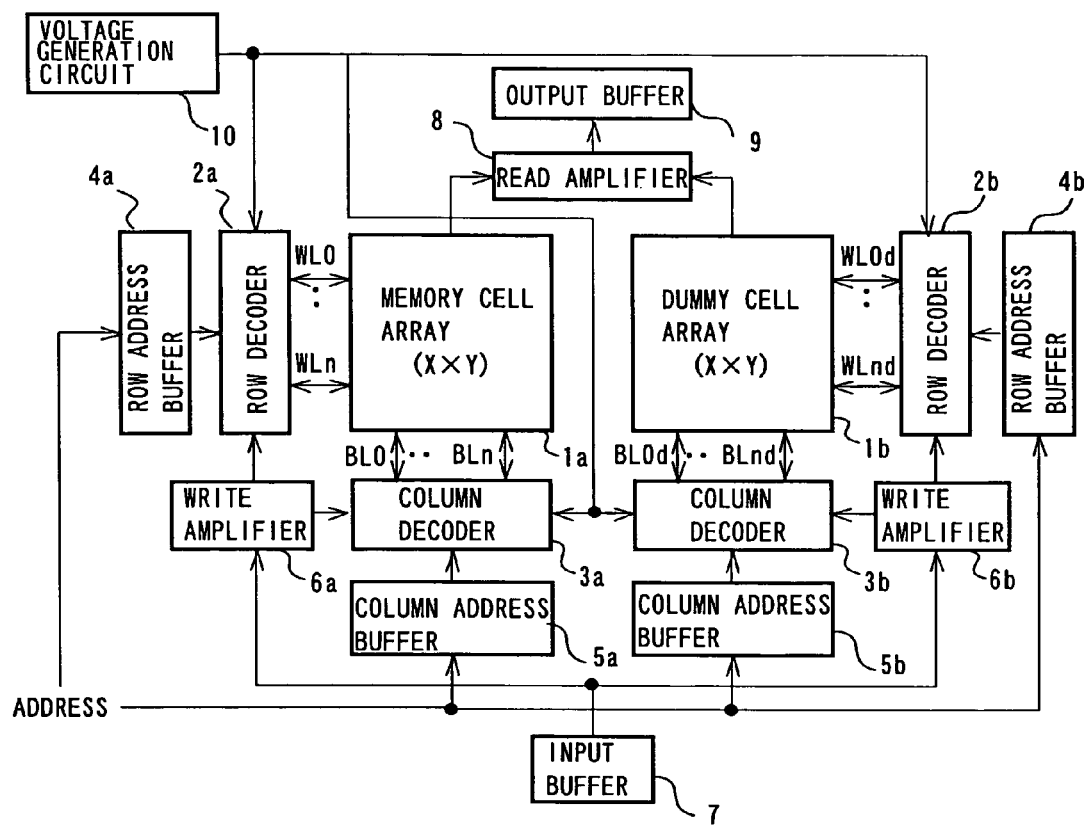
FIG. 39 is a block diagram showing the overall structure of a simple matrix ferroelectric memory according to a third embodiment of the present invention.

The overall structure of the simple matrix ferroelectric memory according to the third embodiment is described with reference to FIG. 39. The simple matrix ferroelectric memory according to the third embodiment comprises a memory cell array 1a, a dummy cell array 1b, row decoders 2a and 2b, column decoders 3a and 3b, row address buffers 4a and 4b, column address buffers 5a and 5b, write amplifiers 6a and 6b, an input buffer 7, a read amplifier 8 consisting of a voltage sense amplifier, an output buffer 9 and a voltage generation circuit 10. The voltage generation circuit 10 is constituted to be capable of applying voltages ⅓ Vcc and ⅔ Vcc (see FIG. 2). Referring to FIG. 39, each dummy memory cell (dummy cell) located on the intersection between each word line WLmd and each bit line BLnd corresponds to each memory cell located on the intersection between each word line WLm and each bit line BLn. According to the third embodiment, the memory cells and the dummy cells consist of only ferroelectric capacitors (not shown). In this case, the ferroelectric capacitors constituting the memory cells are examples of the "first storage means" in the present invention, and the ferroelectric capacitors constituting the dummy cells are examples of the "second storage means" in the present invention.

(1) Write Operation

A write operation is described with reference to a case where the ferroelectric memory selects a word line WL3 in the memory cell array 1a for writing data "1" in the memory cells connected to bit lines BL3 and BL5 among those connected to the selected word line WL3 while writing data "0" in the memory cells connected to the remaining bit lines BL0 to BL2, BL4, BL6 and BL7. At this time, the ferroelectric memory writes data of reversed polarity to those of the memory cells in the dummy cells. In other words, the ferroelectric memory writes the data "0" in the dummy cells connected to bit lines BL3d and BL5d among those connected to a selected word line WL3d while writing data "1" in the dummy cells connected to the remaining bit lines BL0d to BL2d, BL4d, BL6d and BL7d.

Figure 40:
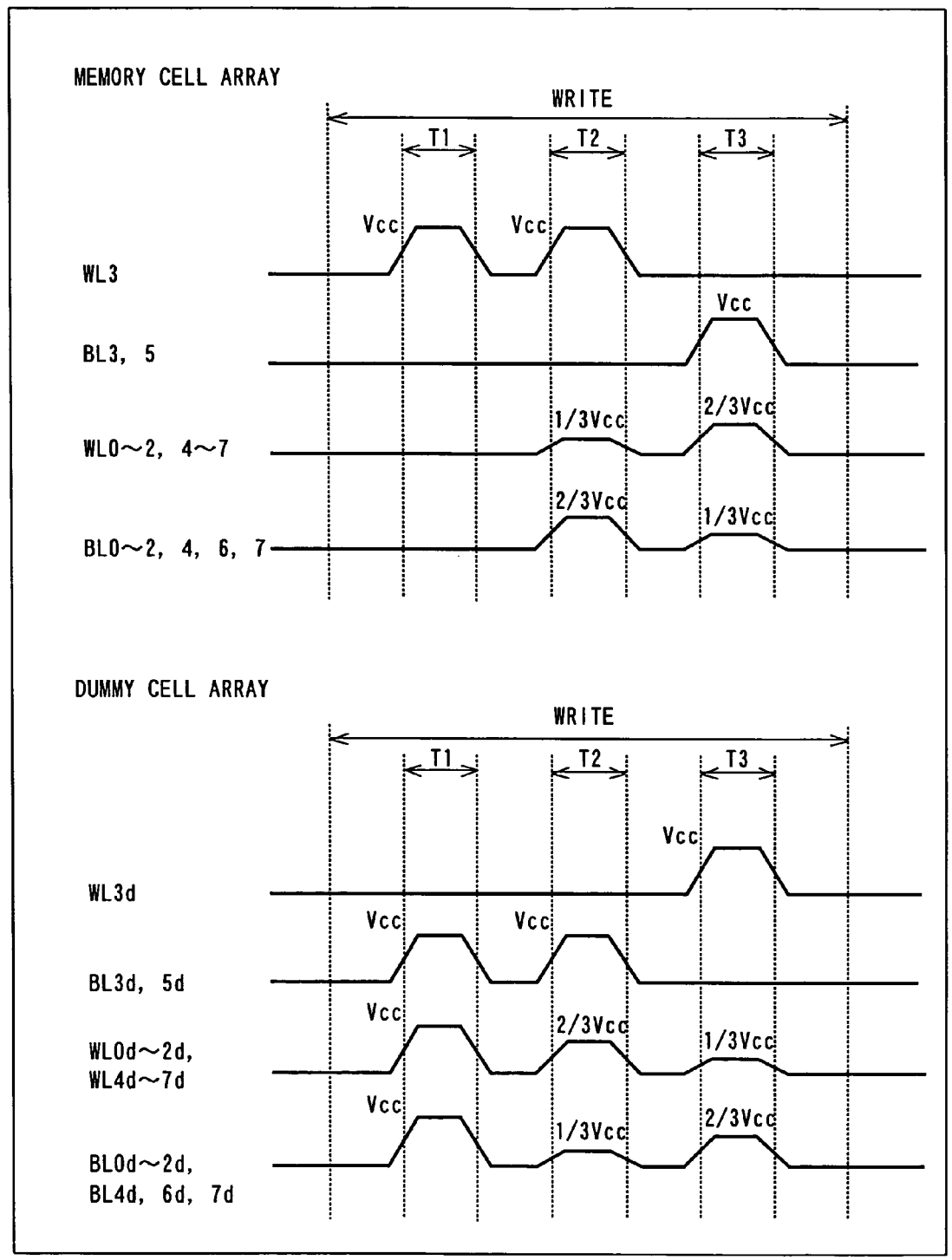
FIG. 40 is a voltage waveform diagram for illustrating a write operation of the simple matrix ferroelectric memory according to the third embodiment of the present invention.

FIG. 40 shows the waveforms of exemplary voltages applied when the ferroelectric memory writes the aforementioned data in the memory cells and the dummy cells. Referring to FIG. 40, the voltages applied to the memory cell array 1a are equivalent to those shown in FIG. 24, and the polarization states of the memory cells are not continuously deteriorated due to the write operation. Therefore, the ferroelectric memory can suppress disturbance in at least all non-selected memory cells connected to the word lines WL0 to WL2 and WL4 to WL7 other than the selected word line WL3 in the write operation. The voltages applied to the dummy cell array 1b are equivalent to those shown in FIG. 33, and the polarization states of the dummy cells are not continuously deteriorated due to the write operation. Therefore, the ferroelectric memory can also suppress disturbance at least in all non-selected dummy cells connected to word lines WL0d to WL2d and WL4d to WL7d other than the selected word line WL3d in the write operation. While the ferroelectric memory performs the write operation for the dummy cells in order of batch "1" write operation→compensatory operation→"0" write operation in the example shown in FIG. 40, a similar effect can be attained also when the ferroelectric memory performs the write operation in order of batch "0" write operation→compensatory operation→"1" write operation.

(2) Read-Rewrite Operation

Read-rewrite operations are described with reference to a case where the ferroelectric memory selects the word line WL3 and the memory cells connected to the bit lines BL3 and BL5 store the data "1" among those connected to the selected word line WL3 while the memory cells connected to the remaining bit lines BL0 to BL2, BL4, BL6 and BL7 store the data "0". At this time, the dummy cells corresponding to the memory cells store data of reversed polarity to those in the memory cells respectively, as hereinabove described. In other words, the dummy cells located on the intersections between the word line WL3d and the bit lines BL3d and BL5d store the data "0" and those located on the intersections between the word line WL3d and the remaining bit lines BL0d to BL2d, BL4d, BL6d and BL7d store the data "1" respectively.

Figure 41:
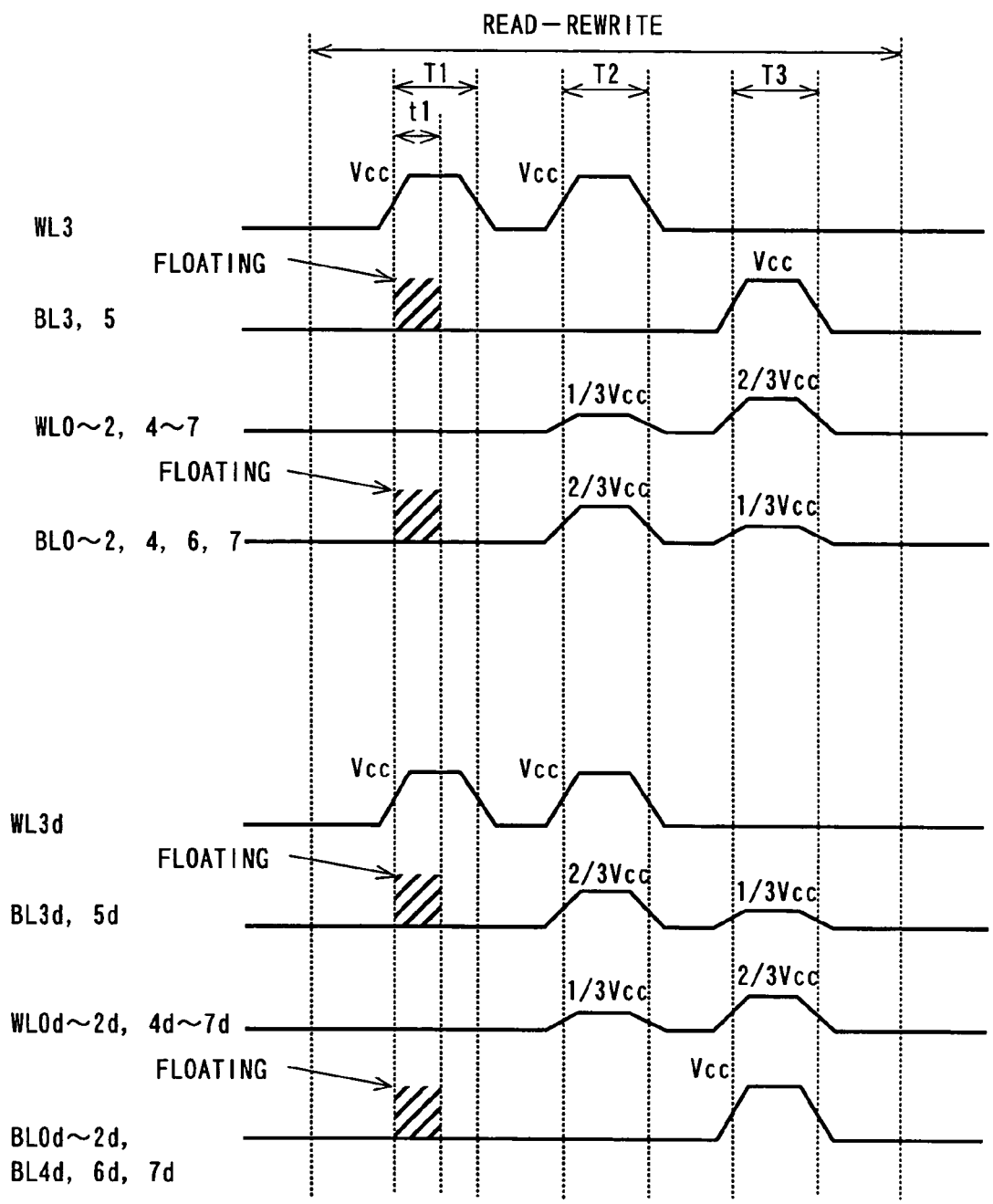
FIG. 41 is a voltage waveform diagram for illustrating read and rewrite operations of the simple matrix ferroelectric memory according to the third embodiment of the present invention.

Referring to FIG. 41, the ferroelectric memory brings all bit lines BL0 to BLn and BL0d to BLnd into floating states from a standby state while setting the selected word lines WL3 and WL3d to the voltage Vcc at the same timing. In this state, the ferroelectric memory compares the potentials of the bit lines BL0 to BLn of the memory cell array 1a with those of the bit lines BL0d to BLnd of the dummy cell array 1b and amplifies the differences therebetween with the read amplifier 8 formed by a voltage sense amplifier thereby determining the data. For example, the potentials of the bit lines BL3 and BL3d reach levels Vr1 and Vr0 (<Vr1) due to charges of the memory cells and the dummy cells storing the data "1" and "0" respectively, and hence the bit line BL3 exhibits a larger potential than the bit line BL3d. In this case, the ferroelectric memory regards that the memory cell located on the intersection between the bit lines BL3 and BL3d stores the data "1". If the potential of the bit line BL3 is smaller than that of the bit line BL3d to the contrary, the ferroelectric memory regards that the memory cell located on the intersection between the bit lines BL3 and BL3d stores the data "0".

Thereafter the ferroelectric memory sets all bit lines BL0 to BL7 and BL0d to BL7d to 0 V. At this time, the ferroelectric memory applies the voltage Vcc to all memory cells connected to the bit line BL3 in the memory cell array 1a and to all dummy cells connected to the bit line BL3d in the dummy cell array 1b for a period (T1—t1). Therefore, the ferroelectric memory writes the data "0" in these cells.

Then, the ferroelectric memory sets the word lines WL3 and WL3d to 0 V and returns to the standby state. The ferroelectric memory performs the rewrite operation in the memory cell array 1a and the dummy cell array 1b in periods T2 and T3 similarly to the first embodiment and attains similar effects.

Fourth Embodiment

A simple matrix ferroelectric memory according to a fourth embodiment of the present invention sets a prescribed voltage to half a write voltage in relation to read-rewrite operations and a write operation collectively performed on all memory cells connected to an arbitrary word line WL.

Figure 42:
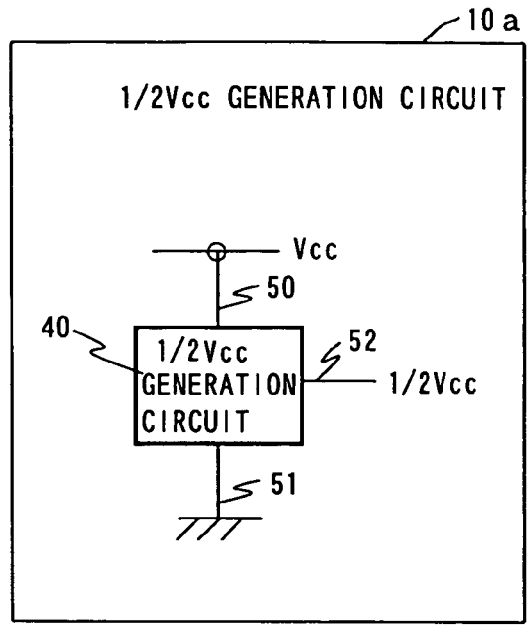
FIG. 42 is a circuit diagram showing the structure of a voltage generation circuit (½ Vcc generation circuit) employed in a simple matrix ferroelectric memory according to a fourth embodiment of the present invention.

As shown in FIG. 42, the simple matrix ferroelectric memory according to the fourth embodiment employs a voltage generation circuit 10a consisting of a ½ Vcc generation circuit in place of the voltage generation circuit 10 consisting of a ⅓ Vcc-⅔ Vcc generation circuit shown in FIG. 1. Referring to FIG. 42, the ferroelectric memory according to the fourth embodiment applies voltages Vcc and 0 V to first and second voltage input terminals 50 and 51 of the ½ Vcc generation circuit constituting the voltage generation circuit 10a. Thus, a voltage output terminal 52 of the ½ Vcc generation circuit generates an intermediate voltage ½ Vcc between the voltages 0 V and Vcc. The remaining overall structure of the ferroelectric memory according to the fourth embodiment is similar to that of the ferroelectric memory according to the first embodiment shown in FIG. 1.

The read-rewrite operations in the simple matrix ferroelectric memory according to the fourth embodiment are now described with reference to FIGS. 43 to 53. It is assumed that a word line WL3 is selected in the ferroelectric memory according to the fourth embodiment, similarly to that shown in FIG. 3. It is also assumed that memory cells connected to bit lines BL3 and BL5 store data "1" among those connected to the selected word line WL3 and memory cells connected to the remaining bit lines BL0 to BL2, BL4, BL6 and BL7 store data "0". Groups of the memory cells storing the data "0" and "1" respectively among those connected to the selected word line WL3 are referred to as first and second cell regions respectively, similarly to those shown in FIG. 4. Further, groups of memory cells connected to the bit lines BL3 and BL5 among those connected to non-selected word lines WL0 to WL2 and WL4 to WL7 are referred to as third cell regions, and those of memory cells connected to the bit lines BL0 to BL2, BL4, BL6 and BL7 other than the bit lines BL3 and BL5 among those connected to the non-selected word lines WL0 to WL2 and WL4 to WL7 are referred to as fourth cell regions. In other words, the memory cells of the first and second cell regions are selected cells, and those of the third and fourth cell regions are non-selected cells.

(1) Read-Rewrite Operation

Figure 43:
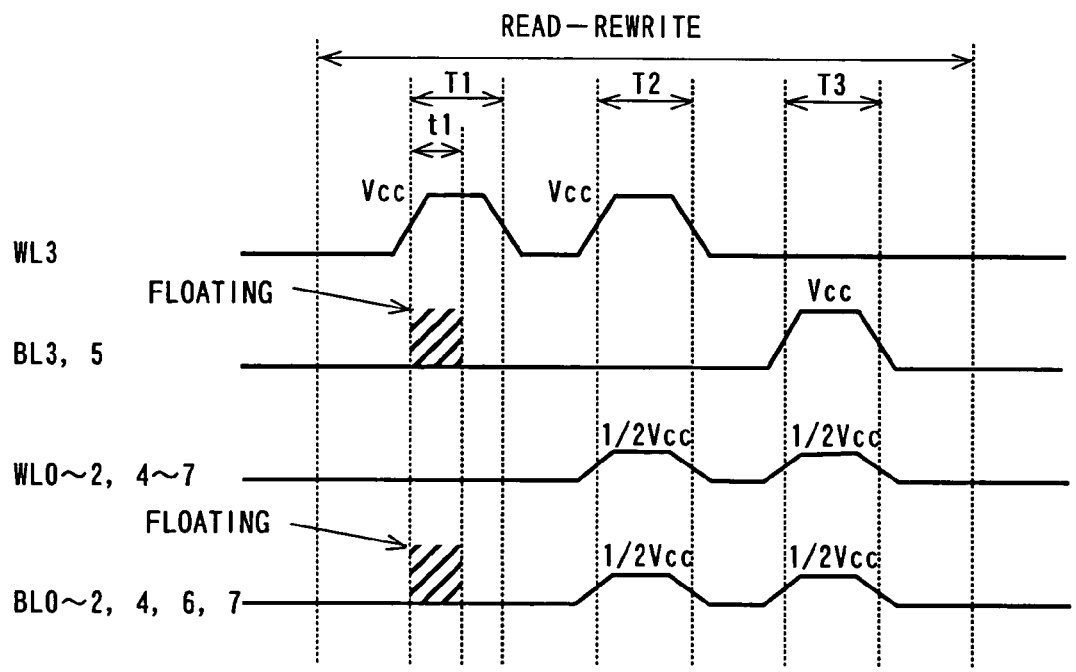
FIG. 43 is a voltage waveform diagram for illustrating read and rewrite operations of the simple matrix ferroelectric memory according to the fourth embodiment of the present invention.

As shown in FIG. 43, the ferroelectric memory performs the read-rewrite operations in periods T1, T2 and T3. The periods T2 and T3 are so decided as to equalize variations of polarization quantities caused in the memory cells supplied with electric fields of opposite directions in the periods T2 and T3 respectively with each other. In general, the periods T2 and T3 are identically for T seconds. The ferroelectric memory may perform the operations in the periods T1 to T3 continuously or independently of each other. The ferroelectric memory may start a period t1 for bringing all bit lines BL0 to BL7 into floating states simultaneously with application of the voltage Vcc to the selected word line WL3 or in advance thereof by several to several 10 nsec.

The operations in the periods T1 to T3 are now described. In the standby state, the ferroelectric memory sets the word lines WL0 to WL7 and the bit lines BL0 to BL7 to 0 V.

(Read Operation)

The ferroelectric memory reads data in the period T1 shown in FIG. 43. From the standby state, the ferroelectric memory brings all bit lines BL0 to BL7 into floating states and sets the selected word line WL3 to the voltage Vcc at the same timing or in a delay of several nsec. to several 10 nsec. In this state, the ferroelectric memory detects the voltages of all bit lines BL0 to BL7, thereby determining the data "0" or "1". The ferroelectric memory determines the data "0" or "1" by comparing the potentials of selected bit lines BL with a separately generated reference potential by a read amplifier similar to the read amplifier 8 (see FIG. 1) formed by a voltage sense amplifier. In this period t1, the following potential differences are caused in the memory cells of the first to fourth cell regions (see FIG. 4) similarly to those shown in the upper half of FIG. 6:

Referring to FIGS. 4 and 6, the ferroelectric memory applies the potential difference (Vcc–Vr0) between the voltage Vcc and a "0" data read potential Vr0 to the memory cells of the first cell regions for the period t1. The ferroelectric memory also applies the potential difference (Vcc–Vr1) between the voltage Vcc and a "1" data read potential Vr1 to the memory cells of the second cell regions for the period t1. The ferroelectric memory further applies a potential difference –Vr1 to the memory cells of the third cell regions for the period t1. The ferroelectric memory further applies a potential difference –Vr0 to the memory cells of the fourth cell regions for the period t1.

At this time, the ferroelectric memory can reduce the "1" and "0" data read potentials Vr1 and Vr0 beyond a coercive voltage by increasing the number of cells along the direction of the bit lines BL0 to BL7 and increasing the load capacitances of the overall bit lines BL0 to BL7. The term "coercive voltage" denotes the minimum voltage necessary for polarization-inverting the inner part of a ferroelectric film. Therefore, a polarization state is not inverted when a voltage smaller than the coercive voltage is applied to the ferroelectric film over a long time. Thus, the ferroelectric memory can reliably inhibit the memory cells of the third and fourth cell regions from deterioration of polarization states by setting the voltages Vr1 and Vr0 smaller than the coercive voltage.

As described with reference to the first embodiment, the period t1 can be sufficiently shortened. The ferroelectric memory can substantially neglect changes of the polarization states caused in the memory cells of the third and fourth regions in the period t1 by sufficiently shortening the period t1.

After a lapse of the period t1, the ferroelectric memory sets all bit lines BL0 to BL7 to 0 V. This period corresponds to the period T1 other than the period t1, and potential differences in the memory cells are distributed similarly to those shown in the lower half of FIG. 6. Referring to FIGS. 4 and 6, the ferroelectric memory applies the potential difference Vcc to the memory cells (selected cells) of the first and second cell regions for the period (T1−t1) while causing no potential differences in the memory cells (non-selected cells) of the third and fourth cell regions.

Figure 44:
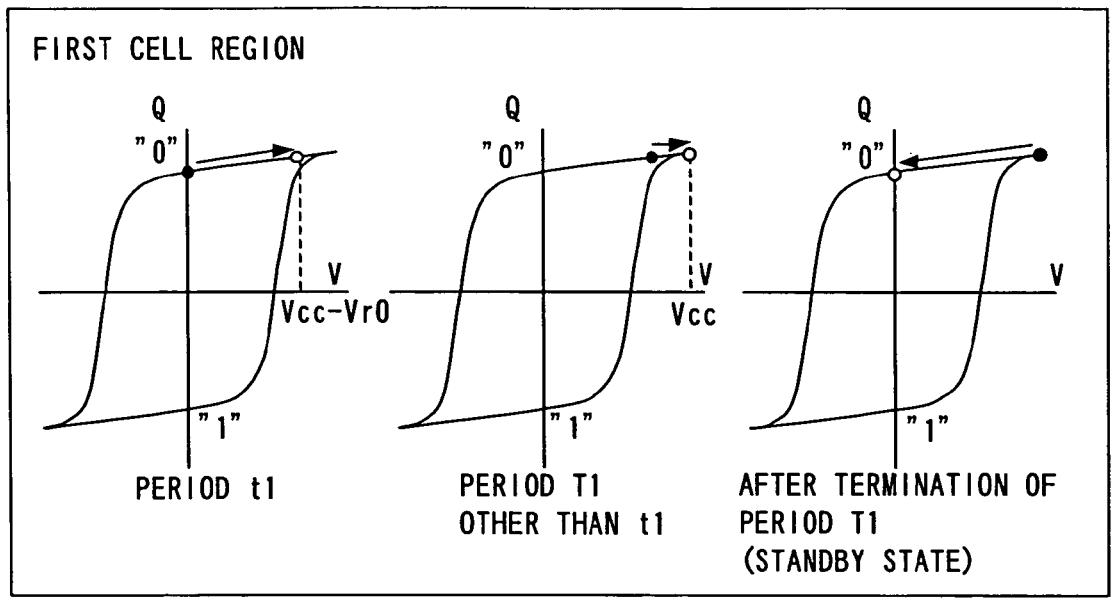
FIG. 44 illustrates polarization changes in each memory cell of each first cell region in the read and rewrite operations of the simple matrix ferroelectric memory according to the fourth embodiment of the present invention.
Figure 45:
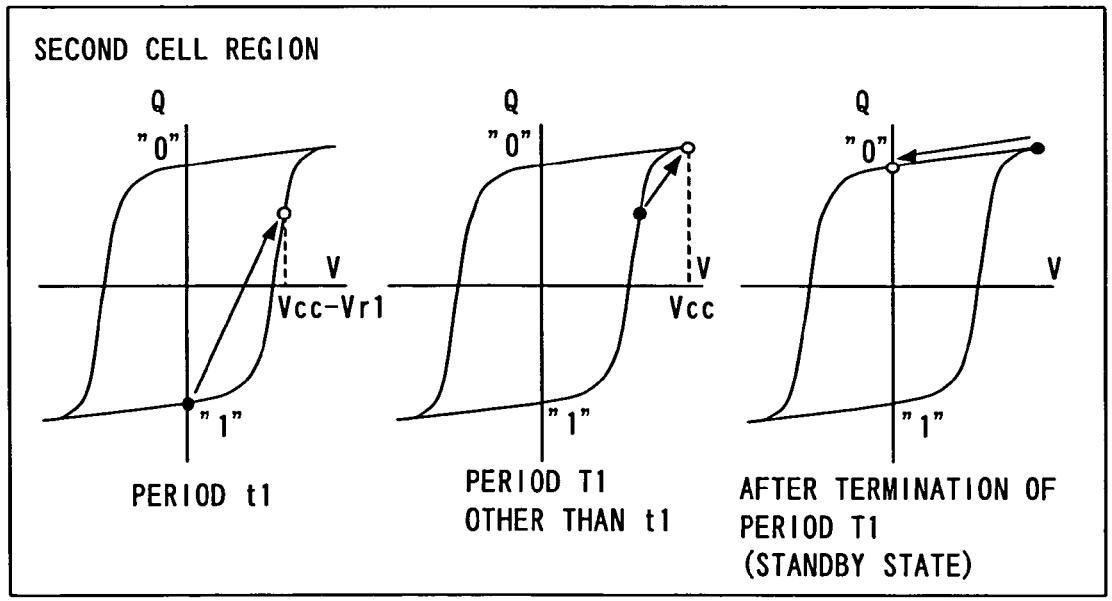
FIG. 45 illustrates polarization changes in each memory cell of each second cell region in the read and rewrite operations of the simple matrix ferroelectric memory according to the fourth embodiment of the present invention.
Figure 46:
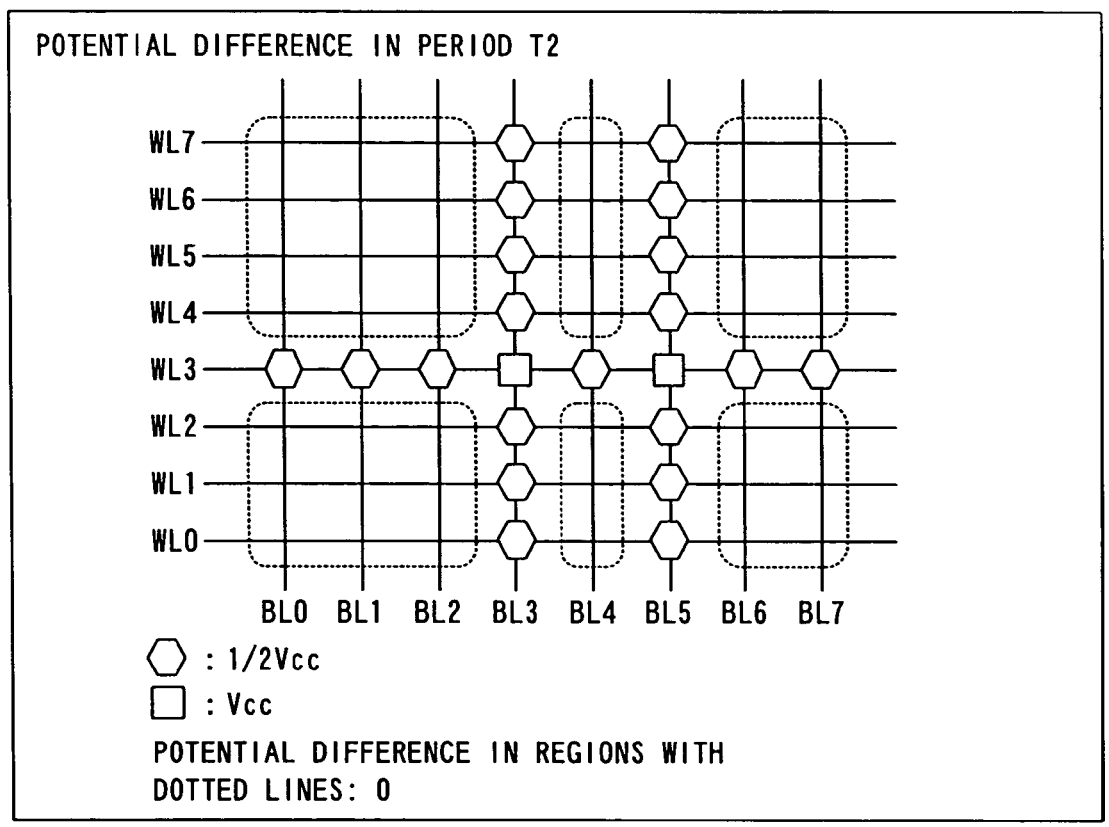
FIG. 46 illustrates potential differences caused in the memory cell array in the read and rewrite operations of the simple matrix ferroelectric memory according to the fourth embodiment of the present invention.

After a lapse of this period T1, the ferroelectric memory sets the selected word line WL3 to the voltage 0 V and returns to the standby state, thereby completing the read operation. FIGS. 44 and 45 show polarization changes of the memory cells (selected cells) of the first and second cell regions in the period T1 respectively. The data "0" stored in the memory cells of the first cell regions are not destroyed due to the read operation, as shown in FIG. 44. On the other hand, the data "1" stored in the memory cells of the second cell regions are destroyed and replaced with the data "0", as shown in FIG. 45. Therefore, the ferroelectric memory must rewrite the data "1" in the memory cells of the second cell regions. According to the fourth embodiment, the ferroelectric memory performs this rewrite operation in the periods T2 and T3.

(Rewrite Operation)

From the standby state, the ferroelectric memory sets the selected word line WL3, the non-selected word lines WL0 to WL2 and WL4 to WL7, the bit lines BL3 and BL5 connected with the memory cells from which the data "1" have been read in the read operation and the remaining bit lines BL0 to BL2, BL4, BL6 and BL7 to the voltages Vcc, ½ Vcc, 0 V and ½ Vcc respectively in the period T2 shown in FIG. 43. In this case, the ferroelectric memory applies potential differences shown in FIG. 46 to the memory cells of the first to fourth cell regions for T seconds forming the period T2. In other words, the ferroelectric memory applies the potential differences ½ Vcc and Vcc to the memory cells of the first and third cell regions and to those of the second cell regions respectively. The ferroelectric memory causes no potential difference in the memory cells of the fourth cell regions.

Figure 47:
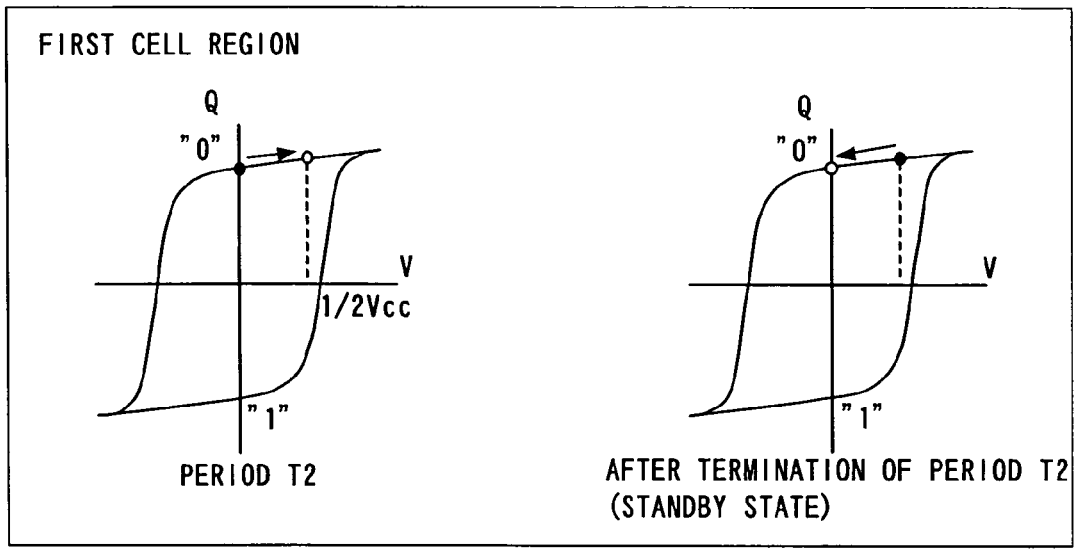
FIG. 47 illustrates polarization changes in each memory cell of each first cell region in the read and rewrite operations of the simple matrix ferroelectric memory according to the fourth embodiment of the present invention.
Figure 48:
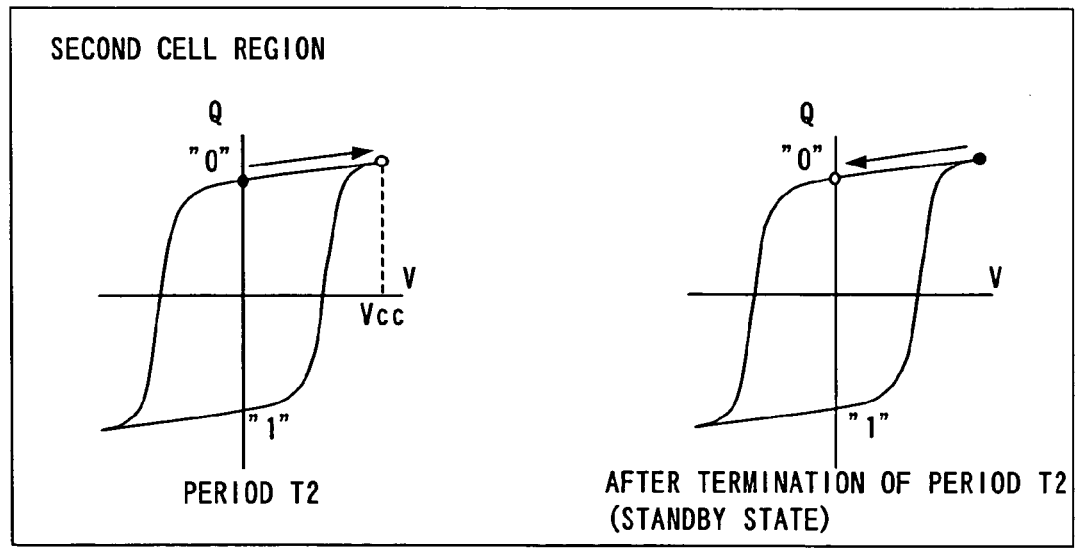
FIG. 48 illustrates polarization changes in each memory cell of each second cell region in the read and rewrite operations of the simple matrix ferroelectric memory according to the fourth embodiment of the present invention.
Figure 49:
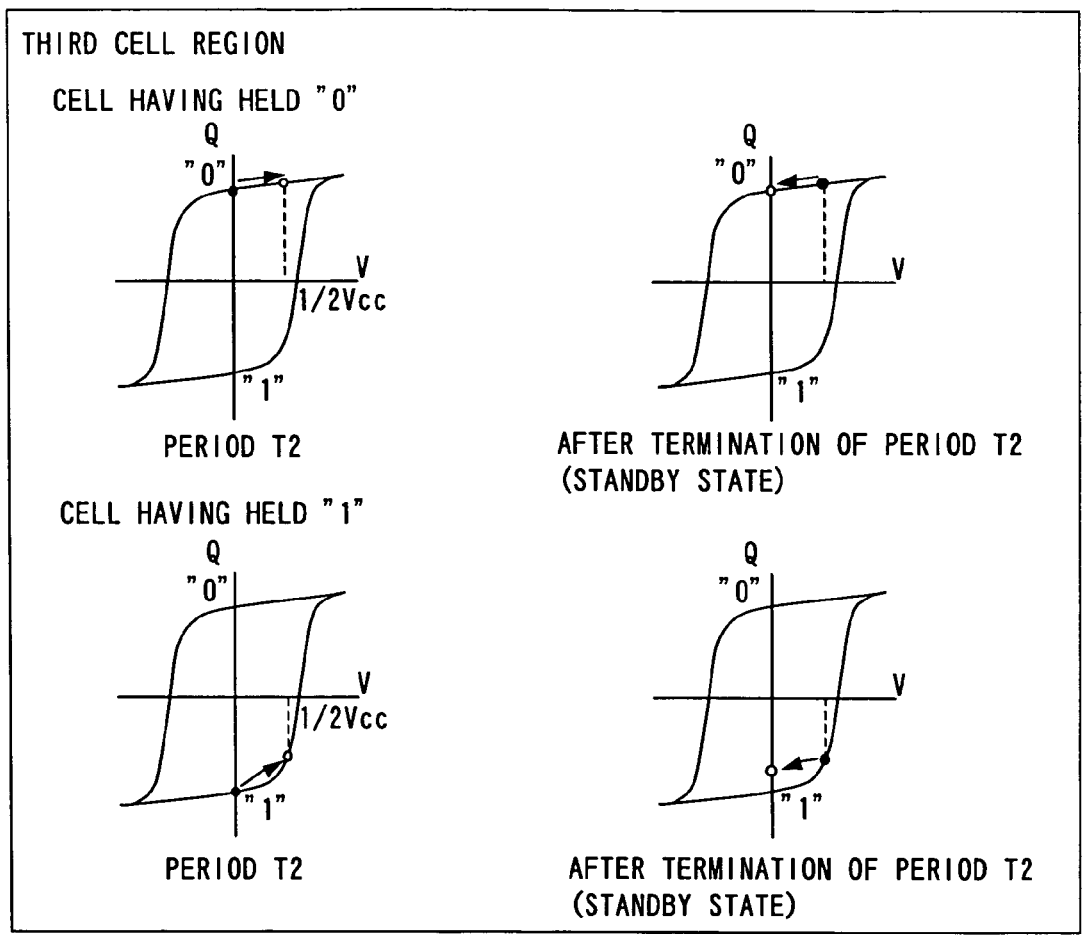
FIG. 49 illustrates polarization changes in each memory cell of each third cell region in the read and rewrite operations of the simple matrix ferroelectric memory according to the fourth embodiment of the present invention.
Figure 50:
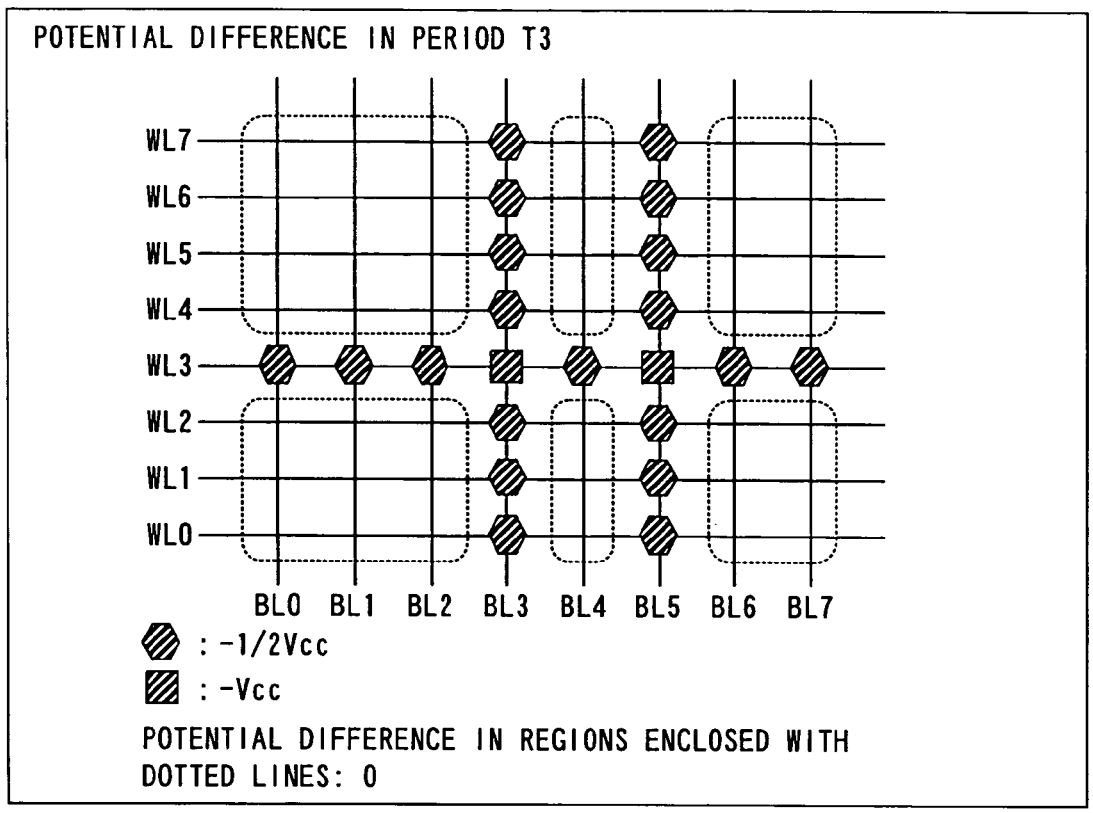
FIG. 50 illustrates potential differences caused in the memory cell array in the read and rewrite operations of the simple matrix ferroelectric memory according to the fourth embodiment of the present invention.

After a lapse of the period T2, the ferroelectric memory returns to the standby state again. FIGS. 47 to 49 show polarization changes of the memory cells of the first to fourth cell regions in the period T2 respectively. As shown in FIG. 47, the ferroelectric memory applies the potential difference ½ Vcc to the memory cells of the first cell regions for the period T2, thereby improving the polarization states thereof. As shown in FIG. 48, the ferroelectric memory applies the potential difference Vcc to the memory cells of the second cell regions written with the data "0" in the period T1 for the period T2, thereby rewriting the data "0" therein. The polarization states of the memory cells of the third cell regions are improved or deteriorated depending on the contents of the data stored therein. More specifically, the polarization states are improved when the memory cells of the third cell regions hold the data "0" while the same are deteriorated when the memory cells hold the data "1", as shown in FIG. 49. The polarization states of the memory cells of the fourth cell regions causing no potential difference remain unchanged.

From the standby state, the ferroelectric memory sets the selected word line WL3, the non-selected word lines WL0 to WL2 and WL4 to WL7, the bit lines BL3 and BL5 connected with the memory cells from which the data "1" have been read in the read operation and the remaining bit lines BL0 to BL2, BL4, BL6 and BL7 to the voltages 0 V, ½ Vcc, Vcc and ½ Vcc respectively in the period T3 shown in FIG. 43. In this case, the ferroelectric memory applies potential differences shown in FIG. 50 to the memory cells of the first to fourth cell regions respectively for T seconds forming the period T3. In other words, the ferroelectric memory applies the potential differences −½ Vcc and −Vcc to the memory cells of the first and third cell regions and to those of the second cell regions respectively. The ferroelectric memory causes no potential difference in the memory cells of the fourth cell regions.

Figure 54:
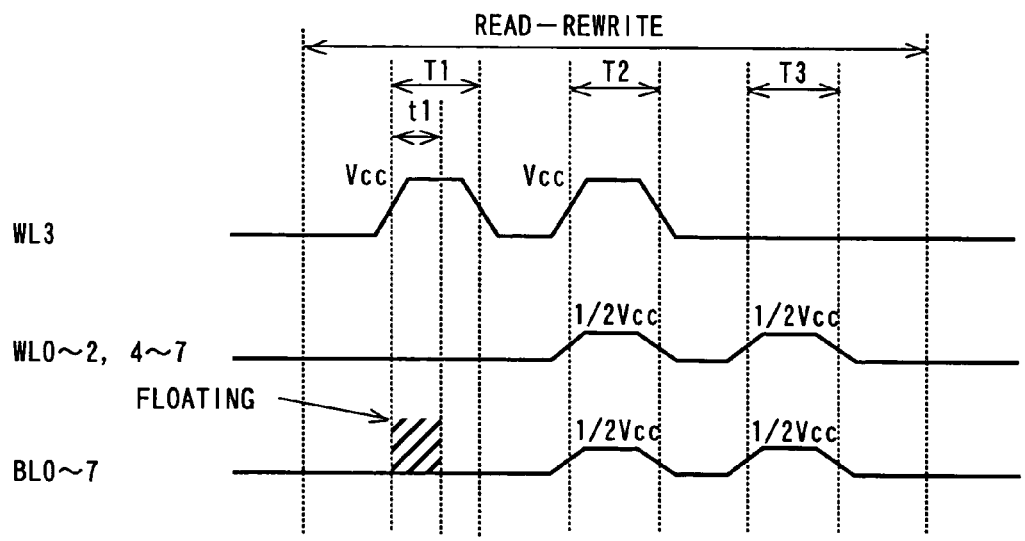
FIGS. 54 and 55 are other voltage waveform diagrams for illustrating the read and rewrite operations of the simple matrix ferroelectric memory according to the fourth embodiment of the present invention.
Figure 55:
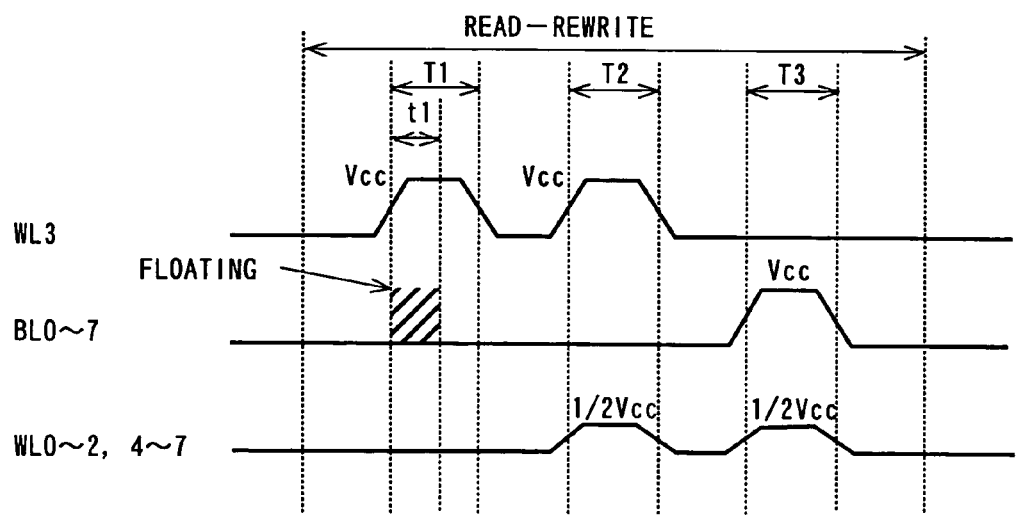

When reading the data "0" from all memory cells (memory cells of the first and second cell regions) connected to the selected word line WL3 in the read operation as a specific case in the aforementioned periods T2 and T3, the ferroelectric memory applies voltages shown in FIG. 54 to the word lines WL0 to WL7 and the bit lines BL0 to BL7. In other words, the ferroelectric memory sets the selected word line WL3, the non-selected word lines WL0 to WL2 and WL4 to WL7 and all bit lines BL0 to BL7 to the voltages Vcc, ½ Vcc and ½ Vcc respectively in the period T2. Further, the ferroelectric memory sets the selected word line WL3, the non-selected word lines WL0 to WL2 and WL4 to WL7 and all bit lines BL0 to BL7 to the voltages 0 V, ½ Vcc and ½ Vcc respectively in the period T3. When reading the data "1" from all memory cells (memory cells of the first and second cell regions) connected to the selected word line WL3 in the read operation as another specific case in the periods T2 and T3, the ferroelectric memory applies voltages shown in FIG. 55 to the word lines WL0 to WL7 and the bit lines BL0 to BL7 respectively. In other words, the ferroelectric memory sets the selected word line WL3, the non-selected word lines WL0 to WL2 and WL4 to WL7 and all bit lines BL0 to BL7 to the voltages Vcc, ½ Vcc and 0 V respectively in the period T2. Further, the ferroelectric memory sets the selected word line WL3, the non-selected word lines WL0 to WL2 and WL4 to WL7 and all bit lines BL0 to BL7 to the voltages 0 V, ½ Vcc and Vcc respectively in the period T3.

Figure 51:
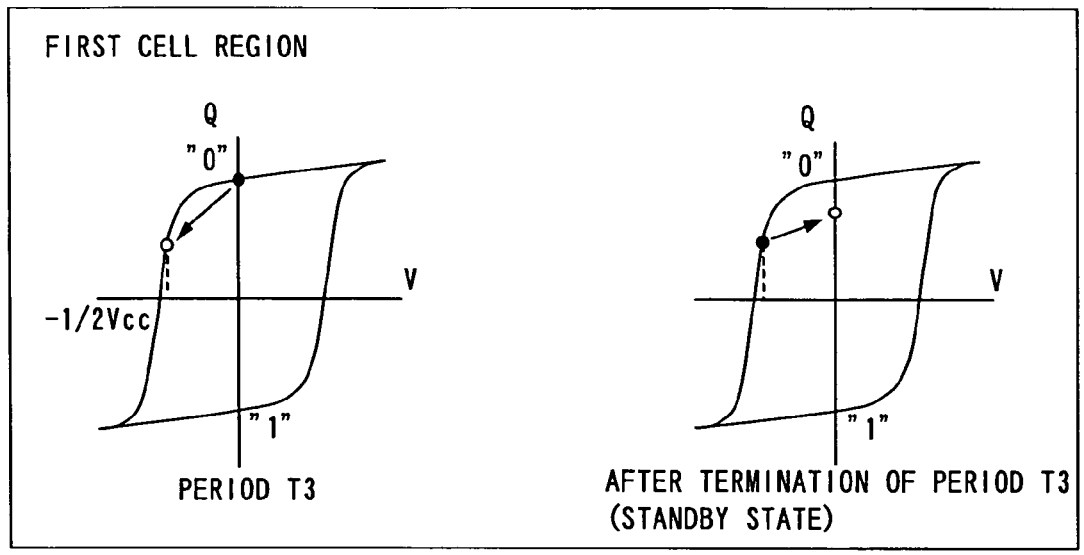
FIG. 51 illustrates polarization changes in each memory cell of each first cell region in the read and rewrite operations of the simple matrix ferroelectric memory according to the fourth embodiment of the present invention.
Figure 52:
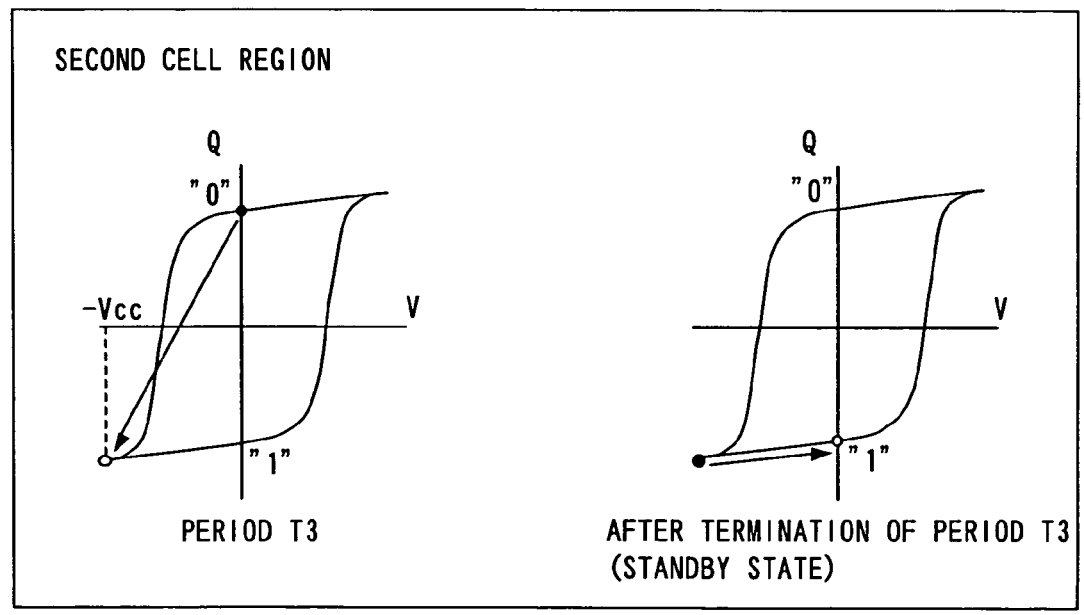
FIG. 52 illustrates polarization changes in each memory cell of each second cell region in the read and rewrite operations of the simple matrix ferroelectric memory according to the fourth embodiment of the present invention.
Figure 53:
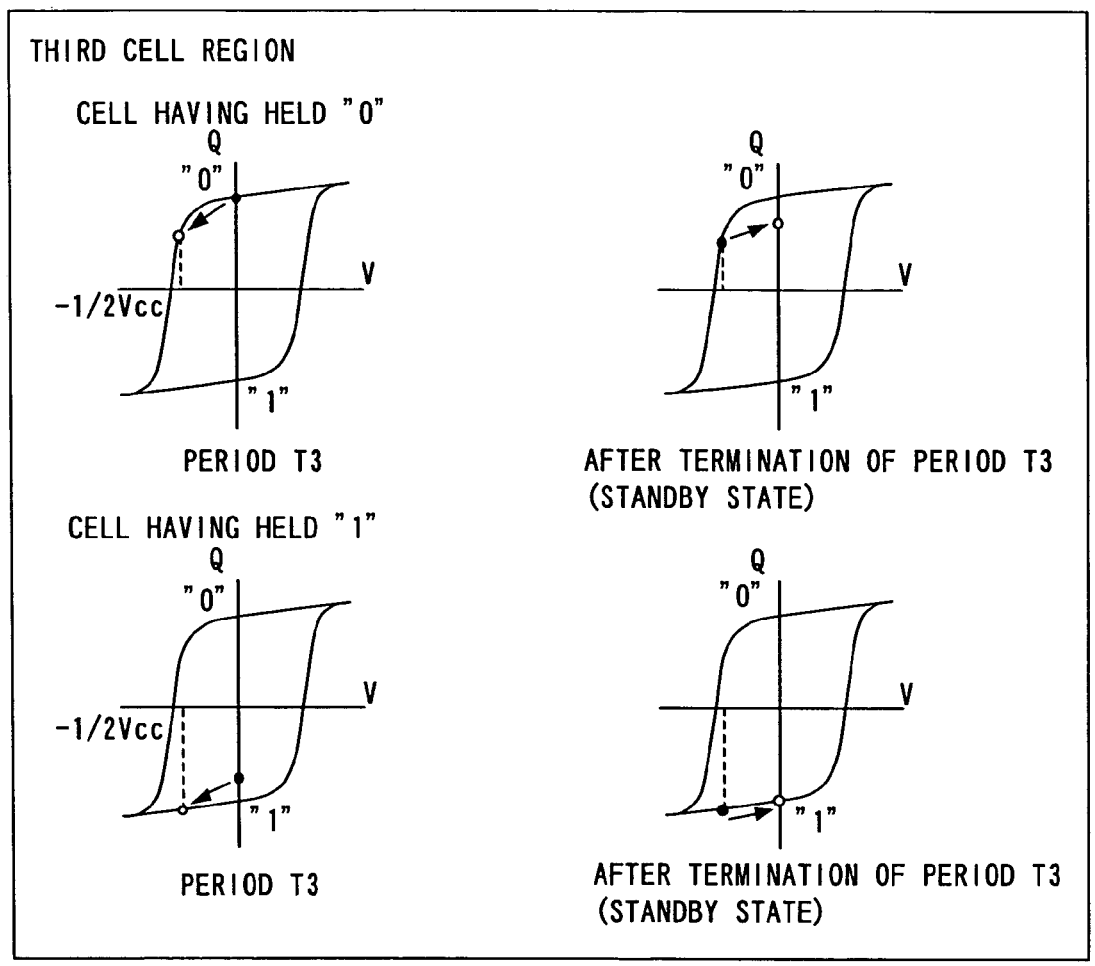
FIG. 53 illustrates polarization changes in each memory cell of each third cell region in the read and rewrite operations of the simple matrix ferroelectric memory according to the fourth embodiment of the present invention.

After a lapse of the period T3, the ferroelectric memory returns to the standby state again for completing the series of read-rewrite operations, as shown in FIG. 43. FIGS. 51 to 53 show polarization changes of the memory cells of the first to fourth cell regions in the period T3 respectively. As shown in FIG. 51, the ferroelectric memory applies the potential difference −½ Vcc to the memory cells of the first cell regions for the period T3, thereby deteriorating the polarization states thereof. As shown in FIG. 52, the ferroelectric memory applies the potential difference −Vcc to the memory cells of the second cell regions for the period T3, thereby writing the data "1" therein. Thus, the ferroelectric memory completely rewrites the data "1" destroyed by the read operation. The polarization states of the memory cells of the third cell regions are improved or deteriorated depending on the contents of the data stored therein, similarly to the period T2. More specifically, the polarization states are improved when the memory cells of the third cell regions hold the data "0" while the same are deteriorated when the memory cells hold the data "1", as shown in FIG. 53. The polarization states of the memory cells of the fourth cell regions causing no potential difference remain unchanged.

In other words, the polarization states are necessarily improved and deteriorated single times respectively in memory cells (memory cells of the first cell regions) having held the data "0" among those connected to the selected word line WL3 through the read-rewrite operations in the simple matrix ferroelectric memory according to the fourth embodiment. Further, the ferroelectric memory applies absolutely no voltage to memory cells (memory cells of the fourth cell regions) located on the intersections between the word lines WL0 to WL2 and WL4 to WL7 other than the selected word line WL3 and the bit lines BL0 to BL2, BL4, BL6 and BL7 other than the bit lines BL3 and BL5 from which the data "1" have been read due to the read operation. Thus, the ferroelectric memory includes no memory cell whose polarization state is continuously deteriorated due to repetition of the read-rewrite operations.

The ferroelectric memory according to the fourth embodiment, applying the reverse voltages ±½ Vcc to the memory cells of the first cell regions having held the data "0" among those connected to the selected word line WL3 and the memory cells of the third cell regions connected to the bit lines BL3 and BL5 connected with the memory cells from which the data "1" have been read in the read operation among those connected to the non-selected word lines WL0 to WL2 and WL4 to WL7 single times respectively through the read and rewrite operations as hereinabove described, can suppress polarization deterioration in the read operation. Further, the ferroelectric memory causes no potential difference in the memory cells of the fourth cell regions connected to the bit lines BL0 to BL2, BL4, BL6 and BL7 other than the bit lines BL3 and BL5 from which the data "1" have been read in the read operation among those connected to the non-selected word lines WL0 to WL2 and WL4 to WL7 through the read and write operations. Thus, the ferroelectric memory can inhibit all non-selected cells, i.e., the memory cells of the third and fourth cell regions and the memory cells of the first cell regions having held the data "0" among the selected cells from disturbance.

When the ferroelectric memory reads the data "0" from all memory cells (memory cells of the first and second cell regions) connected to the selected word line WL3 in the read operation as the specific case, the first and second cell regions include no memory cells whose data are destroyed due to this read operation. In other words, all data read through the read operation are identical to all data held in all memory cells (memory cells of the first and second cell regions) connected to the selected word line WL3 after the reading. Further, no non-selected cells (memory cells of the third and fourth cell regions) substantially cause deterioration of polarization states in this read operation. In this specific case, therefore, the ferroelectric memory may not perform the aforementioned operations in the periods T2 and T3 similarly to the first embodiment shown in FIG. 21.

Thus, the voltage generation circuit 10*a* consisting of the ½ Vcc generation circuit shown in FIG. 42 may substitute for the voltage generation circuit 10 consisting of the ⅓ Vcc-⅔ Vcc generation circuit constituting the circuit according to the first modification of the first embodiment shown in FIG. 23, in order to perform no rewrite operation (operations in the periods T2 and T3) when the simple matrix ferroelectric memory according to the fourth embodiment reads data "0" from all selected cells. At this time, the ferroelectric memory performs a circuit operation with no rewrite operation (operations of the periods T2 and T3) absolutely similarly to the circuit operation described with reference to the first modification of the first embodiment, to attain absolutely similar effects.

(2) Write Operation

The ferroelectric memory applies potential differences to the memory cells in distribution similar to that in the first embodiment shown in FIG. 25. The write operation in the fourth embodiment is described on the assumption that the ferroelectric memory selects the word line WL3 for writing the data "1" in the memory cells connected to the bit lines BL3 and BL5 among those connected to the selected word line WL3 while writing the data "0" in the memory cells connected to the remaining bit lines BL0 to BL2, BL4, BL6 and BL7, similarly to those shown in FIG. 3. Respective cell regions are defined similarly to those in the first embodiment (see FIG. 4).

Figure 56:
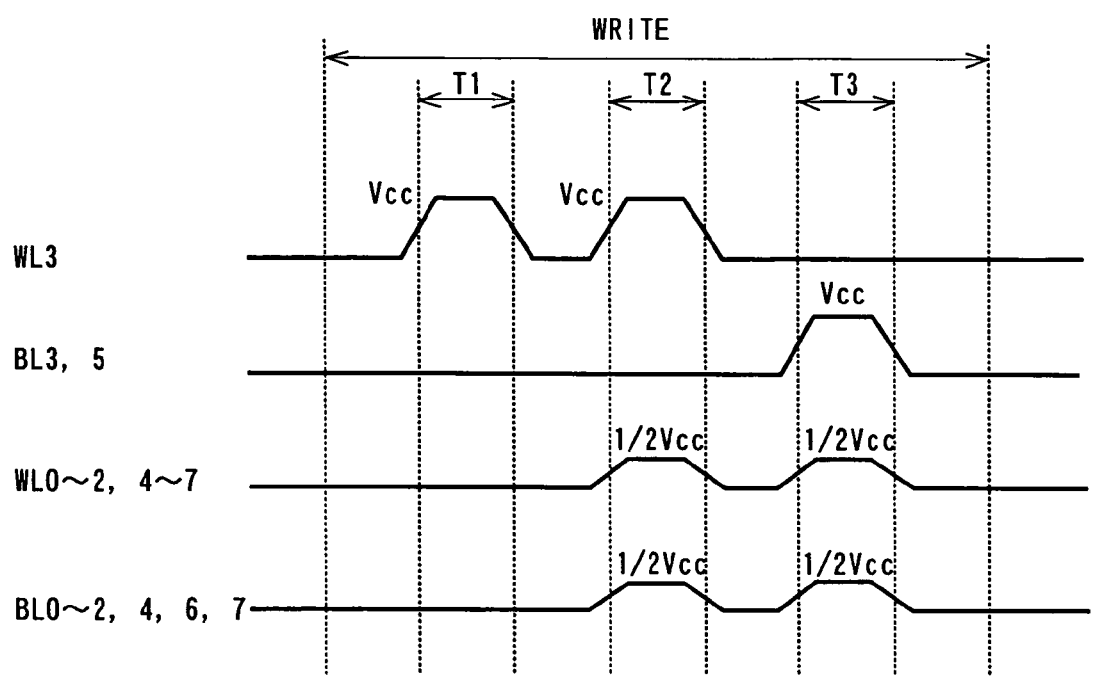
FIG. 56 illustrates potential differences caused in the memory cell array in a write operation of the simple matrix ferroelectric memory according to the fourth embodiment of the present invention.

The ferroelectric memory performs the write operation through a batch "0" write operation, a compensatory operation and a "1" write operation performed in periods T1, T2 and T3 shown in FIG. 56 respectively. The periods T2 and T3 are so decided as to equalize variations of polarization quantities caused in the memory cells supplied with electric fields of opposite directions in the respective periods T2 and T3 respectively with each other. In general, the periods T2 and T3 are identically for T seconds. The ferroelectric memory may perform the operations in the periods T1 to T3 continuously or independently of each other. The operations are now described.

(Batch "0" Write Operation)

In the period T1 shown in FIG. 56, the ferroelectric memory writes data "0" in all memory cells connected to the selected word line WL3. From a standby state, the ferroelectric memory first sets only the selected word line WL3 to the voltage Vcc. At this time, the potential differences are distributed in the memory cells similarly to those shown in FIG. 25. In other words, the ferroelectric memory applies the potential difference Vcc to the memory cells (selected cells) of the first and second cell regions for the period T1 while causing no potential difference in the memory cells (non-selected cells) of the third and fourth cell regions.

Figure 57:
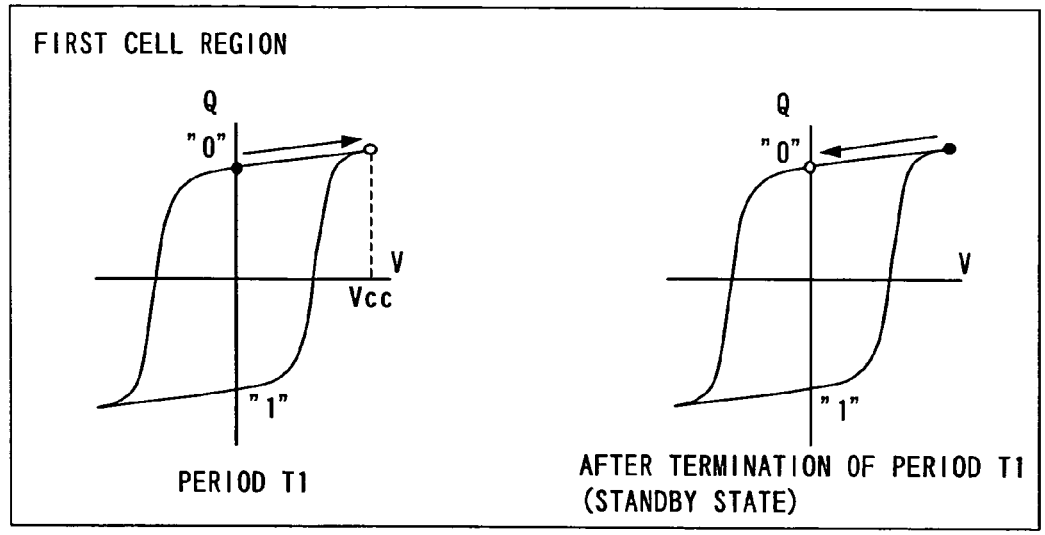
FIG. 57 illustrates polarization changes in each memory cell of each first cell region in the write operation of the simple matrix ferroelectric memory according to the fourth embodiment of the present invention.
Figure 58:
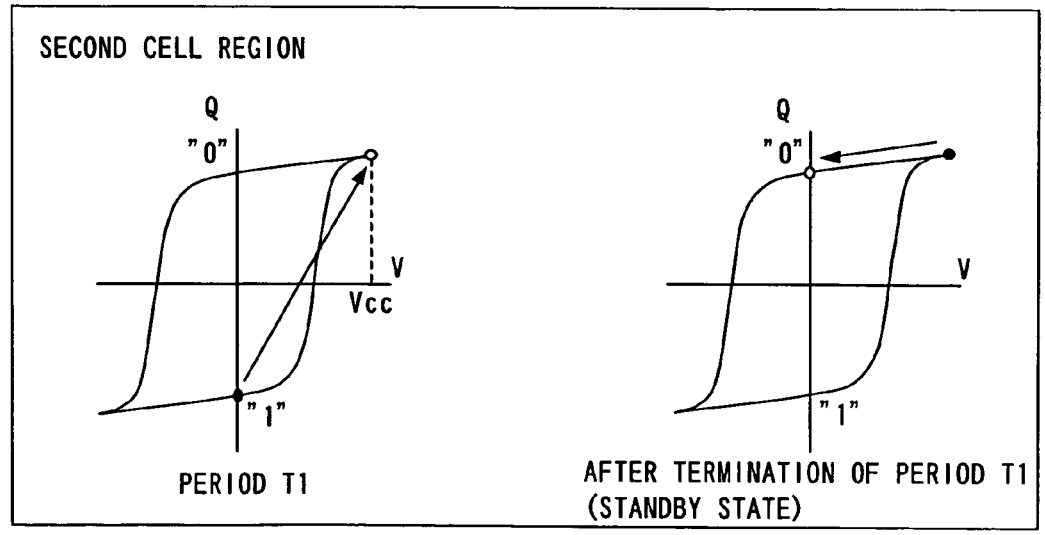
FIG. 58 illustrates polarization changes in each memory cell of each second cell region in the write operation of the simple matrix ferroelectric memory according to the fourth embodiment of the present invention.

After a lapse of the period T1, the ferroelectric memory sets the voltage of the selected word line WL3 to 0 V and returns to the standby state, thereby completing the batch "0" write operation. FIGS. 57 and 58 show changes of the polarization states of the memory cells of the first and second cell regions in the period T1 respectively. In other words, the ferroelectric memory writes the data "0" in both of the memory cells of the first and second cell regions having held the data "0" and "1" respectively. The polarization states of the memory cells of the third and fourth cell regions causing no potential difference remain unchanged.

(Compensatory Operation)

In the period T2 shown in FIG. 56, the ferroelectric memory performs an operation (compensatory operation) for previously improving polarization states on memory cells causing deterioration of polarization states due to the "1" write operation performed in the period T3 described later.

From the standby state, the ferroelectric memory sets the selected word line WL3, the non-selected word lines WL0 to WL2 and WL4 to WL7, the bit lines BL3 and BL5 connected with memory cells to be written with the data "1" and the remaining bit lines BL0 to BL2, BL4, BL6 and BL7 to the voltages Vcc, ½ Vcc, 0 V and ½ Vcc respectively in the period T2 shown in FIG. 56. In this case, the ferroelectric memory applies potential differences similar to those in the read-rewrite operations shown in FIG. 46 to the memory cells of the first to fourth regions. In other words, the ferroelectric memory applies the potential differences ½ Vcc and Vcc to the memory cells of the first and third cell regions and to those of the second cell regions respectively. The ferroelectric memory causes no potential difference in the memory cells of the fourth cell regions.

After a lapse of the period T2, the ferroelectric memory returns to the standby state again. In the period T2, the ferroelectric memory changes the polarization states of the memory cells of the first to fourth cell regions similarly to those in the read-rewrite operations as shown in FIGS. 47 to 49. In other words, the ferroelectric memory improves the polarization states of the memory cells of the first cell regions (see FIG. 47), and rewrites the data "0" in the memory cells of the second cell regions (see FIG. 48). The polarization states are improved when the memory cells of the third cell regions hold the data "0", while the same are deteriorated when the memory cells hold the data "1" (see FIG. 49). The polarization states of the memory cells of the fourth cell regions causing no potential difference remain unchanged.

("1" Write Operation)

From the standby state, the ferroelectric memory sets the selected word line WL3, the non-selected word lines WL0 to WL2 and WL4 to WL7, the bit lines BL3 and BL5 connected with the memory cells to be written with the data "1" and the remaining bit lines BL0 to BL2, BL4, BL6 and BL7 to the voltages 0 V, ½ Vcc, Vcc and ½ Vcc respectively in the period T3 shown in FIG. 56. In this case, the ferroelectric memory applies potential differences similar to those in the read-rewrite operations shown in FIG. 50 to the memory cells of the first to fourth cell regions respectively for T seconds forming the period T3. In other words, the ferroelectric memory applies the potential differences −½ Vcc and −Vcc to the memory cells of the first and third cell regions and to those of the second cell regions respectively. The ferroelectric memory also applies the potential difference 0 V to the memory cells of the fourth regions.

Figure 59:
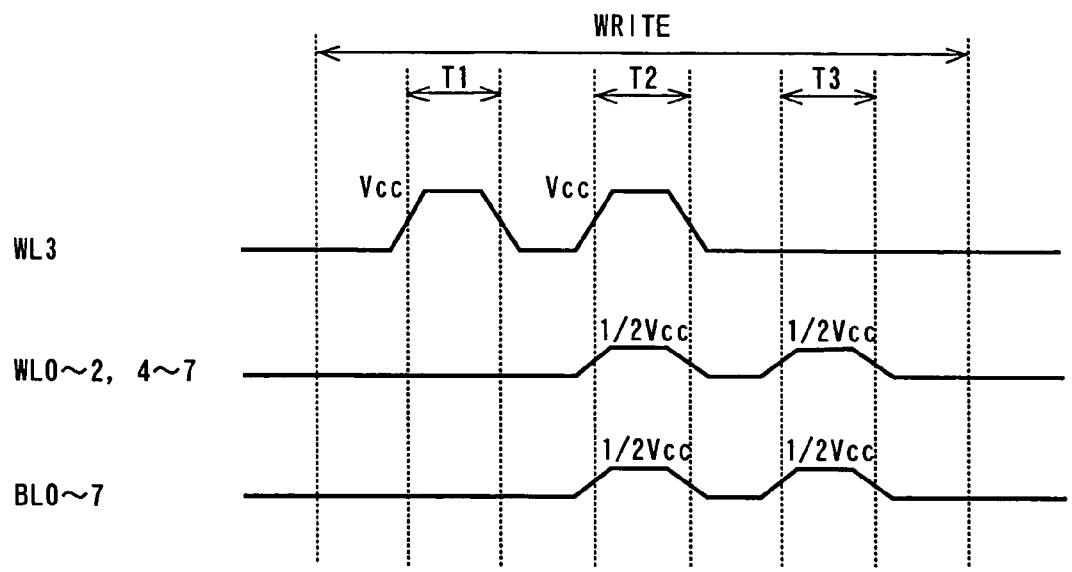
FIGS. 59 to 62 are other voltage waveform diagrams for illustrating the write operation of the simple matrix ferroelectric memory according to the fourth embodiment of the present invention.
Figure 60:
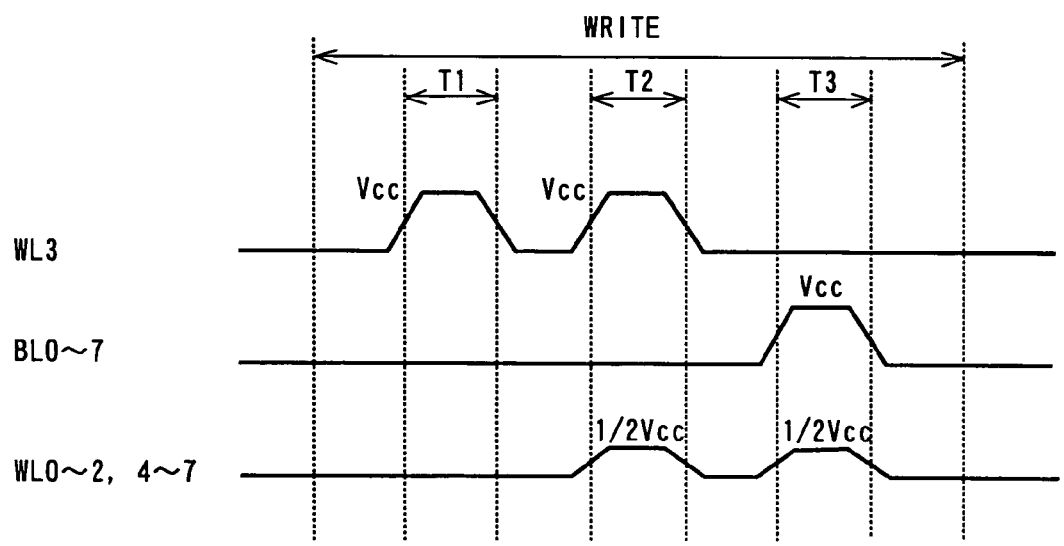

When writing the data "0" in all memory cells (memory cells of the first and second cell regions) connected to the selected word line WL3 as a specific case in the aforementioned period T2 and this period T3, the ferroelectric memory sets the selected word line WL3, the non-selected word lines WL0 to WL2 and WL4 to WL7 and all bit lines BL0 to BL7 to the voltages Vcc, ½ Vcc and ½ Vcc respectively in the period T2 while setting the selected word WL3, the non-selected word lines WL0 to WL2 and WL4 to WL7 and all bit lines BL0 to BL7 to the voltages 0 V, ½ Vcc and ½ Vcc respectively in the period T3, as shown in FIG. 59. When writing the data "1" in all memory cells (memory cells of the first and second cell regions) connected to the selected word line WL3 as another specific case in the periods T2 and T3, the ferroelectric memory sets the selected word line WL3, the non-selected word lines WL0 to WL2 and WL4 to WL7 and all bit lines BL0 to BL7 to the voltages Vcc, ½ Vcc and 0 V respectively in the period T2 while setting the selected WL3, the non-selected word lines WL0 to WL2 and WL4 to WL7 and all bit lines BL0 to BL7 to the voltages 0 V, ½ Vcc and Vcc respectively in the period T3, as shown in FIG. 60.

After a lapse of the period T3, the ferroelectric memory returns to the standby state again. In the period T3, the ferroelectric memory changes the polarization states of the memory cells of the first to fourth cell regions similarly to those in the read-rewrite operations as shown in FIGS. 51 to 53 respectively. In other words, the ferroelectric memory deteriorates the polarization states of the memory cells of the first cell regions (see FIG. 51), and writes the desired data "1" in the memory cells of the second cell regions (see FIG. 52). The polarization states are deteriorated when the memory cells of the third cell regions hold the data "0" while the same are improved when the memory cells hold the data "1" (see FIG. 53). The polarization states of the memory cells of the fourth cell regions causing no potential difference remain unchanged.

Table 2 shows situations of deterioration and improvement of the polarization states of the memory cells of the respective cell regions in the compensatory and "1" write operations respectively.

TABLE 2

|  | Period T1 | Period T2 | Period T3 |
|---|---|---|---|
| Memory Cell of First Cell Region | Writing"0" | ○ | X |
| Memory Cell of Second Cell Region | Writing"0" | Writing"0" | Writing"1" |
| Memory Cell of Third Cell Region | Holding"0" | — | ○ | X |
|  | Holding"1" | — | X | ○ |
| Memory Cell of Fourth Cell Region | Holding"0" | — | — | — |
|  | Holding"1" | — | — | — |

—: polarization state unchanged
○: polarization state improved
X: polarization state deteriorated As understood from Table 2, all of the memory cells deteriorated in polarization state after completion of the period T3, i.e., the memory cells of the first cell regions, those having held the data "0" in the third regions and those having held the data "1" in the fourth cell regions have been improved in polarization state in the compensatory operation. On the contrary, all of the memory cells improved in polarization state after completion of the period T3 have been deteriorated in polarization state in the compensatory operation.

Thus, the simple matrix ferroelectric memory according to the fourth embodiment, applying the reverse voltages ±½ Vcc to the memory cells of the first cell regions having held the data "0" among those connected to the selected word line WL3 and the memory cells of the third cell regions connected to the bit lines BL3 and BL5 connected with the memory cells from which the data "1" have been read in the read operation among those connected to the non-selected word lines WL0 to WL2 and WL4 to WL7 single times respectively through the write operation, can suppress polarization deterioration in writing. Further, the ferroelectric memory causes no potential difference in the memory cells of the fourth cell regions connected to the bit lines BL0 to BL2, BL4, BL6 and BL7 other than the bit lines BL3 and BL5 from which the data "1" have been read in the read operation among those connected to the non-selected word lines WL0 to WL2 and WL4 to WL7 through the write operation. Thus, the ferroelectric memory includes no memory cell whose polarization state is continuously deteriorated due to repetition of the write operation. Therefore, the ferroelectric memory can inhibit all non-selected cells, i.e., the memory cells of the third and fourth cell regions and the memory cells of the first cell regions having held the data "0" among the selected cells from disturbance.

In order to write data "0" in all memory cells (memory cells of the first and second cell regions) connected to the selected word line WL3 as a specific case, the ferroelectric memory writes the data "0" in the memory cells of the first and second cell regions by the batch "0" write operation in the period T1. No non-selected cells (memory cells of the third and fourth cell regions) cause deterioration of the polarization states in this batch "0" write operation. In this specific case, therefore, the ferroelectric memory may not perform the aforementioned operations in the periods T2 and T3 as shown in voltage waveforms of FIG. 61, in place of those shown in FIG. 59.

Figure 61:
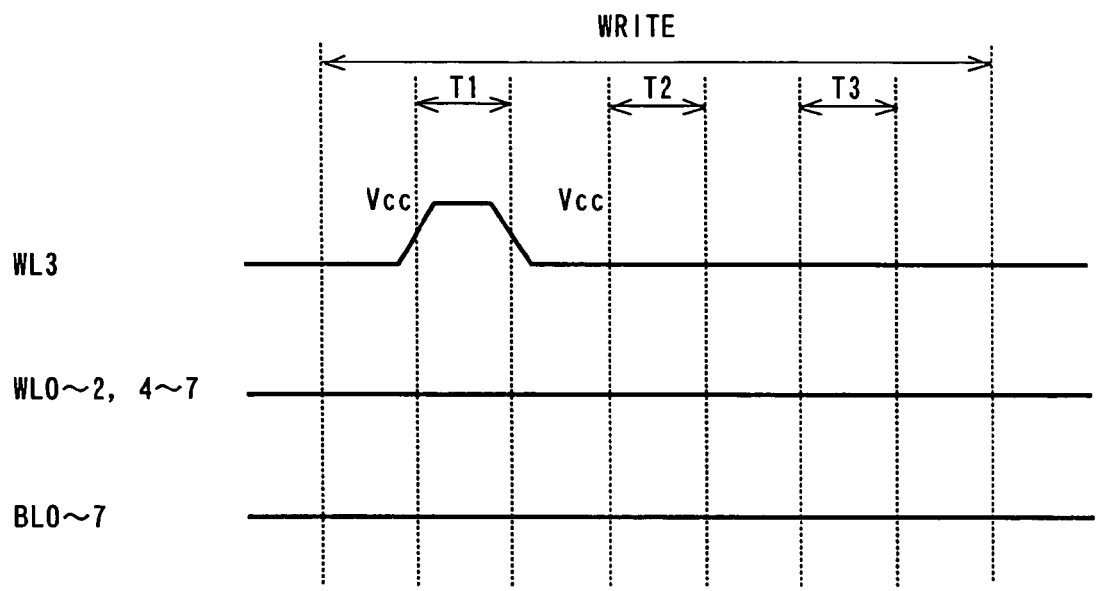

In order not to perform the compensatory operation in the period T2 and the "1" write operation in the period T3 when writing the data "0" in all selected cells in the simple matrix ferroelectric memory according to the fourth embodiment as shown in FIG. 61, the voltage generation circuit 10a consisting of the ½ Vcc generation circuit shown in FIG. 42 may substitute for the voltage generation circuit 10 consisting of the ⅓ Vcc·⅔ Vcc generation circuit constituting the circuit according to the second modification of the first embodiment shown in FIG. 31. In this case, the ferroelectric memory performs a circuit operation without performing the compensatory operation in the period T2 and the "1" write operation in the period T3 absolutely identically to the circuit operation described with reference to the second modification of the first embodiment, to attain absolutely identical effects.

In order not to perform the operations in the periods T2 and T3 when reading the data "0" from all selected cells and writing the data "0" in all selected cells in the simple matrix ferroelectric memory according to the fourth embodiment, the voltage generation circuit 10a consisting of the ½ Vcc generation circuit shown in FIG. 42 may substitute for the voltage generation circuit 10 consisting of the ⅓ Vcc·⅔ Vcc generation circuit constituting the circuit according to the third modification of the first embodiment shown in FIG. 32.

The ferroelectric memory includes no memory cell whose polarization state is continuously deteriorated regardless of the order of the read-rewrite operations and the write operation. Further, the ferroelectric memory includes no memory cell whose polarization state is continuously deteriorated regardless of the order of the read-rewrite operations and the write operation described with reference to the first embodiment and those described with reference to the fourth embodiment.

Figure 62:
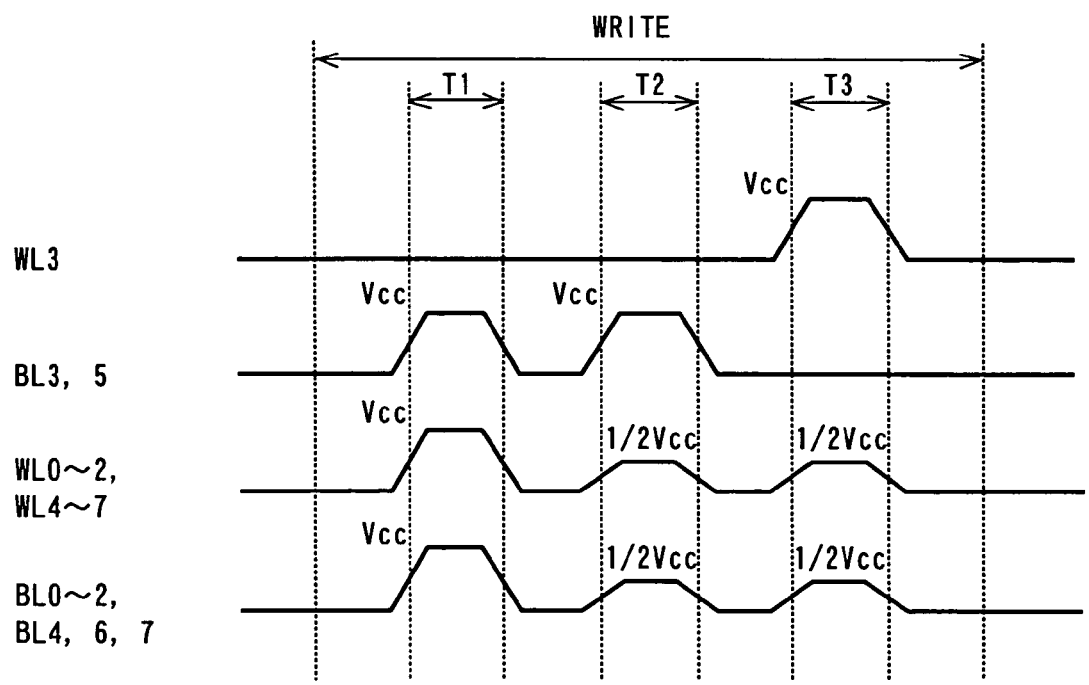

While the above description has been made on the assumption that the ferroelectric memory performs the write operation in order of batch "0" write operation→compensatory operation→"1" write operation, the ferroelectric memory can attain absolutely similar effects also when performing the write operation in order of batch "1" write operation→compensatory operation→"0" write operation. FIG. 62 shows waveforms of voltages applied in this case. Referring to FIG. 62, the ferroelectric memory selects the word line WL3. The ferroelectric memory writes data "0" in memory cells connected to the bit lines BL3 and BL5 among those connected to the selected word line WL3 while writing data "1" in memory cells connected to the remaining bit lines BL0 to BL2, BL4, BL6 and BL7.

When the ferroelectric memory writes data "1" in all selected cells as a specific example of the case of performing the write operation in order of batch "1" write operation→compensatory operation→"0" write operation, no non-selected cells (memory cells of the third and fourth cell regions) are deteriorated in polarization state due to the batch "1" write operation in the period T1. In this specific case, therefore, the ferroelectric memory may not perform the operations in the periods T2 and T3 as in voltage waveforms shown in FIG. 34, in place of those shown in FIG. 62.

In order to perform no compensatory and "0" write operations in the periods T2 and T3 when performing the write operation in order of batch "1" write operation→compensatory operation→"0" write operation, an inverter circuit 15 for inverting write data input in a data determination circuit 11 must be added as in the aforementioned first embodiment (see FIG. 35). In this case, the voltage generation circuit 10a consisting of the ½ Vcc generation circuit shown in FIG. 42 may substitute for the voltage generation circuit 10 consisting of the ⅓ Vcc·⅔ Vcc generation circuit in the circuit structure shown in FIG. 35.

A simple matrix ferroelectric memory performing no operations in periods T2 and T3 when performing a write operation in order of batch "0" write operation→compensatory operation→"1" write operation for writing data "1" in all selected cells, when performing the write operation in order of batch "1" write operation→compensatory operation→"0" write operation for writing data "1" in all selected cells and when performing a read operation by reading data "0" from all selected cells is implemented by replacing the voltage generation circuit 10 consisting of the ⅓ Vcc·⅔ Vcc generation circuit in the circuit structure according to the fifth modification of the first embodiment shown in FIG. 36 with the voltage generation circuit 10a consisting of the ½ Vcc generation circuit shown in FIG. 42. In this case, the ferroelectric memory performs a circuit operation absolutely identical to that described with reference to the fifth modification of the first embodiment.

Fifth Embodiment

A ferroelectric memory according to a fifth embodiment of the present invention is described with reference to a read amplifier 8a enabled to determine data while keeping a bit line BL substantially at 0 V in the overall structure of a cross-point ferroelectric memory similar to that according to the aforementioned fourth embodiment.

The read amplifier 8a is absolutely similar in circuit structure to the read amplifier 8a according to the second embodiment (see FIG. 37).

Figure 63:
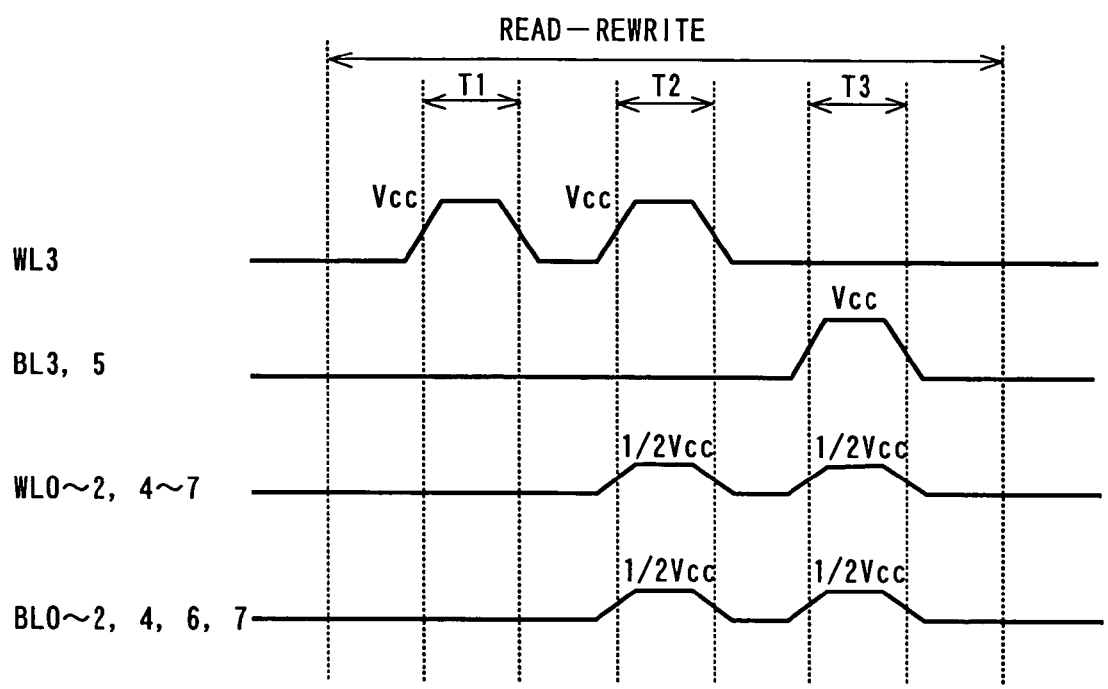
FIG. 63 is a voltage waveform diagram for illustrating read and rewrite operations of a simple matrix ferroelectric memory according to a fifth embodiment of the present invention.

Referring to FIG. 63, the ferroelectric memory according to the fifth embodiment performs read-rewrite operations in periods T1 to T3, with no requirement for a period t1 dissimilarly to the first embodiment. This is because the read amplifier 8a (see FIG. 37) according to the fifth embodiment can determine data of each bit line BL without brining all bit lines BL into floating states as hereinabove described.

(Read Operation)

From a standby state, the ferroelectric memory sets a selected word line WL3 to a voltage Vcc in the period T1, as shown in FIG. 63. At this time, a memory cell array exhibits potential difference distribution similar to that of the first embodiment in the period T1 of the write operation shown in FIG. 25. In other words, the ferroelectric memory causes a potential difference Vcc in all memory cells of first and second cell regions connected to the selected word line WL while causing no potential difference in memory cells of third and fourth cell regions. In this state, the read amplifier 8a detects voltage changes of all bit lines BL thereby determining data "0" or "1".

Thereafter the ferroelectric memory sets the selected word line WL3 to 0 V for completing the read operation. According to this read operation, the ferroelectric memory writes data "0" in the memory cells of the first and second cell regions similarly to the fourth embodiment, thereby destroying the data "1" having been held in the memory cells of the second cell regions. The ferroelectric memory rewrites the data "1" in the memory cells of the second cell regions in the periods T2 and T3.

(Rewrite Operation)

Voltages applied to word lines WL and the bit lines BL and changes of the polarization states of the memory cells in the periods T2 and T3 are absolutely similar to those in the fourth embodiment.

As hereinabove described, the simple matrix ferroelectric memory according to the fifth embodiment of the present invention requires no period t1, whereby the structure of a control circuit (a column decoder similar to the column decoder 3 shown in FIG. 1, for example) for controlling the bit lines BL is simplified. Further, the ferroelectric memory causes no potential differences such as those shown in the upper half of FIG. 6 in the memory cell array, whereby the number of memory cells deteriorated in polarization state can be further reduced.

The ferroelectric memory according to the fifth embodiment performs a write operation absolutely similarly to the ferroelectric memory according to the fourth embodiment.

Sixth Embodiment

A simple matrix ferroelectric memory according to a sixth embodiment of the present invention is constituted to generate a reference voltage required for reading by reading data from dummy cells provided separately from memory cells for data storage while setting a prescribed voltage to half a data write voltage.

The simple matrix ferroelectric memory according to the sixth embodiment employs a voltage generation circuit 10a consisting of a ½ Vcc generation circuit similar to that of the fourth embodiment shown in FIG. 42, in place of the voltage generation circuit 10 consisting of the ⅓ Vcc-⅔ Vcc generation circuit shown in FIG. 39.

(1) Write Operation

A write operation is described with reference to a case where the ferroelectric memory selects a word line WL3 in a memory cell array for writing data "1" in memory cells connected to bit lines BL3 and BL5 among those connected to the selected word line WL3 while writing data "0" in memory cells connected to the remaining bit lines BL0 to BL2, BL4, BL6 and BL7. At this time, the ferroelectric memory writes data of reversed polarity to those of the memory cells in the dummy cells. In other words, the ferroelectric memory writes the data "0" in the dummy cells connected to bit lines BL3d and BL5d among those connected to a selected word line WL3d while writing the data "1" in the dummy cells connected to the remaining bit lines BL0d to BL2d, BL4d, BL6d and BL7d.

Figure 64:
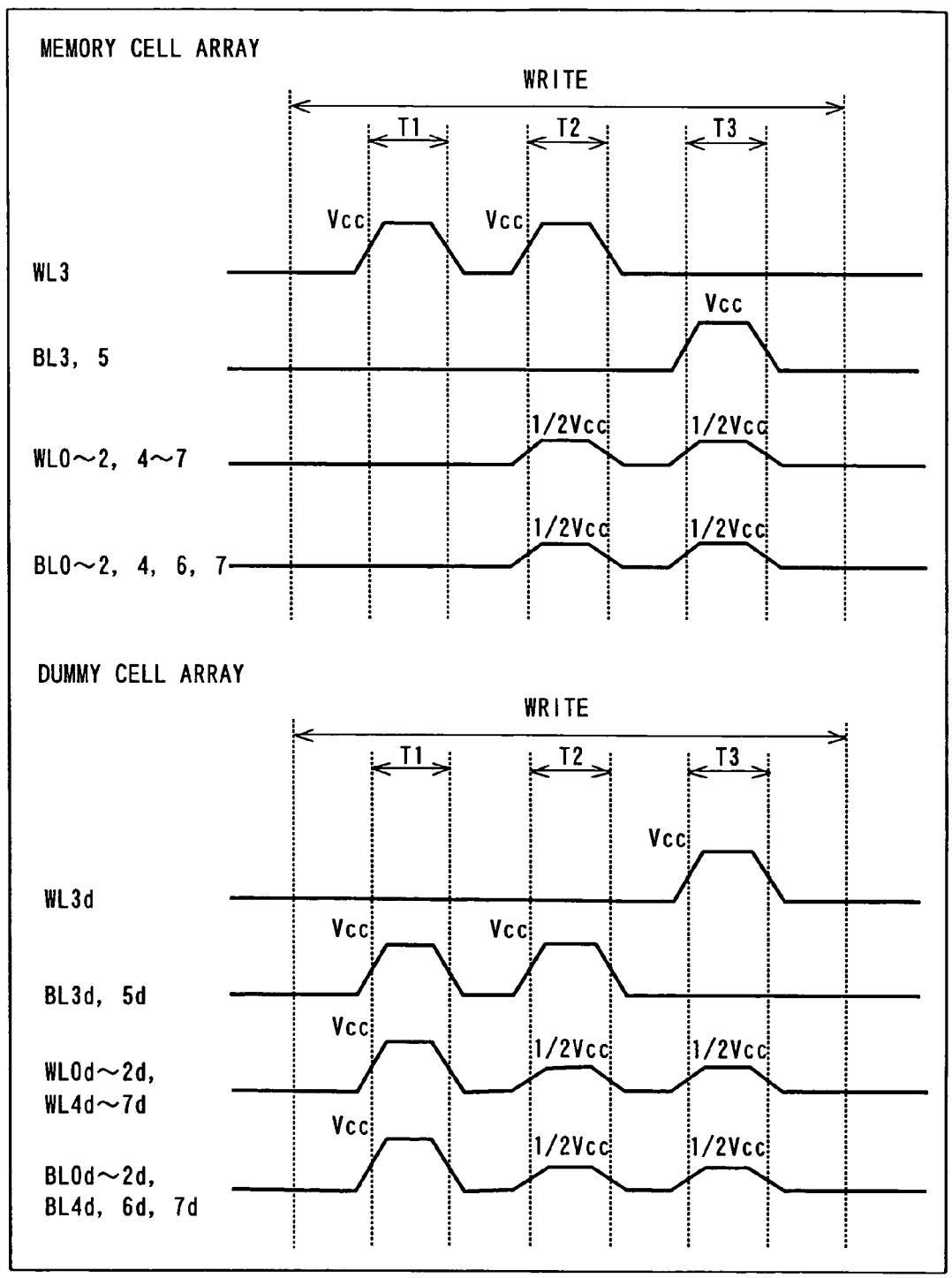
FIG. 64 is a voltage waveform diagram for illustrating read and rewrite operations of a simple matrix ferroelectric memory according to a sixth embodiment of the present invention.

Referring to FIG. 64, voltages applied to the memory cell array are equivalent to those shown in FIG. 56, and the polarization states of the memory cells are not continuously deteriorated due to the write operation. Therefore, the ferroelectric memory can suppress disturbance in at least all non-selected memory cells connected to the word lines WL0 to WL2 and WL4 to WL7 other than the selected word line WL3. Further, voltages applied to a dummy cell array are equivalent to those shown in FIG. 62, and the polarization states of the dummy cells are not continuously deteriorated due to the write operation. Therefore, the ferroelectric memory can also suppress disturbance at least in all non-selected dummy cells connected to word lines WL0d to WL2d and WL4d to WL7d other than the selected word line WL3d.

While the ferroelectric memory performs the write operation for the dummy cells in order of batch "1" write operation→compensatory operation→"0" write operation in the example shown in FIG. 64, a similar effect can be attained also when the ferroelectric memory performs the write operation in order of batch "0" write operation→compensatory operation→"1" write operation.

(2) Read-Rewrite Operation

Read-rewrite operations are described with reference to a case where the ferroelectric memory selects the word line WL3 and the memory cells connected to the bit lines BL3 and BL5 store the data "1" among those connected to the selected word line WL3 while the memory cells connected to the remaining bit lines BL0 to BL2, BL4, BL6 and BL7 store the data "0". At this time, the dummy cells corresponding to the memory cells store data of reversed polarity to those in the memory cells respectively, as hereinabove described. In other words, the dummy cells located on the intersections between the word line WL3d and the bit lines BL3d and BL5d store the data "0" and those located on the intersections between the word line WL3d and the remaining bit lines BL0d to BL2d, BL4d, BL6d and BL7d store the data "1" respectively.

Figure 65:
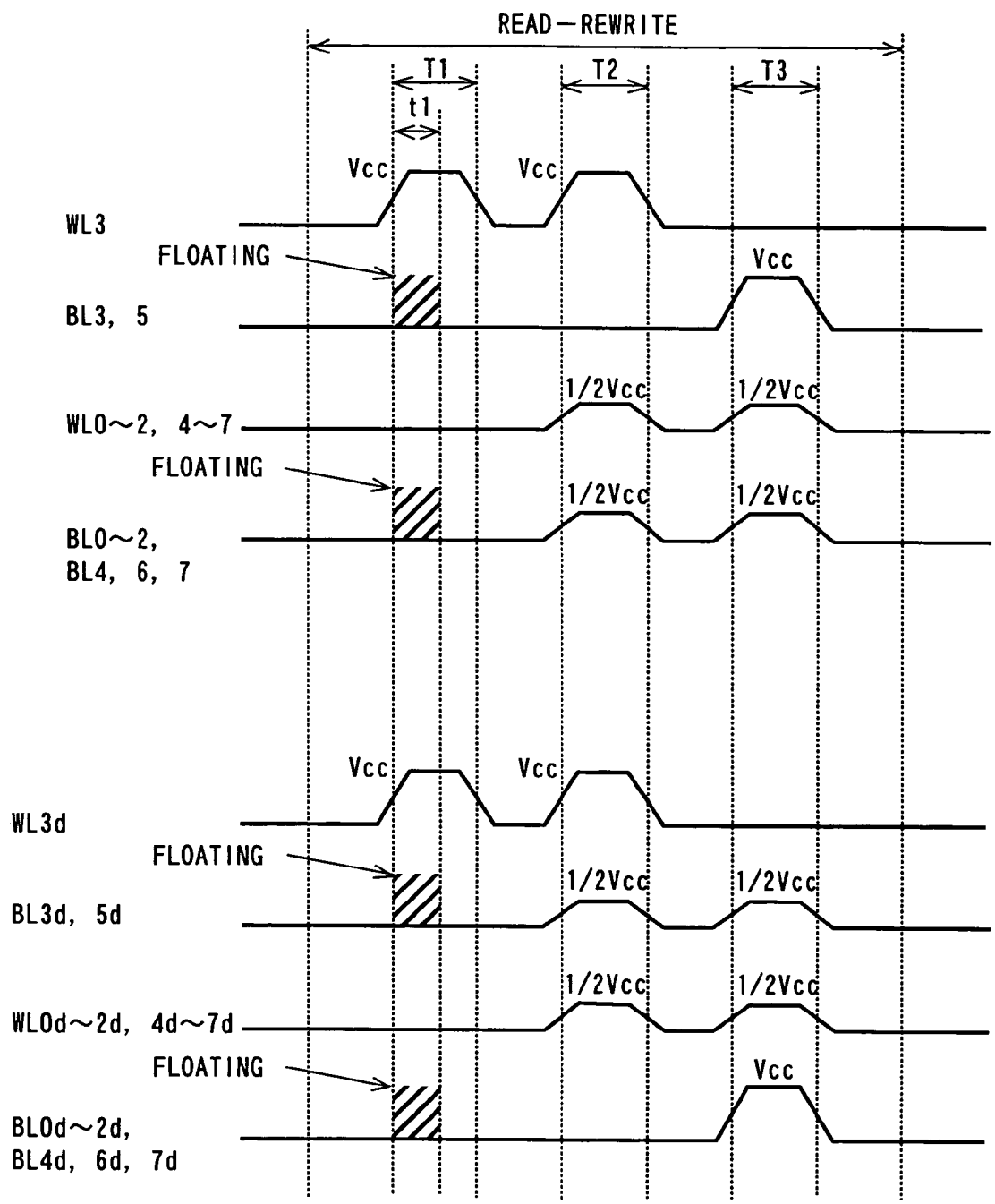
FIG. 65 is a voltage waveform diagram for illustrating read and rewrite operations of the simple matrix ferroelectric memory according to the sixth embodiment of the present invention.

Referring to FIG. 65, the ferroelectric memory brings all bit lines BL0 to BLn and BL0d to BLnd into floating states from a standby state while setting the selected word lines WL3 and WL3d to the voltage Vcc at the same timing. In this state, the ferroelectric memory compares the potentials of the bit lines BL0 to BLn of the memory cell array with those of the bit lines BL0d to BLnd of the dummy cell array and amplifies the differences therebetween with a read amplifier 8 formed by a voltage sense amplifier, thereby determining the data. For example, the potentials of the bit lines BL3 and BL3d reach levels Vr1 and Vr0 (<Vr1) due to charges of the memory cells and the dummy cells storing the data "1" and "0" respectively, and hence the bit line BL3 exhibits a larger potential than the bit line BL3d. In this case, the ferroelectric memory regards that the memory cell located on the intersection between the bit lines BL3 and BL3d stores the data "1". If the potential of the bit line BL3 is smaller than that of the bit line BL3d to the contrary, the ferroelectric memory regards that the memory cell located on the intersection between the bit lines BL3 and BL3d stores the data "0".

Thereafter the ferroelectric memory sets all bit lines BL0 to BL7 and BL0d to BL7d to 0 V. At this time, the ferroelectric memory applies the voltage Vcc to all memory cells connected to the bit line BL3 in the memory cell array and to all dummy cells connected to the bit line BL3d in the dummy cell array for a period (T1—t1). Therefore, the ferroelectric memory writes the data "0" in these cells.

Then, the ferroelectric memory sets the selected word lines WL3 and WL3d to 0 V and returns to the standby state. The ferroelectric memory performs the rewrite operation in the memory cell array and the dummy cell array in periods T2 and T3 similarly to the fourth embodiment and attains similar effects.

Although the present invention has been described and illustrated in detail, it is clearly understood that the same is by way of illustration and example only and is not to be taken by way of limitation, the spirit and scope of the present invention being limited only by the terms of the appended claims.

While each of the first to sixth embodiments has been described with reference to memory cells, serving as storage means, constituted of capacitive elements having ferroelectric films, similar effects can be attained also when memory cells serving as storage means are constituted of resistive elements.

While each of the first to sixth embodiments has been described with reference to a ferroelectric memory, the present invention is not restricted to this but is also applicable to another memory so far as the same has capacitance means or resistance means serving as storage means connected between bit lines and word lines.

What is claimed is:

1. A memory comprising:
   a plurality of bit lines;
   a plurality of word lines arranged to intersect with said plurality of bit lines; and
   a plurality of first storage means, each connected at an intersection of said plurality of bit lines and said plurality of word lines for holding first data or second data, wherein
   a first voltage pulse supplying a first electric field in a first direction and a second voltage pulse supplying a second electric field in a second direction opposite to said first direction are applied to at least a non-selected one of said plurality of first storage means other than a selected one of said plurality of first storage means connected to a selected one of said plurality of word lines substantially identical times respectively, or substantially applying no voltage pulse through a read operation and a rewrite operation consisting of a plurality of operations performed on said selected one of said plurality of first storage means.

2. The memory according to claim 1, wherein
   said read operation and said rewrite operation consisting of said plurality of operations performed on said selected one of said plurality of first storage means include:
   said read operation;
   a first write operation for writing said first data in said selected one of said plurality of first storage means from which said second data has been read in said read operation; and
   a second write operation for writing said second data in said selected one of said plurality of first storage means from which said second data has been read in said read operation,
   wherein said first voltage pulse supplying said first electric field in said first direction and said second voltage pulse supplying said second electric field in said second direction opposite to said first direction are applied to said selected one of said plurality of first storage means from which said first data has been read in said read operation substantially identical times respectively, or substantially applying no voltage pulse through said first write operation of writing said first data and said second write operation of writing said second data.

3. The memory according to claim 1, wherein said first voltage pulse supplying said first electric field in said first direction and said second voltage pulse supplying said second electric field in said second direction opposite to said first direction are applied to at least substantially all of said non-selected one of said plurality of first storage means single times respectively through said read operation and said rewrite operation.

4. The memory according to claim 3, wherein said first voltage pulse supplying said first electric field in said first direction and said second voltage pulse supplying said second electric field in said second direction opposite to said first direction are applied to said selected one of said plurality of first storage means storing said first data single times respectively in addition to said non-selected one of said plurality of first storage means through said read operation and said rewrite operation.

5. The memory according to claim 1, wherein said first voltage pulse supplying said first electric field in said first direction is applied for a first period,
   wherein said second voltage pulse supplying said second electric field in said second direction opposite to said first direction is applied for a second period, and wherein
   said first period and said second period are substantially equal to each other.

6. The memory according to claim 1, wherein a prescribed voltage is applied to said selected one of said plurality of first storage means while a voltage of m/n (m, n: positive integers) of said prescribed voltage is applied to said non-selected one of said plurality of first storage means in said read operation and said rewrite operation.

7. The memory according to claim 6, wherein either a substantially ⅓ voltage or a substantially ½ voltage of said prescribed voltage is applied to said non-selected one of said plurality of first storage means.

8. The memory according to claim 1, wherein said read operation is started after setting said plurality of word lines and said plurality of bit lines to substantially identical potentials.

9. The memory according to claim 1, wherein said plurality of bit lines are brought into a floating state in said read operation and thereafter said plurality of bit lines are set to a fixed potential.

10. The memory according to claim 9, wherein a reduced period is set for bringing said plurality of bit lines into a floating state in said read operation for sufficiently reducing a variation of a polarization quantity of said non-selected one of said plurality of first storage means in said reduced period as compared with a variation of the polarization quantity of said non-selected one of said plurality of first storage means in said rewrite operation.

11. The memory according to claim 1, further comprising:
   a read data determination circuit for amplifying a voltage caused on said plurality of bit lines in said read operation and for comparing said voltage after amplification with a reference voltage and for determining whether data read from said selected one of said plurality of first storage means is said first data or said second data.

12. The memory according to claim 1, further comprising:
   a plurality of second storage means provided separately from said plurality of first storage means for storing data of reversed polarity from data stored in corresponding said plurality of first storage means, and
   wherein a voltage caused on said plurality of bit lines in said read operation is compared with a reference voltage generated by reading data from said plurality of second storage means thereby determining whether data read from said selected one of said plurality of first storage means is said first data or said second data.

13. The memory according to claim 1, wherein
said plurality of first storage means each includes a ferroelectric film.

14. The memory according to claim 1, wherein
said plurality of first storage means each includes a resistive element.

15. A memory comprising:
a plurality of bit lines;
a plurality of word lines arranged to intersect with said pluraliy of bit lines; and
a plurality of first storage means each connected at an intersection of said plurality of bit lines and said plurality of word lines for holding first data or second data,
wherein no rewrite operation is performed when data read in a read operation performed on selected one of said plurality of first storage means connected to selected one of said plurality of word lines is identical to data held in said selected first storage means after said read operation.

16. The memory according to claim 15, wherein said read operation is started after setting said plurality of word lines and said plurality of bit lines to substantially identical potentials.

17. The memory according to claim 15, wherein said plurality of bit lines are brought into a floating state during said read operation and thereafter setting said plurality of bit lines to a fixed potential.

18. The memory according to claim 17, wherein a reduced period is set for bringing said plurality of bit lines into a floating state in said read operation for sufficiently reducing a variation of a polarization quantity of non-selected one of said plurality of first storage means in said reduced period as compared with a variation of the polarization quantity of said non-selected one of said plurality of first storage means in a rewrite operation.

19. The memory according to claim 15, further comprising:
a data determination circuit for outputting a prescribed signal when substantially all data read in said read operation performed on said selected one of said plurality of first storage means are identical to data held in said selected one of said plurality of first storage means after said read operation,
wherein said rewrite operation is not performed when said data determination circuit outputs said prescribed signal.

20. The memory according to claim 15, wherein
said plurality of first storage means, each includes a ferroelectric film.

21. The memory according to claim 15, wherein
said plurality of first storage means, each includes a resistive element.

22. A memory comprising:
a plurality of bit lines;
a plurality of word lines arranged to intersect with said plurality of bit lines; and
a plurality of first storage means connected at an intersection of said plurality of bit lines and said plurality of word lines for holding first data or second data, wherein
a voltage pulse supplying a first electric field in a first direction and a second voltage pulse supplying second electric field in a second direction opposite to said first direction are applied to at least a non-selected one of said plurality of first storage means other than a selected one of said plurality of first storage means connected to a selected one of said plurality of said word lines substantially identical times respectively, or substantially applying no voltage pulse through a write operation consisting of at least one operation performed on said selected one of said plurality of first storage means.

23. The memory according to claim 22, wherein
said write operation consisting of at least one operation performed on said selected one of said plurality of first storage means includes:
a first write operation for writing said first data in all said selected one of said plurality of first storage means;
a second write operation for writing said first data in said selected one of said plurality of first storage means to be written with said second data; and
a third write operation for writing said second data in said selected one of said plurality of first storage means to be written with said second data,
wherein said first voltage pulse supplying said first electric field in said first direction and said second voltage pulse supplying said second electric field in said second direction opposite to said first direction are applied to said selected one of said plurality of first storage means to be written with said first data substantially identical times respectively, or substantially applying no voltage pulse through said first write operations of writing said first data and said second write operation of writing said second data.

24. The memory according to claim 22, wherein said first voltage pulse supplying said first electric field in said first direction and said second voltage pulse supplying said second electric field in said second direction opposite to said first direction are applied to at least substantially all said non-selected one of said plurality of first storage means single times respectively through said write operation.

25. The memory according to claim 24, wherein said first voltage pulse supplying said first electric field in said first direction and said second voltage pulse supplying said second electric field in said second direction opposite to said first direction are applied to said selected one of said plurality of first storage means storing said first data single times respectively in addition to said non-selected one of said plurality of first storage means through said write operation.

26. The memory according to claim 22, wherein a prescribed voltage is applied to said selected one of said plurality of first storage means while a voltage of m/n (m, n: positive integers) of said prescribed voltage is applied to said non-selected one of said plurality of first storage means in said write operation.

27. The memory according to claim 26, wherein either a substantially ⅓ voltage or a substantially ½ voltage of said prescribed voltage is applied to said non-selected one of said plurality of first storage means.

28. The memory according to claim 22, wherein
said plurality of first storage means each includes a ferroelectric film.

29. The memory according to claim 22, wherein
said plurality of first storage means each includes a resistive element.

30. A memory comprising:
a plurality of bit lines;
a plurality of word lines arranged to intersect with said plurality of bit lines; and
a plurality of first storage means connected at an intersection of said plurality of bit lines and said plurality of word lines for holding first data or second data, wherein a write operation with one operation is completed when data to be written in a selected one of said plurality of first storage means connected to a selected one of said plurality of word lines is substantially only said first data or said second data while said write operation with a plurality of operations is completed when said data to be written is substantially not only said first data or said second data.

31. The memory according to claim 30, wherein a prescribed voltage is applied to said selected one of said plurality of first storage means while a voltage of m/n (m, n: positive integers) of said prescribed voltage is applied to non-selected one of said plurality of first storage means other than said selected first storage means in said write operation.

32. The memory according to claim 30, wherein either a substantially ⅓ voltage or a substantially ½ voltage of said prescribed voltage is applied to said non-selected one of said plurality of first storage means.

33. The memory according to claim 30, further comprising:
a data determination circuit for outputting a prescribed signal when substantially all said data to be written in said selected one of said plurality of first storage means are substantially only said first data or said second data in said write operation.

34. The memory according to claim 30, wherein
said plurality of first storage means each includes a ferroelectric film.

35. The memory according to claim 30, wherein
said plurality of first storage means each includes a resistive element.

* * * * *